US011676887B2

(12) United States Patent
Jin et al.

(10) Patent No.: US 11,676,887 B2
(45) Date of Patent: Jun. 13, 2023

(54) SEMICONDUCTOR PACKAGE

(71) Applicant: Samsung Electronics Co., Ltd., Suwon-si (KR)

(72) Inventors: Jeonggi Jin, Seoul (KR); Gyuho Kang, Cheonan-si (KR); Solji Song, Suwon-si (KR); Un-Byoung Kang, Hwaseong-si (KR); Ju-Il Choi, Seongnam-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 92 days.

(21) Appl. No.: 17/318,227

(22) Filed: May 12, 2021

(65) Prior Publication Data

US 2022/0077040 A1 Mar. 10, 2022

(30) Foreign Application Priority Data

Sep. 9, 2020 (KR) ................. 10-2020-0115500

(51) Int. Cl.
*H01L 23/48* (2006.01)
*H01L 23/498* (2006.01)
*H01L 23/00* (2006.01)

(52) U.S. Cl.
CPC .. *H01L 23/49816* (2013.01); *H01L 23/49822* (2013.01); *H01L 23/49838* (2013.01); *H01L 24/16* (2013.01); *H01L 2224/16227* (2013.01)

(58) Field of Classification Search
CPC ......... H01L 23/49816; H01L 23/49822; H01L 23/49838
See application file for complete search history.

(56) References Cited

U.S. PATENT DOCUMENTS

| | | |
|---|---|---|
| 6,884,710 B2 | 4/2005 | Park et al. |
| 7,511,349 B2 | 3/2009 | Tsai et al. |
| 8,264,086 B2 | 9/2012 | Shue et al. |
| 9,793,140 B2 | 10/2017 | Yu et al. |
| 9,818,710 B2 | 11/2017 | Kang et al. |
| 9,820,391 B2 * | 11/2017 | Shimizu ................. H01L 24/13 |
| 10,163,770 B2 | 12/2018 | Chiu et al. |

(Continued)

FOREIGN PATENT DOCUMENTS

| | | |
|---|---|---|
| JP | 2015-038909 A | 2/2015 |
| JP | 6237145 B2 | 11/2017 |

(Continued)

*Primary Examiner* — Nicholas J Tobergte
(74) *Attorney, Agent, or Firm* — Harness, Dickey & Pierce, P.L.C.

(57) ABSTRACT

A semiconductor package may include a redistribution substrate having a first surface and a second surface, opposite to each other, a semiconductor chip on the first surface of the redistribution substrate, and a solder pattern on the second surface of the redistribution substrate. The redistribution substrate may include an under-bump pattern coupled to the solder pattern, a first redistribution pattern on the under-bump pattern, the first redistribution pattern including a first via portion and a first wire portion, and a first seed pattern between the under-bump pattern and the first redistribution pattern and on a side surface of the first via portion and a bottom surface of the first wire portion. A bottom surface of the first seed pattern may be at a level lower than a top surface of the under-bump pattern.

20 Claims, 35 Drawing Sheets

(56) References Cited

U.S. PATENT DOCUMENTS

| | | |
|---|---|---|
| 2014/0097009 A1 | 4/2014 | Kaneko et al. |
| 2019/0096823 A1* | 3/2019 | Fang .................. H01L 23/5383 |
| 2019/0124766 A1* | 4/2019 | Adachi .................. H05K 1/16 |
| 2019/0131225 A1* | 5/2019 | Jeong .................. H01L 21/4853 |
| 2019/0394877 A1* | 12/2019 | Ishiguro ............... H05K 3/4673 |
| 2020/0091022 A1 | 3/2020 | Tsai et al. |
| 2021/0272898 A1* | 9/2021 | Takagi .................. H01L 21/50 |
| 2022/0077066 A1 | 3/2022 | Kim et al. |
| 2022/0310496 A1* | 9/2022 | Kim .................. H01L 23/49822 |

FOREIGN PATENT DOCUMENTS

| | | |
|---|---|---|
| KR | 10-2004-0014710 A | 2/2004 |
| KR | 10-2022-0033204 | 3/2022 |

\* cited by examiner

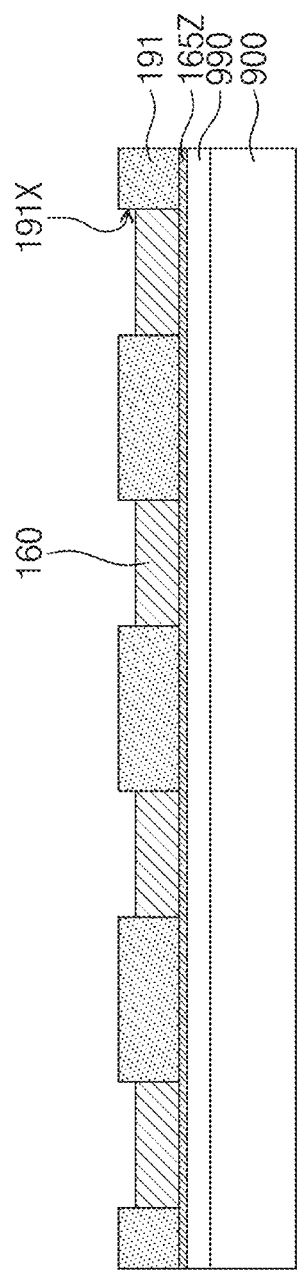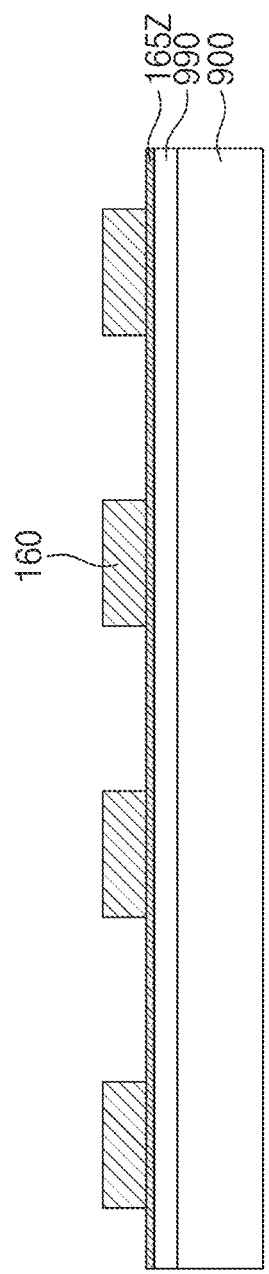

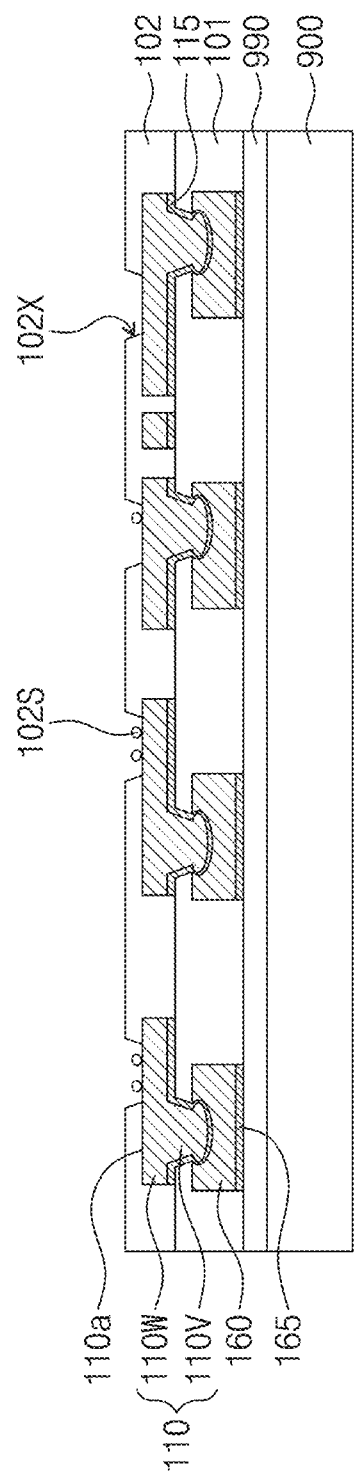
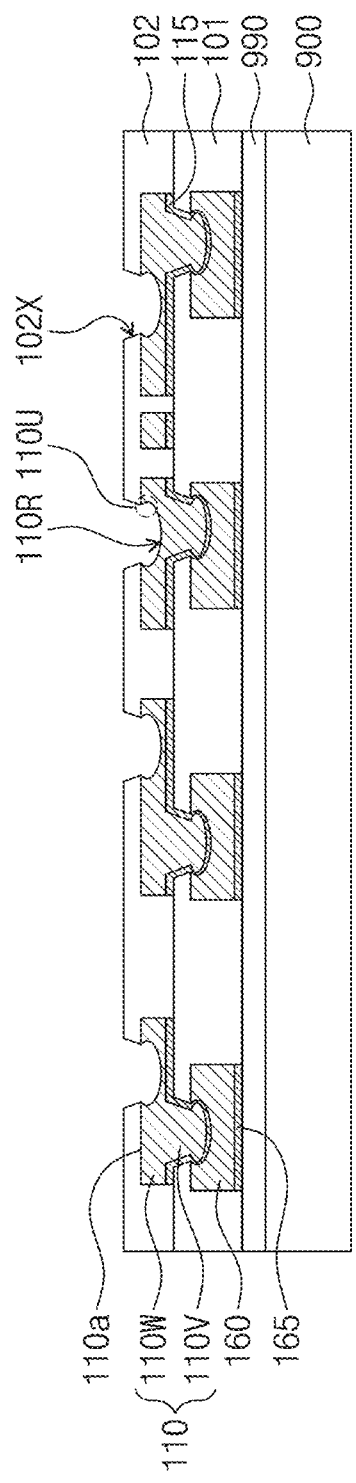

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2020-0115500, filed on Sep. 9, 2020, in the Korean Intellectual Property Office, the entire contents of which are hereby incorporated by reference.

BACKGROUND

The present disclosure relates to a semiconductor package, and in particular, a semiconductor package including a redistribution substrate and a method of manufacturing the same.

A semiconductor package is a structure, in which a semiconductor chip is configured to be used as a part of an electronic product. Conventionally, the semiconductor package includes a printed circuit board (PCB) and a semiconductor chip, which is mounted on the PCB and is electrically connected to the PCB using bonding wires or bumps. With development of the electronic industry, many studies are being conducted to improve reliability of the semiconductor package.

SUMMARY

Example embodiments of the inventive concepts provide a semiconductor package with improved reliability and durability and a method of manufacturing the same.

According to example embodiments of the inventive concepts, a semiconductor package may include a redistribution substrate having a first surface and a second surface, opposite to each other, a semiconductor chip on the first surface of the redistribution substrate, and a solder pattern on the second surface of the redistribution substrate. The redistribution substrate may include an under-bump pattern coupled to the solder pattern, a first redistribution pattern on the under-bump pattern, the first redistribution pattern including a first via portion and a first wire portion, and a first seed pattern between the under-bump pattern and the first redistribution pattern and on a side surface of the first via portion and a bottom surface of the first wire portion. A bottom surface of the first seed pattern may be at a level lower than a top surface of the under-bump pattern.

According to example embodiments of the inventive concepts, a semiconductor package may include a redistribution substrate and a semiconductor chip on a first surface of the redistribution substrate. The redistribution substrate may include a first redistribution pattern including a first via portion and a first wire portion, a second redistribution pattern on the first redistribution pattern, the second redistribution pattern including a second via portion and a second wire portion, and a seed pattern between the first and second redistribution patterns. A bottom surface of the seed pattern may be in the first redistribution pattern. The seed pattern may include an upper portion on a side surface of the second via portion and a bottom surface of the second wire portion, a first lower portion between the first redistribution pattern and a bottom surface of a center region of the second via portion, and a second lower portion in the first redistribution pattern and between the first lower portion and the upper portion. A thickness of the second lower portion of the seed pattern may be smaller than a thickness of the seed pattern on the bottom surface of the second wire portion.

According to example embodiments of the inventive concepts, a semiconductor package may include a redistribution substrate having a first surface and a second surface, opposite to each other, a semiconductor chip on the first surface of the redistribution substrate, a solder pattern on the second surface of the redistribution substrate. The redistribution substrate may include an under-bump pattern coupled to the solder pattern, a first redistribution pattern on the under-bump pattern, the first redistribution pattern may include a first via portion and a first wire portion, a first seed pattern between the under-bump pattern and the first redistribution pattern, a second redistribution pattern on the first redistribution pattern, the second redistribution pattern including a second via portion and a second wire portion, a second seed pattern between the first and second redistribution patterns, a third redistribution pattern on the second redistribution pattern, the third redistribution pattern including a third via portion and a third wire portion, a third seed pattern between the second and third redistribution patterns, and a bonding pad electrically connected to the third redistribution pattern. A bottom surface of the first seed pattern may be in the under-bump pattern. A bottom surface of the second seed pattern may be in the first redistribution pattern. A bottom surface of the third seed pattern may be in the second redistribution pattern. The first seed pattern may include an upper portion on a side surface of the first via portion and a bottom surface of the first wire portion, a first lower portion between the under-bump pattern and a bottom surface of a center region of the first via portion, and a second lower portion in the under-bump pattern and between the first lower portion and the upper portion. The second seed pattern may include an upper portion on a side surface of the second via portion and a bottom surface of the second wire portion, a first lower portion between the first redistribution pattern and a bottom surface of a center region of the second via portion, and a second lower portion in the first redistribution pattern and between the first lower portion and the upper portion of the second seed pattern. The third seed pattern may include an upper portion on a side surface of the third via portion and a bottom surface of the third wire portion, a first lower portion between the second redistribution pattern and a bottom surface of a center region of the third via portion, and a second lower portion in the second redistribution pattern and between the first lower portion and the upper portion of the third seed pattern. A first thickness of the first seed pattern on the bottom surface of the first wire portion may be larger than a second thickness of the second lower portion of the first seed pattern. A third thickness of the second seed pattern on the bottom surface of the second wire portion may be larger than a fourth thickness of the second lower portion of the second seed pattern. A fifth thickness of the third seed pattern on the bottom surface of the third wire portion may be larger than a sixth thickness of the second lower portion of the third seed pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 8A to 8E, 8G, and 8I to 8T are sectional views illustrating a method of manufacturing a semiconductor package, according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1A:
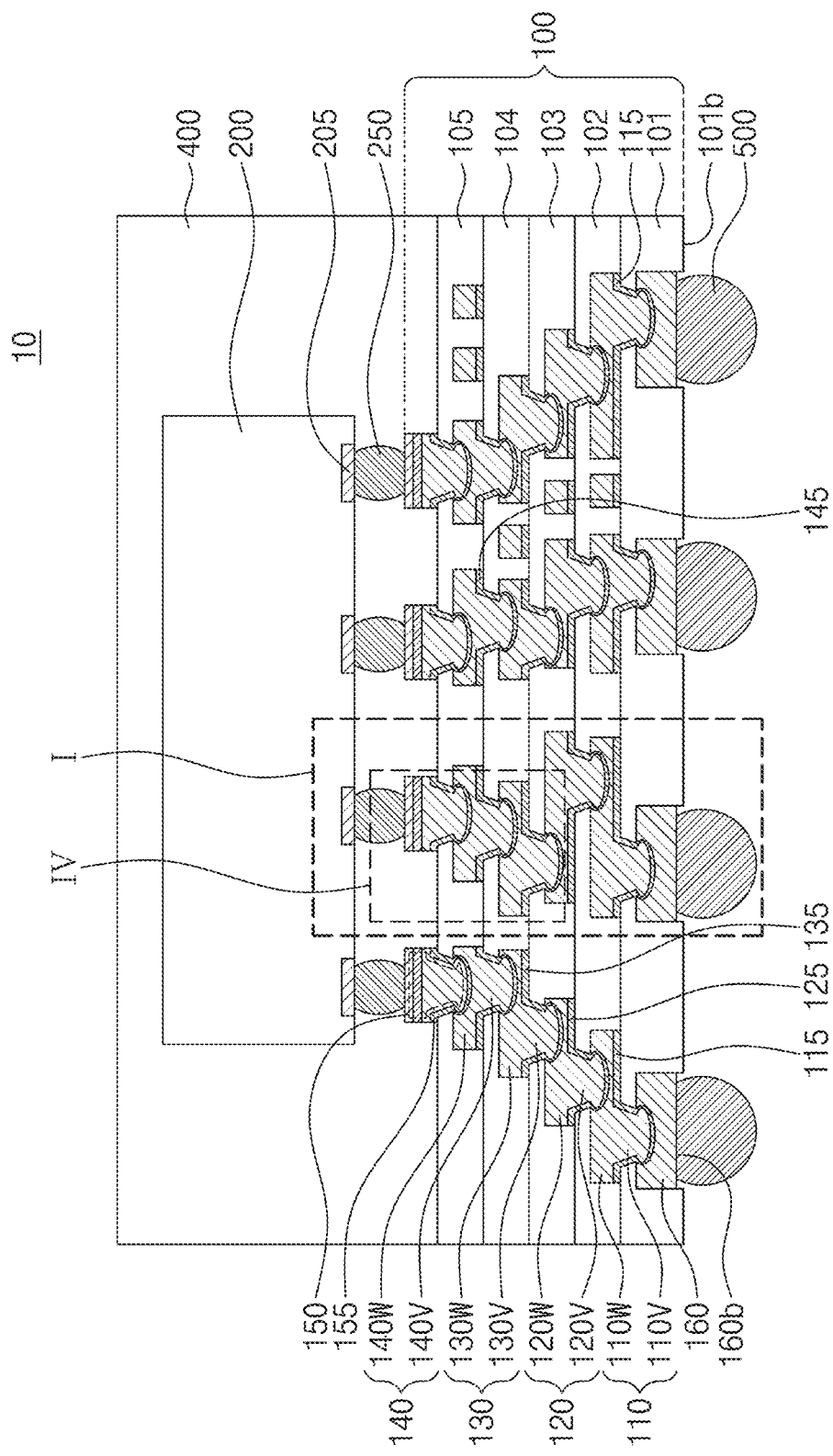
FIG. 1A is a sectional view illustrating a semiconductor package according to example embodiments of the inventive concepts.
Figure 1B:
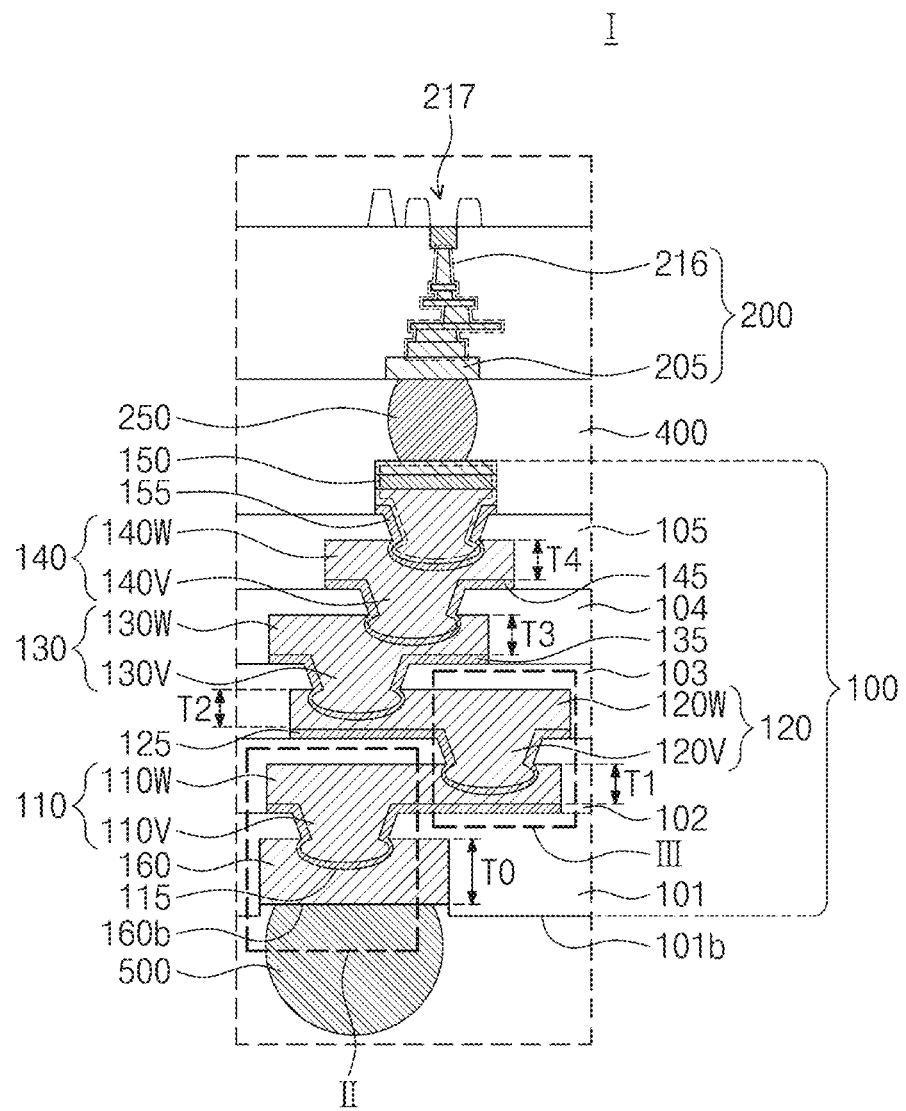
FIG. 1B is an enlarged sectional view illustrating a portion I of FIG. 1A.
Figure 1C:
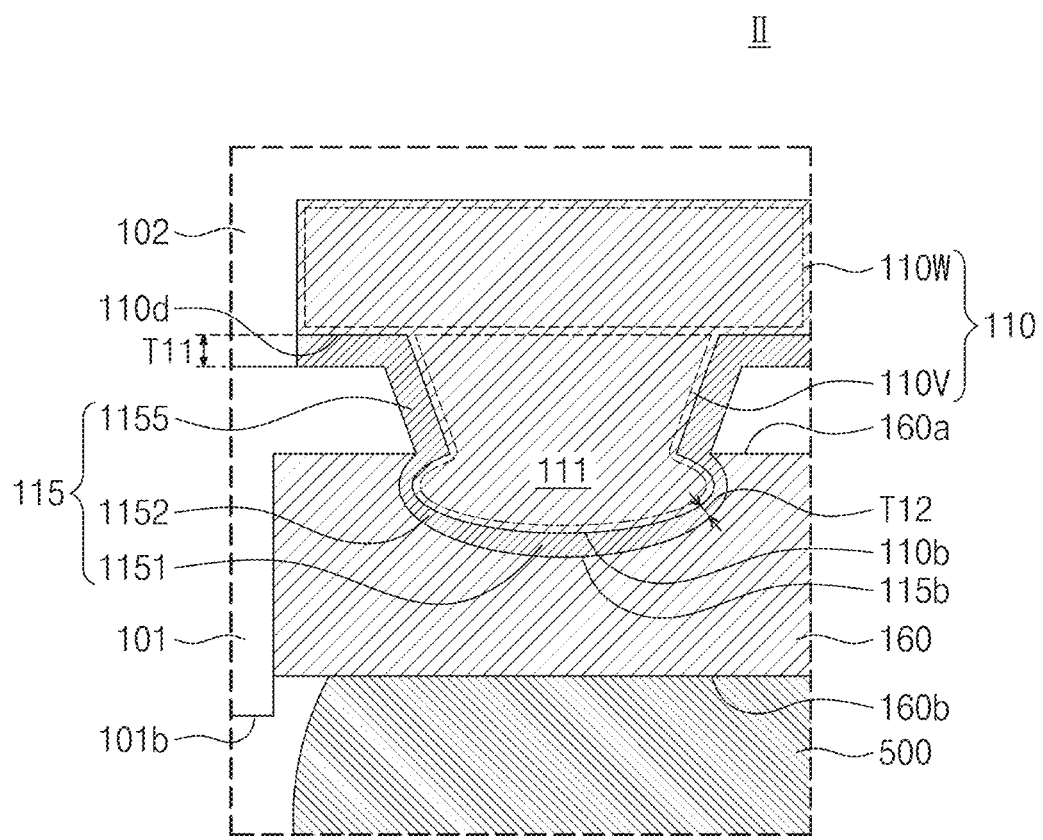
FIG. 1C is an enlarged sectional view illustrating a portion II of FIG. 1B.
Figure 1D:
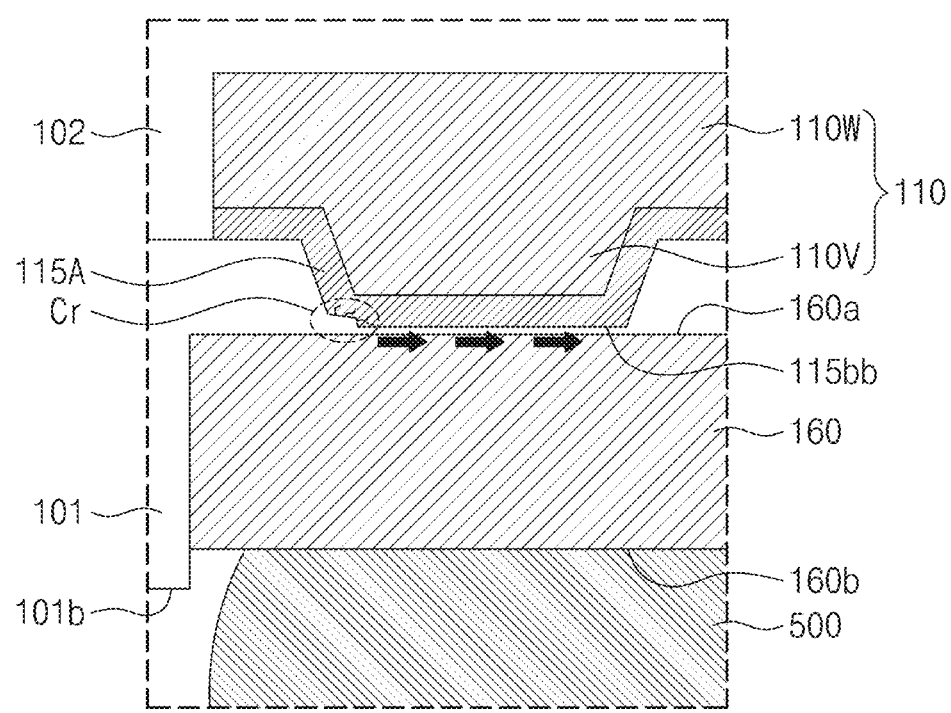
FIG. 1D is a sectional view illustrating a typical example of a redistribution pattern.
Figure 1E:
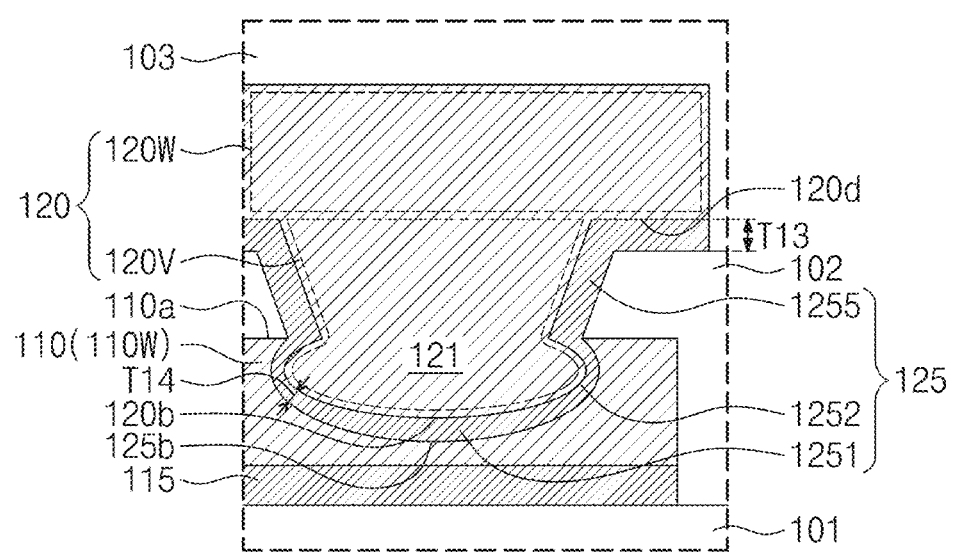
FIG. 1E is an enlarged sectional view illustrating a portion III of FIG. 1B.
Figure 1F:
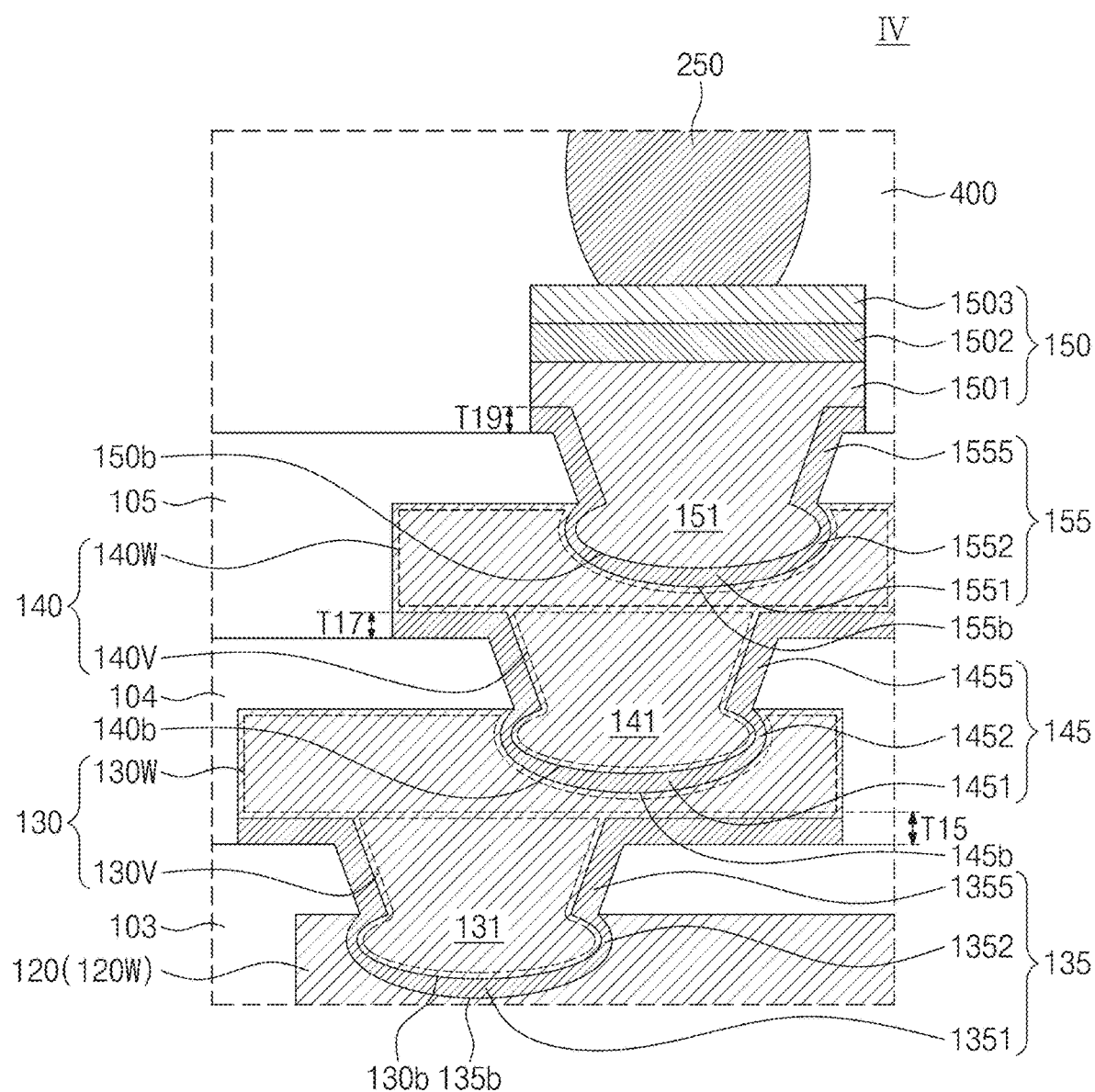
FIG. 1F is an enlarged sectional view illustrating a portion IV of FIG. 1A.

FIG. 1A is a sectional view illustrating a semiconductor package according to example embodiments of the inventive concepts. FIG. 1B is an enlarged sectional view illustrating a portion I of FIG. 1A. FIG. 1C is an enlarged sectional view illustrating a portion II of FIG. 1B. FIG. 1D is a sectional view illustrating a typical example of a redistribution pattern. FIG. 1E is an enlarged sectional view illustrating a portion III of FIG. 1B. FIG. 1F is an enlarged sectional view illustrating a portion IV of FIG. 1A.

Referring to FIGS. 1A, 1B, 1C, 1E, and 1F, a semiconductor package 10 may include a redistribution substrate 100, a semiconductor chip 200, and/or solder patterns 500. The redistribution substrate 100 may have a first surface and a second surface, which are opposite to each other. The first surface of the redistribution substrate 100 may be a top surface, and the second surface may be a bottom surface.

The solder pattern 500 may be disposed on the second surface of the redistribution substrate 100. The solder pattern 500 may serve as a terminal of the semiconductor package 10. The solder pattern 500 may include a solder ball, a solder bump, a solder pillar, and/or combinations thereof. The solder pattern 500 may include a solder material. In the present specification, the solder material may include tin, bismuth, lead, silver, or alloys thereof.

The redistribution substrate 100 may include an under-bump pattern 160, a first redistribution pattern 110, a second redistribution pattern 120, a third redistribution pattern 130, a fourth redistribution pattern 140, bonding pads 150, a first seed pattern 115, a second seed pattern 125, a third seed pattern 135, a fourth seed pattern 145, a pad seed pattern 155, and/or an insulating layer. The insulating layer may include first to fifth insulating layers 101, 102, 103, 104, and 105, which are sequentially stacked.

The under-bump pattern 160 may be provided in the first insulating layer 101. The solder pattern 500 may be disposed on a bottom surface 160b of the under-bump pattern 160. The under-bump pattern 160 may serve as a pad of the solder pattern 500. The under-bump pattern 160 may be formed of or include at least one of metallic materials (e.g., copper).

The first insulating layer 101 may be disposed on a top surface and a side surface of the under-bump pattern 160. The first insulating layer 101 may be the lowermost insulating layer. The bottom surface 160b of the under-bump pattern 160 may not be covered with the first insulating layer 101. As shown in FIG. 1C, the bottom surface 160b of the under-bump pattern 160 may be located at a level higher than a bottom surface 101b of the first insulating layer 101. In the present specification, the level may mean a vertical level, and a difference in the level may be measured in a direction perpendicular to the bottom surface 101b of the first insulating layer 101. In addition, an expression "vertical" mentioned without an additional limitation may mean a direction perpendicular to the bottom surface 101b of the first insulating layer 101. The bottom surface 101b of the first insulating layer 101 may correspond to the bottom surface of the redistribution substrate 100. The first insulating layer 101 may be formed of or include an organic material (e.g., photosensitive polymer). In the present specification, the photosensitive polymer may include at least one of, for example, photo-sensitive polyimide, polybenzoxazole, phenol-based polymers, or benzocyclobutene-based polymers.

The first redistribution pattern 110 may be provided on the under-bump pattern 160 and may be electrically connected to the under-bump pattern 160. The first redistribution pattern 110 may be disposed in the first insulating layer 101 and on a top surface of the first insulating layer 101. The first redistribution pattern 110 may be formed of or include a metallic material (e.g., copper).

The first redistribution pattern 110 may include a first via portion 110V and a first wire portion 110W. The first via portion 110V may be disposed in the first insulating layer 101. The first via portion 110V may be disposed between the under-bump pattern 160 and the first wire portion 110W. In the present specification, a via portion of a conductive element may be a portion for a vertical connection. A width of the first via portion 110V may be smaller than a width of the bottom surface 160b of the under-bump pattern 160 but the inventive concepts are not limited to this example.

The first via portion 110V may be a protruding portion, which is extended into the under-bump pattern 160. As shown in FIG. 1C, a bottom surface 110b of the first via portion 110V may be located at a level lower than a top surface 160a of the under-bump pattern 160. The bottom surface 110b of the first via portion 110V may include portions having different slopes. The first via portion 110V may include a first convex portion 111, and the first convex portion 111 may correspond to a lower portion of the first via portion 110V. The first convex portion 111 may be provided in the under-bump pattern 160. For example, the bottom surface 110b of the first via portion 110V may have a concave-up shape. The bottom surface 110b of the first via portion 110V may have a center region and an edge region, when viewed in a plan view. The edge region of the first via portion 110V may be disposed between the center region and a side surface of the first convex portion 111. The edge region of the first via portion 110V may be provided to enclose the center region, when viewed in a plan view. The center region of the first convex portion 111 may protrude toward the bottom surface 160b of the under-bump pattern 160. For example, the bottom surface 110b of the center region of the first via portion 110V may be located at a level lower than the bottom surface 110b of the edge region. The first convex portion 111 of the first via portion 110V may protrude laterally. For example, a width of the first convex portion 111 may be larger than the width of the first via portion 110V at the top surface 160a of the under-bump pattern 160. The width of the first convex portion 111 may be measured between the bottom surface 110b of the first via portion 110V and the top surface 160a of the under-bump pattern 160.

The first wire portion 110W may be provided on the first via portion 110V and may be connected to the first via portion 110V without any interface therebetween. The first wire portion 110W may have a width or length that is larger than that the first via portion 110V. The first wire portion 110W may be extended to cover a portion of the top surface of the first insulating layer 101 and may have a longitudinal axis extended in a first direction. The first direction may be parallel to the bottom surface 101b of the first insulating layer 101. For example, a top surface of the first wire portion 110W may be substantially parallel to the bottom surface 101b of the first insulating layer 101.

The first seed pattern 115 may be interposed between the under-bump pattern 160 and the first redistribution pattern 110 and between the first insulating layer 101 and the first redistribution pattern 110. The first seed pattern 115 may be in direct contact with the under-bump pattern 160 and the first redistribution pattern 110. The first seed pattern 115 may not be extended onto a side surface of the first wire portion 110W. The first seed pattern 115 may be formed of or include at least one of conductive materials (e.g., copper, titanium, and alloys thereof). The first seed pattern 115 may serve as a barrier layer and may reduce or prevent a material in the first redistribution pattern 110 from being diffused.

A bottom surface 115b of the first seed pattern 115 may be disposed in the under-bump pattern 160. For example, the bottom surface 115b of the first seed pattern 115 may be located at a level lower than the top surface 160a of the under-bump pattern 160. The bottom surface 115b of the first seed pattern 115 may have a concave-up shape. However, the shape of the bottom surface 115b of the first seed pattern 115 may not be limited to this example.

The first seed pattern 115 may include a first lower portion 1151, a second lower portion 1152, and an upper portion 1155. The upper portion 1155 of the first seed pattern 115 may be located at a level higher than the top surface 160a of the under-bump pattern 160. The upper portion 1155 of the first seed pattern 115 may be interposed between a side surface of the first via portion 110V and the first insulating layer 101 and between a bottom surface 110d of the first wire portion 110W and the first insulating layer 101. The upper portion 1155 of the first seed pattern 115 may have a first thickness T11. The first thickness T11 may be measured between the bottom surface 110d of the first wire portion 110W and the first insulating layer 101. The first thickness T11 may range from 200 Å to 3000 Å. Each of the first and second lower portions 1151 and 1152 of the first seed pattern 115 may be interposed between the under-bump pattern 160 and the first redistribution pattern 110. The first and second lower portions 1151 and 1152 of the first seed pattern 115 may cover the first convex portion 111. The first lower portion 1151 of the first seed pattern 115 may be disposed on the bottom surface of the center region of the first via portion 110V. The second lower portion 1152 of the first seed pattern 115 may be disposed between the first lower portion 1151 and the upper portion 1155. The second lower portion 1152 of the first seed pattern 115 may be disposed on the bottom surface 110b of the edge region of the first via portion 110V. The bottom surface 115b of the second lower portion 1152 of the first seed pattern 115 may be located at a level higher than the bottom surface 115b of the first lower portion 1151. The second lower portion 1152 of the first seed pattern 115 may have a second thickness T12. The second thickness T12 may be smaller than the first thickness T11. For example, the second thickness T12 may be 30% to 80% of the first thickness T11. For example, the second thickness T12 may range from 60 Å to 2400 Å.

FIG. 1D is a sectional view illustrating a conventional example of a first redistribution pattern.

Referring to FIG. 1D, the first seed pattern 115A may be disposed on the under-bump pattern 160, and the first redistribution pattern 110 may protrude into the under-bump pattern 160. The bottom surface 115bb of the first seed pattern 115A may be flat. For example, the bottom surface 115bb of the first seed pattern 115A may be parallel to the first direction. If a stress is applied between the first seed pattern 115A or the under-bump pattern 160, a crack Cr may occur between the first seed pattern 115A and the under-bump pattern 160. The stress may occur when operations of the semiconductor package are repeated or the semiconductor package is manufactured. The bottom surface 115bb of the first seed pattern 115A may have a flat shape and may be parallel to the first direction, and the crack Cr may be quickly and easily propagated along an interface between the bottom surface 115bb of the first seed pattern 115A and the top surface 160a of the under-bump pattern 160. In some example embodiments, the first seed pattern 115A and the first redistribution pattern 110 may be separated from the under-bump pattern 160.

Referring back to FIG. 1C, since the first seed pattern 115 and the first via portion 110V are provided in the under-bump pattern 160, a contact area between the first seed pattern 115 and the under-bump pattern 160 may be increased. Thus, the first seed pattern 115 may be more robustly bonded to the under-bump pattern 160, and the occurrence of a crack may be reduced or prevented. A bonding strength between the first redistribution pattern 110 and the under-bump pattern 160 may be improved. The propagation of a crack from a surface in a direction to a surface in an opposite direction may be more difficult. The bottom surface 115b of the first seed pattern 115 may include portions having different slopes. Accordingly, even when a crack is formed between the first seed pattern 115 and the under-bump pattern 160, the crack may be reduced or prevented from being propagated. Reliability and/or durability of the semiconductor package 10 may be improved. In example embodiments where the second thickness T12 is 30% to 80% of the first thickness T11, it may be possible to more effectively reduce or prevent the occurrence and propagation of a crack between the first seed pattern 115 and the under-bump pattern 160.

As shown in FIGS. 1A and 1B, the second insulating layer 102 may be disposed on the first insulating layer 101 to cover the first redistribution pattern 110. For example, the second insulating layer 102 may cover the side and top surfaces of the first wire portion 110W. The second insulating layer 102 may include the same material as the first insulating layer 101. The second insulating layer 102 may include, for example, a photosensitive polymer. The second insulating layer 102 and the first insulating layer 101 may be provided to have no observable interface therebetween.

The second redistribution pattern 120 may be disposed on the first redistribution pattern 110 and may be electrically connected to the first redistribution pattern 110. The second redistribution pattern 120 may include a second wire portion 120W and a second via portion 120V. The second via portion 120V may be provided in the second insulating layer 102 and may be disposed between the first redistribution pattern 110 and the second wire portion 120W. The second via portion 120V may be a protruding portion, which is extended into the first redistribution pattern 110. For example, as shown in FIG. 1E, a bottom surface 120b of the second via portion 120V may be located at a level lower than a top surface 110a of the first redistribution pattern 110. The top surface 110a of the first redistribution pattern 110 may correspond to a top surface of the first wire portion 110W. The bottom surface 120b of the second via portion 120V may include portions having different slopes. For example, the second via portion 120V may include a second convex portion 121, and the second convex portion 121 may be provided in the first redistribution pattern 110. The second convex portion 121 may correspond to a lower portion of the second via portion 120V. The bottom surface 120b of the second via portion 120V may have a concave-up shape. The bottom surface 120b of the second via portion 120V may have a center region and an edge region, when viewed in a plan view. The edge region of the second via portion 120V may be disposed between the center region and the side surface of the second convex portion 121. The bottom surface 120b of the center region of the second via portion 120V may be located at a level lower than the bottom surface 120b of the edge region. The second convex portion 121 of the second via portion 120V may further protrude laterally. For example, a width of the second convex portion 121 may be larger than a width of the second via portion 120V at the top surface 110a of the first redistribution pattern 110. The width of the first convex portion 111 may be measured between the bottom surface 120b of the second via portion 120V and the top surface 110a of the first redistribution pattern 110.

The second wire portion 120W may be provided on the second via portion 120V and may be connected to the second via portion 120V without any interface therebetween. The second wire portion 120W may have a width or length that is larger than that the second via portion 120V. The second wire portion 120W may be extended onto the top surface of the second insulating layer 102. For example, a top surface of the second wire portion 120W may be parallel to the first direction.

The second seed pattern 125 may be interposed between the first redistribution pattern 110 and the second redistribution pattern 120 and between the second insulating layer 102 and the second redistribution pattern 120. The second seed pattern 125 may be in direct contact with the first redistribution pattern 110 and the second redistribution pattern 120. The bottom surface 120b of the second seed pattern 125 may be disposed in the first redistribution pattern 110. For example, the bottom surface 120b of the second seed pattern 125 may be located at a level lower than the top surface 110a of the first redistribution pattern 110. Accordingly, a contact area between the second seed pattern 125 and the first redistribution pattern 110 may be increased. The second seed pattern 125 and the second via portion 120V may be robustly coupled to the first redistribution pattern 110, and occurrence of the crack may be reduced or prevented. The second seed pattern 125 may be formed of or include at least one of conductive materials (e.g., copper, titanium, and alloys thereof). The second seed pattern 125 may serve as a barrier layer and may reduce or prevent a material in the second redistribution pattern 120 from being diffused.

The second seed pattern 125 may include a first lower portion 1251, a second lower portion 1252, and an upper portion 1255. The upper portion 1255 of the second seed pattern 125 may be located at a level higher than the top surface 110a of the first redistribution pattern 110. The upper portion 1255 of the second seed pattern 125 may be interposed between the side surface of the second via portion 120V and the second insulating layer 102 and between a bottom surface 120d of the second wire portion 120W and the second insulating layer 102. The upper portion 1255 of the second seed pattern 125 may have a third thickness T13 on the bottom surface 120d of the second wire portion 120W. For example, the third thickness T13 may be measured between the bottom surface 120d of the second wire portion 120W and the second insulating layer 102. The third thickness T13 may range from 200 Å to 3000 Å. The first and second lower portions 1251 and 1252 of the second seed pattern 125 may be interposed between the first redistribution pattern 110 and the second redistribution pattern 120 and may cover the second convex portion 121. The first lower portion 1251 of the second seed pattern 125 may be disposed on the bottom surface 120b of the center region of the second via portion 120V. The second lower portion 1252 of the second seed pattern 125 may be disposed between the first lower portion 1251 and the upper portion 1255. The second lower portion 1252 of the second seed pattern 125 may be disposed on the bottom surface 120b of the edge region of the second via portion 120V. A bottom surface 125b of the second lower portion 1252 of the second seed pattern 125 may be located at a level higher than the bottom surface 125b of the first lower portion 1251. The second lower portion 1252 of the second seed pattern 125 may have a fourth thickness T14. The fourth thickness T14 may be smaller than the third thickness T13. For example, the fourth thickness T14 may be 30% to 80% of the third thickness T13. For example, the fourth thickness T14 may range from 60 Å to 2400 Å.

The bottom surface 125b of the second seed pattern 125 may include portions having different slopes. Accordingly, even when a crack is formed between the second seed pattern 125 and the first redistribution pattern 110, the crack may be reduced or prevented from being propagated. In example embodiments where the fourth thickness T14 is 30% to 80% of the third thickness T13, it may be possible to more effectively reduce or prevent the propagation of crack between the second seed pattern 125 and the first redistribution pattern 110. The reliability and durability of the semiconductor package 10 may be improved.

As shown in FIGS. 1A and 1B, the third insulating layer 103 may be disposed on the second insulating layer 102 to cover the second redistribution pattern 120. For example, the third insulating layer 103 may cover the side and top surfaces of the second wire portion 120W. The third insulating layer 103 may include, for example, a photosensitive polymer. The third insulating layer 103 may include the same material as the second insulating layer 102. The third insulating layer 103 and the second insulating layer 102 may be provided to have no observable interface therebetween.

The third redistribution pattern 130 may be disposed on the second redistribution pattern 120 and may be electrically connected to the second redistribution pattern 120. The third redistribution pattern 130 may include a third wire portion 130W and a third via portion 130V. The third via portion 130V may be provided in the third insulating layer 103 and may be disposed between the second redistribution pattern 120 and the third wire portion 130W. The third via portion 130V may be a protruding portion, which is extended into the second redistribution pattern 120. For example, as shown in FIG. 1E, a bottom surface 130b of the third via portion 130V may be located at a level lower than a top surface of the second redistribution pattern 120. The top surface of the second redistribution pattern 120 may correspond to the top surface of the second wire portion 120W. The shape of the third via portion 130V may be the same or substantially the same as the first via portion 110V of FIG. 1C or the second via portion 120V of FIG. 1E. For example, as shown in FIG. 1F, the third via portion 130V may include a third convex portion 131, and the third convex portion 131 may be provided in the second redistribution pattern 120. The third convex portion 131 may correspond to a lower portion of the third via portion 130V. The bottom surface 130b of the center region of the third via portion 130V may be located at a level lower than the bottom surface 130b of the edge region. The bottom surface 130b of the third via portion 130V may have a concave-up shape. The third convex portion 131 of the third via portion 130V may further protrude laterally.

The third wire portion 130W may be provided on the third via portion 130V and may be connected to the third via portion 130V without any interface therebetween. The third wire portion 130W may have a width larger than the third via portion 130V. The third wire portion 130W may be extended onto the top surface of the third insulating layer 103. The top surface of the third wire portion 130W may be parallel to the first direction.

The third seed pattern 135 may be interposed between the second redistribution pattern 120 and the third redistribution pattern 130 and between the third insulating layer 103 and the third redistribution pattern 130. The third seed pattern 135 may not be extended onto the side surface of the third wire portion 130W. A bottom surface 135b of the third seed pattern 135 may be disposed in the second redistribution pattern 120. For example, the bottom surface 135b of the third seed pattern 135 may be located at a level lower than the top surface of the second redistribution pattern 120. Thus, a contact area between the third seed pattern 135 and the second redistribution pattern 120 may be increased. Accordingly, the third seed pattern 135 may be robustly bonded to the second redistribution pattern 120, and a crack may be reduced or prevented from occurring between the third seed pattern 135 and the second redistribution pattern 120. The third seed pattern 135 may be formed of or include at least one of conductive materials (e.g., copper, titanium, and alloys thereof).

The third seed pattern 135 may include a first lower portion 1351, a second lower portion 1352, and an upper portion 1355. The upper portion 1355 of the third seed pattern 135 may be located at a level higher than the top surface of the second redistribution pattern 120. The upper portion 1355 of the third seed pattern 135 may be interposed between the side surface of the third via portion 130V and the third insulating layer 103 and between the bottom surface of the third wire portion 130W and the third insulating layer 103. The upper portion 1355 of the third seed pattern 135 may have a fifth thickness T15 on the bottom surface of the third wire portion 130W. The fifth thickness T15 may be 200 Å to 3000 Å. The first and second lower portions 1351 and 1352 of the third seed pattern 135 may be interposed between the second redistribution pattern 120 and the third redistribution pattern 130. The first lower portion 1351 of the third seed pattern 135 may be disposed on the bottom surface 130b of the center region of the third via portion 130V. The second lower portion 1352 of the third seed pattern 135 may be disposed on the bottom surface 130b of the edge region of the third via portion 130V. The second lower portion 1352 of the third seed pattern 135 may be disposed between the first lower portion 1351 and the upper portion 1355. The bottom surface 135b of the third seed pattern 135 may include portions having different slopes. The bottom surface 135b of the second lower portion 1352 of the third seed pattern 135 may be located at a level higher than the bottom surface 135b of the first lower portion 1351. The second lower portion 1352 of the third seed pattern 135 may have a sixth thickness. The sixth thickness may be smaller than the fifth thickness T15. For example, the sixth thickness may be 30% to 80% of the fifth thickness T15. For example, the sixth thickness T16 may range from 60 Å to 2400 Å. Accordingly, the crack may be reduced or prevented from being propagated between the third seed pattern 135 and the second redistribution pattern 120.

The fourth insulating layer 104 may be disposed on the third insulating layer 103 to cover the third redistribution pattern 130. For example, the fourth insulating layer 104 may cover the side and top surfaces of the third wire portion 130W. The fourth insulating layer 104 may include, for example, a photosensitive polymer. The fourth insulating layer 104 may be formed of or include the same material as the third insulating layer 103. The fourth insulating layer 104 and the third insulating layer 103 may be provided to have no observable interface therebetween.

The fourth redistribution pattern 140 may be disposed on the third redistribution pattern 130 and may be electrically connected to the third redistribution pattern 130. The fourth redistribution pattern 140 may include a fourth wire portion 140W and a fourth via portion 140V. The fourth via portion 140V may be provided in the fourth insulating layer 104 and may be disposed between the third redistribution pattern 130 and the fourth wire portion 140W. The shape of the fourth via portion 140V may be the same as or similar to the first via portion 110V (e.g., see FIG. 1C) described above. For example, the fourth via portion 140V may be a protruding portion, which is extended into the third redistribution pattern 130. As shown in FIG. 1F, a bottom surface 140b of the fourth via portion 140V may be located at a level lower than a top surface of the third redistribution pattern 130. The fourth via portion 140V may include a fourth convex portion 141, and the fourth convex portion 141 may be provided in the third redistribution pattern 130. The fourth convex portion 141 may be a lower portion of the fourth via portion 140V. The bottom surface 140b of the fourth via portion 140V may have a concave-up shape. The bottom surface 140b of the center region of the fourth via portion 140V may be located at a level lower than the bottom surface 140b of the edge region. The fourth convex portion 141 of the fourth via portion 140V may further protrude laterally.

The fourth wire portion 140W may be provided on the fourth via portion 140V and may be connected to the fourth via portion 140V without any interface therebetween. The fourth wire portion 140W may have a width larger than that of the fourth via portion 140V. The fourth wire portion 140W may be extended onto the top surface of the fourth insulating layer 104.

The fourth seed pattern 145 may be interposed between the third redistribution pattern 130 and the fourth redistribution pattern 140 and between the fourth insulating layer 104 and the fourth redistribution pattern 140. The fourth seed pattern 145 may not be extended onto the side surface of the fourth wire portion 140W. A bottom surface 145b of the fourth seed pattern 145 may be disposed in the third redistribution pattern 130. For example, the bottom surface 145b of the fourth seed pattern 145 may be located at a level lower than the top surface of the third redistribution pattern 130. Accordingly, a contact area between the fourth seed pattern 145 and the third redistribution pattern 130 may be increased. The fourth seed pattern 145 may be robustly bonded to the third redistribution pattern 130, and a crack may be reduced or prevented from occurring between the fourth seed pattern 145 and the third redistribution pattern 130. The fourth seed pattern 145 may be formed of or include at least one of conductive materials (e.g., copper, titanium, and alloys thereof).

The fourth seed pattern 145 may include a first lower portion 1451, a second lower portion 1452, and an upper portion 1455. The upper portion 1455 of the fourth seed pattern 145 may be located at a level higher than the top surface of the third redistribution pattern 130. The upper portion 1455 of the fourth seed pattern 145 may be interposed between a side surface of the fourth via portion 140V and the fourth insulating layer 104 and between a bottom surface of the fourth wire portion 140W and the fourth insulating layer 104. The upper portion 1455 of the fourth seed pattern 145 may have a seventh thickness T17 on the bottom surface of the fourth wire portion 140W. The seventh thickness T17 may range from 200 Å to 3000 Å. The first and second lower portions 1451 and 1452 of the fourth seed pattern 145 may be interposed between the third redistribution pattern 130 and the fourth redistribution pattern 140. The first lower portion 1451 of the fourth seed pattern 145 may be disposed on the bottom surface 140b of the center region of the fourth via portion 140V. The second lower portion 1452 of the fourth seed pattern 145 may be provided between the first lower portion 1451 and the upper portion 1455. The second lower portion 1452 of the fourth seed pattern 145 may be disposed on the bottom surface 140b of the edge region of the fourth via portion 140V. The bottom surface 145b of the fourth seed pattern 145 may include portions having different slopes. The bottom surface 145b of the second lower portion 1452 of the fourth seed pattern 145 may be located at a level higher than the bottom surface 145b of the first lower portion 1451. The second lower portion 1452 of the fourth seed pattern 145 may have an eighth thickness. The eighth thickness may be smaller than the seventh thickness T17. For example, the eighth thickness may be 30% to 80% of the seventh thickness T17. For example, the eighth thickness may range from 60 Å to 2400 Å. Thus, the crack may be reduced or prevented from being propagated between the fourth seed pattern 145 and the third redistribution pattern 130.

The fifth insulating layer 105 may be disposed on the fourth insulating layer 104 to cover the fourth redistribution pattern 140. For example, the fifth insulating layer 105 may cover the side and top surfaces of the fourth wire portion 140W. The fifth insulating layer 105 may be formed of or include, for example, a photosensitive polymer. The fifth insulating layer 105 may be formed of or include the same material as the fourth insulating layer 104. The fifth insulating layer 105 and the fourth insulating layer 104 may be provided to have no observable interface therebetween.

The bonding pad 150 may be disposed on the fourth redistribution pattern 140 and may be electrically connected to the fourth redistribution pattern 140. The bonding pad 150 may include a first conductive layer 1501, a second conductive layer 1502, and/or a third conductive layer 1503, which are stacked. The first conductive layer 1501 may be disposed in the fifth insulating layer 105 and may protrude into the fourth redistribution pattern 140. The first conductive layer 1501 may include a fifth convex portion 151, and the fifth convex portion 151 may be provided in the fourth redistribution pattern 140. A bottom surface 150b of the bonding pad 150 may be located at a level lower than a top surface of the fourth redistribution pattern 140. The bottom surface 150b of the bonding pad 150 may correspond to a bottom surface of the first conductive layer 1501. The bottom surface 150b of the bonding pad 150 may have a concave-up shape. For example, the bottom surface 150b of the bonding pad 150 may have a center region and an edge region, when viewed in a plan view. The bottom surface 150b of the center region of the bonding pad 150 may be located at a level lower than the bottom surface 150b of the bonding pad 150. The fifth convex portion 151 of the fourth via portion 140V may further protrude laterally. The first conductive layer 1501 may be formed of or include at least one of metallic materials (e.g., copper).

The second conductive layer 1502 may be disposed on the first conductive layer 1501. The second conductive layer 1502 may serve as a barrier layer and may reduce or prevent a metallic material in the first conductive layer 1501 from being diffused. The second conductive layer 1502 may be formed of or include a metallic material that is of a kind different from the first conductive layer 1501. For example, the second conductive layer 1502 may be formed of or include nickel.

The third conductive layer 1503 may be disposed on the second conductive layer 1502. The third conductive layer 1503 may serve as a protection layer and may reduce or prevent damage (e.g., oxidation) of the first conductive layer 1501. The third conductive layer 1503 may include a metallic material that is different from the first conductive layer 1501 and the second conductive layer 1502. For example, the third conductive layer 1503 may include gold (Au). The third conductive layer 1503 may be in direct contact with a bonding bump 250. Unlike that illustrated in the drawings, at least one of the second conductive layer 1502 and the third conductive layer 1503 may be omitted.

The pad seed pattern 155 may be interposed between the fourth redistribution pattern 140 and the bonding pad 150 and between the fifth insulating layer 105 and the bonding pad 150. A bottom surface 155b of the pad seed pattern 155 may be disposed in the fourth redistribution pattern 140. For example, the bottom surface 155b of the pad seed pattern 155 may be located at a level lower than the top surface of the fourth redistribution pattern 140. Thus, a contact area between the pad seed pattern 155 and the fourth redistribution pattern 140 may be increased. A bonding strength between the pad seed pattern 155 and the fourth redistribution pattern 140 may be improved. The pad seed pattern 155 may be formed of or include at least one of conductive materials (e.g., copper, titanium, and alloys thereof).

The pad seed pattern 155 may include a first lower portion 1551, a second lower portion 1552, and an upper portion 1555. The upper portion 1555 of the pad seed pattern 155 may be located at a level higher than the top surface of the fourth redistribution pattern 140. The upper portion 1555 of the pad seed pattern 155 may be interposed between the bonding pad 150 and the fifth insulating layer 105. The upper portion 1555 of the pad seed pattern 155 may have a ninth thickness T19, and the ninth thickness T19 may be a value measured at a top surface of the fifth insulating layer 105. The ninth thickness T19 may range from 200 Å to 3000 Å.

The first and second lower portions 1551 and 1552 of the pad seed pattern 155 may be interposed between the fourth redistribution pattern 140 and the bonding pad 150. The first lower portion 1551 of the pad seed pattern 155 may be disposed on the bottom surface 150b of the center region of the bonding pad 150. The second lower portion 1552 of the pad seed pattern 155 may be disposed on the bottom surface 150b of the edge region of the bonding pad 150. The second lower portion 1552 of the pad seed pattern 155 may be disposed between the first lower portion 1551 and the upper portion 1555. The bottom surface 155b of the pad seed pattern 155 may include portions having different slopes. The bottom surface 155b of the second lower portion 1552 of the pad seed pattern 155 may be located at a level higher than the bottom surface 155b of the first lower portion 1551. The second lower portion 1552 of the pad seed pattern 155 may have an eighth thickness. The eighth thickness may be smaller than the ninth thickness T19. For example, the eighth thickness may be 30% to 80% of the ninth thickness T19. Accordingly, the crack may be reduced or prevented from being propagated between the pad seed pattern 155 and the fourth redistribution pattern 140.

Referring to FIG. 1B, the under-bump pattern 160 may be a thickness T0 of a relatively large value, as shown in FIG. 1B. For example, the thickness T0 of the under-bump pattern 160 may be larger than a thickness T1 of the first wire portion 110W, a thickness T2 of the second wire portion 120W, a thickness T3 of the third wire portion 130W, and a thickness T4 of a fourth wire portion 140W. Accordingly, reliability of the redistribution substrate 100 may be improved. Each of the thickness T1 of the first wire portion 110W, the thickness T2 of the second wire portion 120W, the thickness T3 of the third wire portion 130W, and the thickness T4 of the fourth wire portion 140W may range from about 3 μm to about 5 μm.

In example embodiments where the thickness T0 of the under-bump pattern 160 is smaller than 5 μm, the reliability of the semiconductor package 10 may be deteriorated. In example embodiments where the thickness T0 of the under-bump pattern 160 is larger than 20 μm, it may be difficult to reduce a size of the semiconductor package 10. In example embodiments, the thickness T0 of the under-bump pattern 160 may range from about 5 μm to about 20 μm. The semiconductor package 10 may have an improved reliability and a small thickness.

As shown in FIG. 1B, at least two of the first to fourth via portions 101V, 102V, 103V, and 104V may not be vertically overlapped with each other. For example, the first to fourth via portions 101V, 102V, 103V, and 104V may have a staggered structure. Accordingly, an external stress exerted on the first to fourth via portions 101V, 102V, 103V, and 104V may be weakened. The external stress may be produced in a process of attaching the solder pattern 500 or mounting the solder pattern 500 on a package substrate.

The number of the stacked insulating layers 101, 102, 103, 104, and 105 and the number of the redistribution patterns 110, 120, 130, and 140 are not limited to the illustrated examples and may be variously changed. The redistribution substrate 100 may further include an upper protection layer (not shown), and the upper protection layer may cover the fifth insulating layer 105 and the bonding pads 150. The redistribution substrate 100 may further include a lower protection layer (not shown), and the lower protection layer may further cover the bottom surface 101b of the first insulating layer 101.

The semiconductor chip 200 may be mounted on the first surface of the redistribution substrate 100. As shown in FIG. 1B, the semiconductor chip 200 may include a chip pad 205 and an integrated circuit 217. The chip pad 205 may be exposed on the bottom surface of the semiconductor chip 200. The integrated circuit 217 may be provided in the semiconductor chip 200. The integrated circuit 217 may include a memory circuit, a logic circuit, and/or combinations thereof. The integrated circuit 217 may be electrically connected to the chip pad 205 through an internal connection line 216. The expression "an element is coupled or connected to the chip pad 205" may mean that the element is coupled or connected to the semiconductor chip 200. The expression "an element is coupled or connected to the semiconductor chip 200" may mean that the element is coupled or connected to an integrated circuit of the semiconductor chip 200. Hereinafter, the integrated circuit 217 and the internal connection line 216 will be omitted in all drawings except for FIG. 1B, for brevity's sake.

As shown in FIG. 1A, the semiconductor package 10 may further include the bonding bump 250. The bonding bump 250 may be provided between the chip pad 205 of the semiconductor chip 200 and the bonding pad 150 of the redistribution substrate 100 and may be electrically connected to the chip pad 205 and the bonding pad 150. The bonding bump 250 may include at least one of a solder, a pillar, or a bump. The bonding bump 250 may be formed of or include at least one of conductive materials (e.g., solder materials). The semiconductor chip 200 may be electrically connected to the redistribution substrate 100 through the bonding bump 250. In the present specification, an expression of "an element is electrically connected to the redistribution substrate 100" means than the element is electrically connected to at least one of the first to fourth redistribution patterns 110, 120, 130, and 140. A pitch of the bonding bumps 250 may be smaller than a pitch of the solder patterns 500.

The semiconductor package 10 may further include a mold layer 400. The mold layer 400 may be disposed on the redistribution substrate 100 to cover the semiconductor chip 200. The mold layer 400 may cover the uppermost insulating layer of the insulating layers. The uppermost insulating layer may be the fifth insulating layer 105. The mold layer 400 may be extended into a gap between the semiconductor chip 200 and the redistribution substrate 100 to seal the bonding bump 250. The mold layer 400 may be formed of or include an insulating polymer (e.g., an epoxy molding compound). In example embodiments, although not shown, an under-fill layer may be further provided in the gap between the redistribution substrate 100 and the semiconductor chip 200.

Figure 2A:
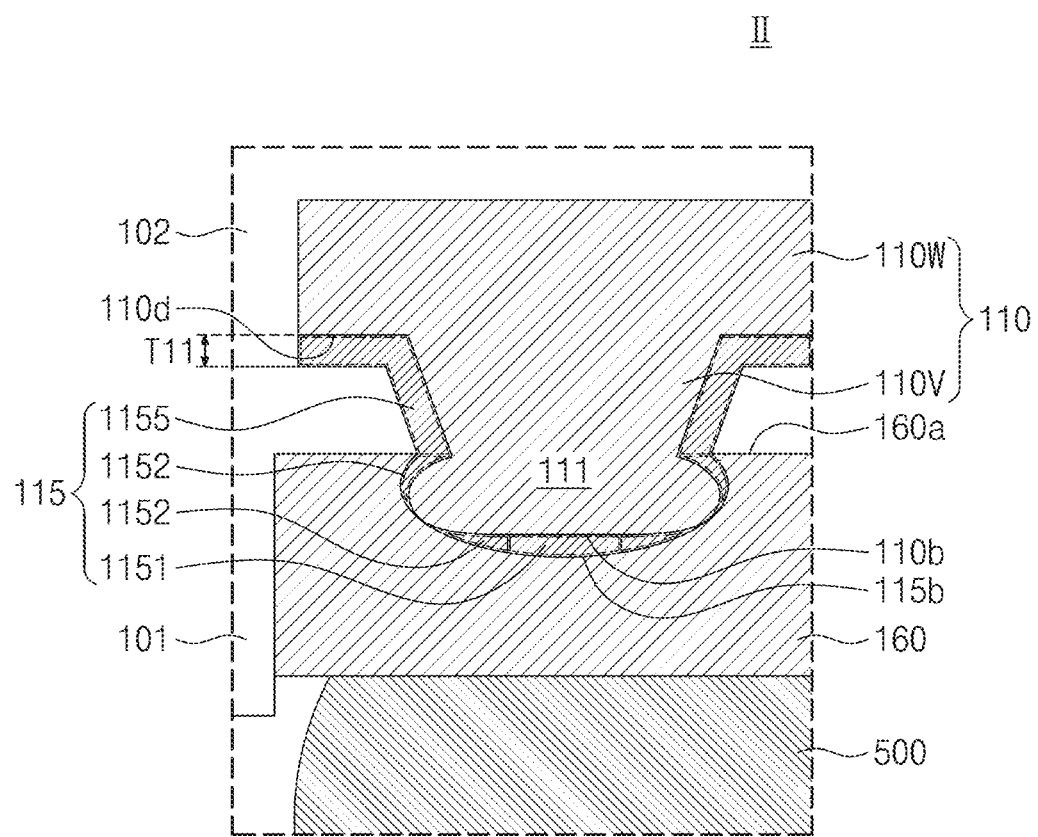
FIG. 2A is a sectional view illustrating an under-bump pattern, a first seed pattern, and a first redistribution pattern, according to example embodiments of the inventive concepts.

FIG. 2A is an enlarged sectional view illustrating an under-bump pattern, a first seed pattern, and a first redistribution pattern according to example embodiments of the inventive concepts and corresponding to the portion II of FIG. 1B.

Referring to FIG. 2A, the arrangement and shapes of the under-bump pattern 160, the first seed pattern 115, and the first redistribution pattern 110 may be the same or substantially the same as those of FIG. 1C. For example, the first wire portion 110W of the first redistribution pattern 110 may include the first convex portion 111. The first seed pattern 115 may include the first lower portion 1151, the second lower portion 1152, and the upper portion 1155.

However, the second lower portion 1152 of the first seed pattern 115 may further have a hole penetrating the same. The first convex portion 111 may be extended into the hole of the second lower portion 1152 of the first seed pattern 115 and may be in direct physical contact with the under-bump pattern 160. Accordingly, a bonding strength between the first via portion 110V and the under-bump pattern 160 may be further improved.

A second thickness of the second lower portion 1152 of the first seed pattern 115 may be smaller than the first thickness T11 of the upper portion 1155. For example, the second thickness may be 30% to 80% of the first thickness T11. The second thickness may be a thickness of a portion of the second lower portion 1152, in which the hole is not formed.

Figure 2B:
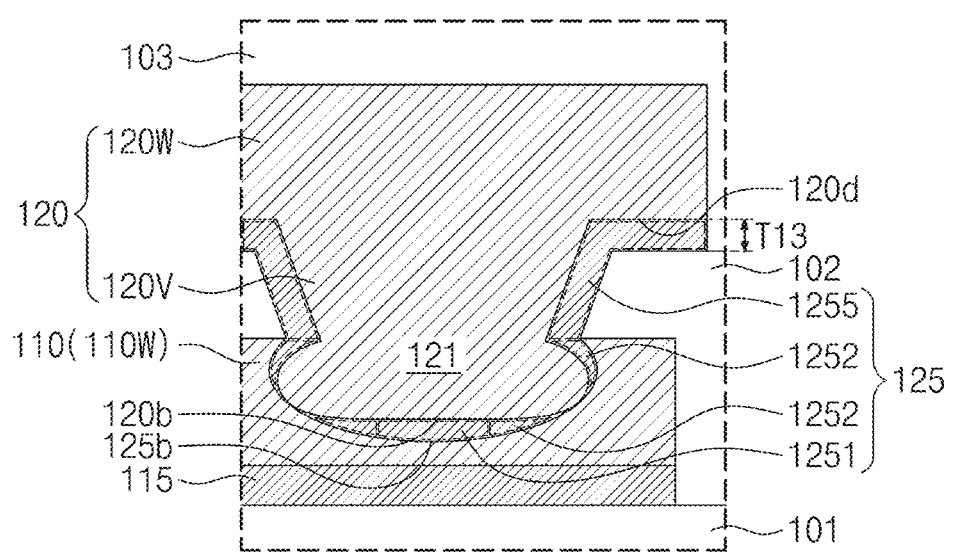
FIG. 2B is a sectional view illustrating a first redistribution pattern, a second seed pattern, and a second redistribution pattern, according to example embodiments of the inventive concepts.

FIG. 2B is an enlarged sectional view illustrating a first redistribution pattern, a second seed pattern, and a second redistribution pattern according to example embodiments of the inventive concepts and corresponding to the portion III of FIG. 1B.

Referring to FIG. 2B, the second wire portion 120W of the second redistribution pattern 120 may include the second convex portion 121. The second seed pattern 125 may include the first lower portion 1151, the second lower portion 1252, and the upper portion 1255. The second lower portion 1252 of the second seed pattern 125 may further have a hole penetrating the same. The second convex portion 121 may be extended into the hole of the second lower portion 1252 of the second seed pattern 125 and may be in direct physical contact with the first redistribution pattern 110. Accordingly, a bonding strength between the first redistribution pattern 110 and the second redistribution pattern 120 may be further improved.

A fourth thickness of the second lower portion 1252 of the second seed pattern 125 may be 30% to 80% of the third thickness T13 of the upper portion 1255. The fourth thickness may be a thickness of a portion of the second lower portion 1252, in which the hole is not formed.

Referring back to FIG. 1F, although not shown, the second lower portion 1352 of the third seed pattern 135 may further have a hole. The third convex portion 131 of the third redistribution pattern 130 may be extended in the hole of the second lower portion 1352 of the third seed pattern 135 and may be in direct/physical contact with the second redistribution pattern 120. The second lower portion 1452 of the third seed pattern 135 may further have a hole (not shown). The fourth convex portion 141 may be extended into the hole of the second lower portion 1452 of the fourth seed pattern 145 and may be in direct physical contact with the third redistribution pattern 130. The second lower portion 1552 of the pad seed pattern 155 may further have a hole (not shown). The fifth convex portion 151 may be extended into the hole of the second lower portion 1552 of the pad seed pattern 155 and may be in direct physical contact with the fourth redistribution pattern 140.

Figure 3A:
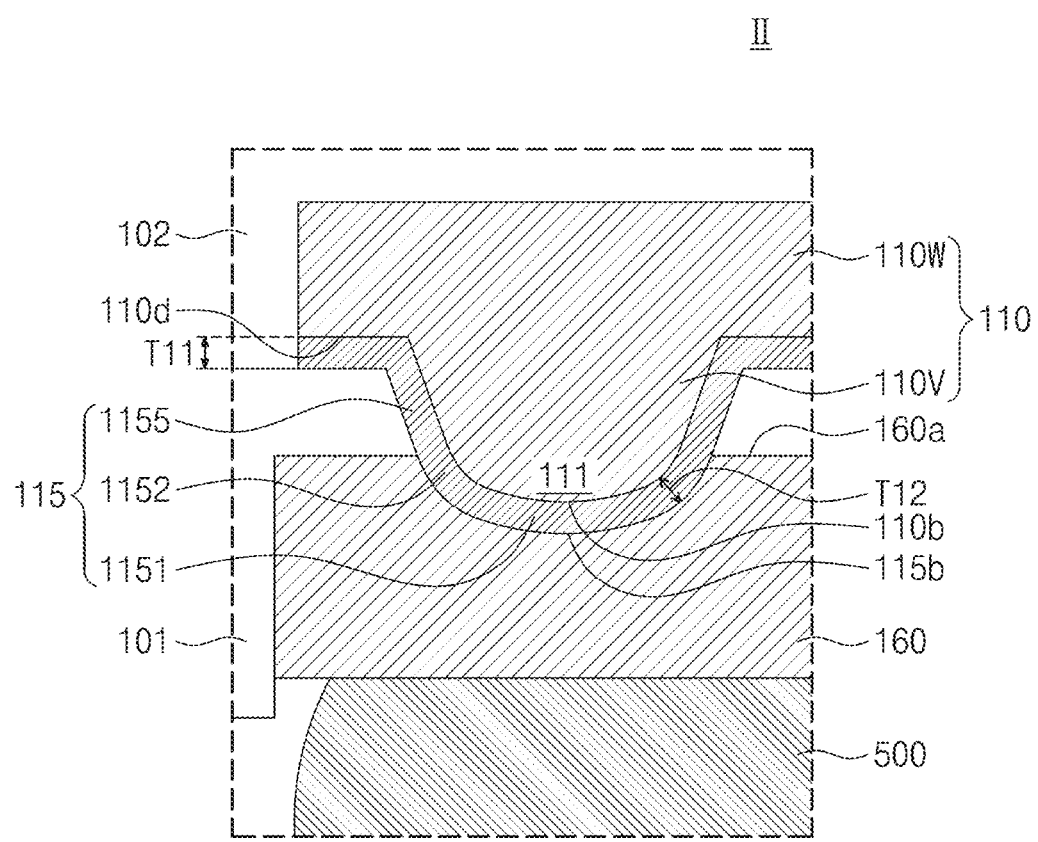
FIG. 3A is a sectional view illustrating an under-bump pattern, a first seed pattern, and a first redistribution pattern, according to example embodiments of the inventive concepts.

FIG. 3A is an enlarged sectional view illustrating an under-bump pattern, a first seed pattern, and a first redistribution pattern according to example embodiments of the inventive concepts and corresponding to the portion II of FIG. 1B.

Referring to FIG. 3A, the first via portion 110V of the first redistribution pattern 110 may include the first convex portion 111. The first convex portion 111 may have a concave-up shape. However, the first convex portion 111 may not protrude laterally. The width of the first convex portion 111 may be smaller than the width of the first via portion 110V at the top surface 160a of the under-bump pattern 160.

Figure 3B:
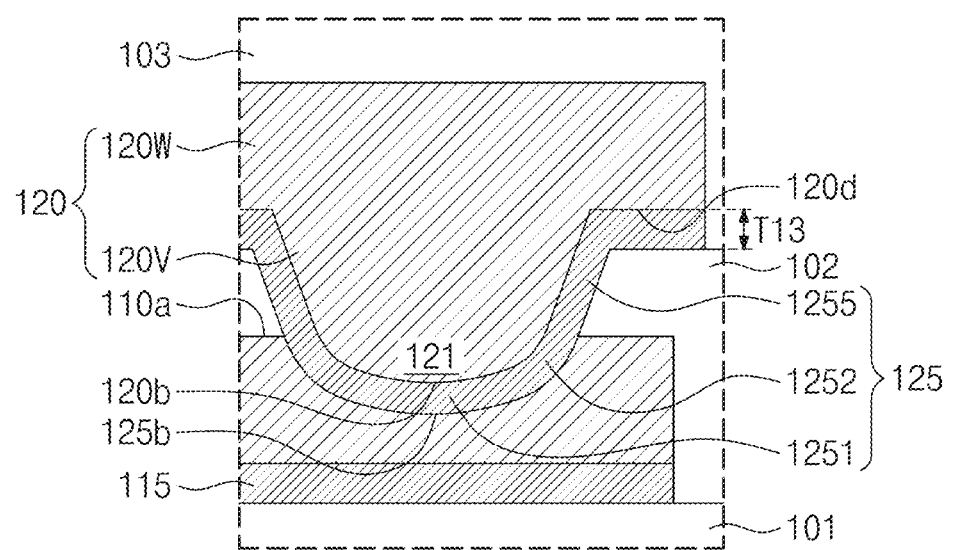
FIG. 3B is a sectional view illustrating a first redistribution pattern, a second seed pattern, and a second redistribution pattern, according to example embodiments of the inventive concepts.

FIG. 3B is an enlarged sectional view illustrating a first redistribution pattern, a second seed pattern, and a second redistribution pattern according to example embodiments of the inventive concepts and corresponding to the portion III of FIG. 1B.

Referring to FIG. 3B, the second via portion 120V of the second redistribution pattern 120 may include the second convex portion 121. For example, the second convex portion 121 may have a concave-up shape. However, the second convex portion 121 may not protrude laterally. The width of the second convex portion 121 may be smaller than the width of the second via portion 120V at the top surface 110a of the first redistribution pattern 110.

Although not shown, the third convex portion 131 of the third redistribution pattern 130, the fourth convex portion 141 of the fourth redistribution pattern 140, or the fifth convex portion 151 of the bonding pad 150 may have the same or substantially the same shape as the first convex portion 111 of FIG. 3A and the second convex portion 121 of FIG. 3B.

Figure 4A:
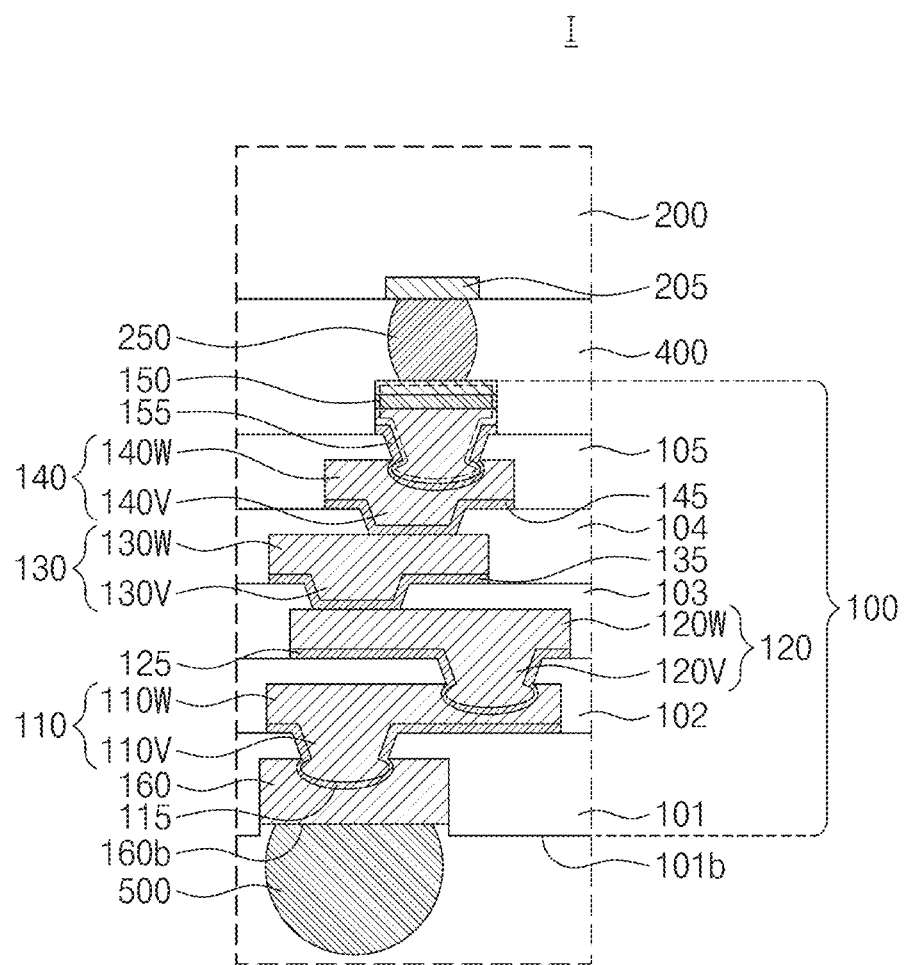
FIG. 4A is a sectional view illustrating a redistribution substrate according to example embodiments of the inventive concepts.

FIG. 4A is an enlarged sectional view illustrating a redistribution substrate according to example embodiments of the inventive concepts and corresponding to the portion I of FIG. 1A.

Referring to FIG. 4A, the redistribution substrate 100 may include the under-bump pattern 160, the first to fourth redistribution patterns 110, 120, 130, and 140, the first to fourth seed patterns 115, 125, 135, and 145, the pad seed pattern 155, and the bonding pad 150.

At least one of the first to fourth via portions 110V, 120V, 130V, and 140V may not be extended into a corresponding one of the under-bump pattern 160 and the first to third redistribution pattern 110, 120, and 130. For example, the bottom surface of the third seed pattern 135 may not be provided in the second redistribution pattern 120. The bottom surface of the third via portion 130V and the bottom surface of the third seed pattern 135 may have a flat shape. The bottom surface of the fourth seed pattern 145 may not be provided in the third redistribution pattern 130. The bottom surface of the fourth via portion 140V and the bottom surface of the fourth seed pattern 145 may have a flat shape. However, the presence or absence of the protrusions of the first to fourth via portions 110V, 120V, 130V, and 140V and the positions of the bottom surfaces of the first to fourth seed patterns 115, 125, 135, and 145 may be variously changed.

Figure 4B:
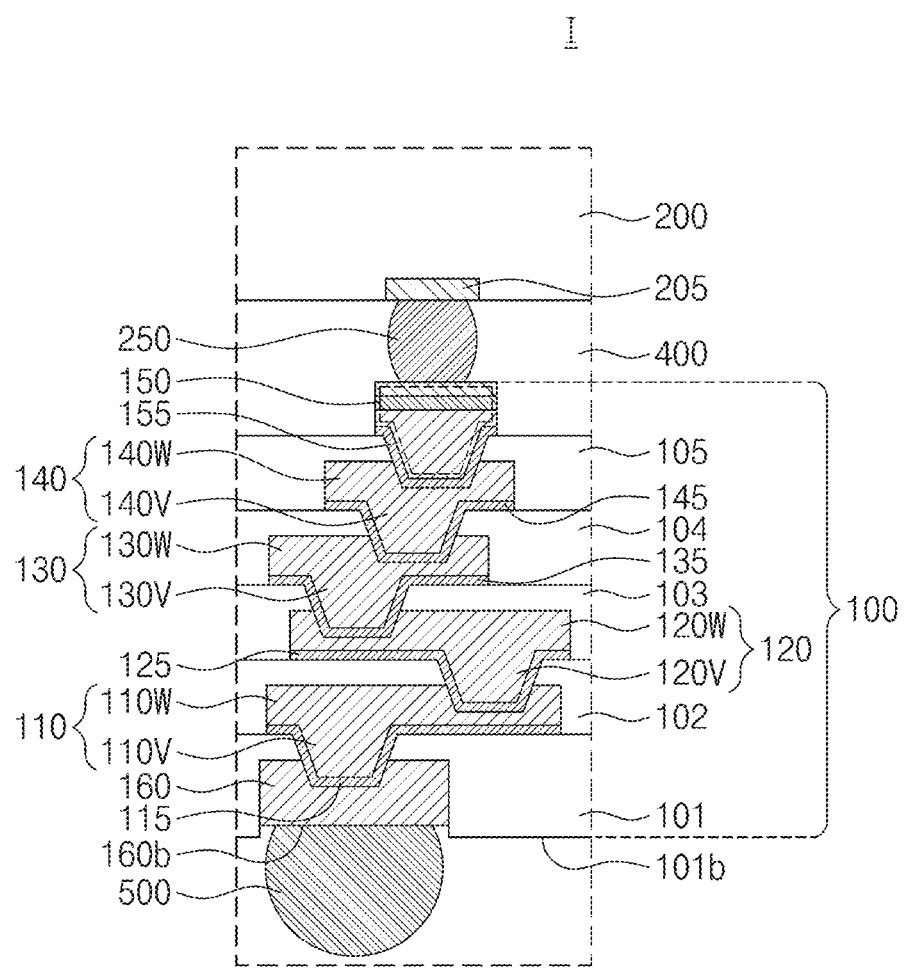
FIG. 4B is a sectional view illustrating a redistribution substrate according to example embodiments of the inventive concepts.

FIG. 4B is an enlarged sectional view illustrating a redistribution substrate according to example embodiments of the inventive concepts and corresponding to the portion I of FIG. 1A.

Referring to FIG. 4B, the redistribution substrate 100 may include the under-bump pattern 160, the first to fourth redistribution patterns 110, 120, 130, and 140, the first to fourth seed patterns 115, 125, 135, and 145, the pad seed pattern 155, and the bonding pad 150.

The bottom surface of the first via portion 110V may be provided in the under-bump pattern 160 and may be flat. For example, the bottom surface 110b of the first via portion 110V may be substantially parallel to the first direction. The bottom surface of the first seed pattern 115 may have a substantially flat shape. The bottom surface of the second via portion 120V and the bottom surface of the second seed pattern 125 may be provided in the first redistribution pattern 110 and may be flat. The bottom surface of the third via portion 130V and the bottom surface of the third seed pattern 135 may be provided in the second redistribution pattern 120 and may be flat. The bottom surface of the fourth via portion 140V and the bottom surface of the fourth seed pattern 145 may be provided in the third redistribution pattern 130 and may be flat. The bottom surface of the bonding pad 150 and the bottom surface of the pad seed pattern 155 may be provided in the fourth redistribution pattern 140 and may be flat.

Figure 5A:
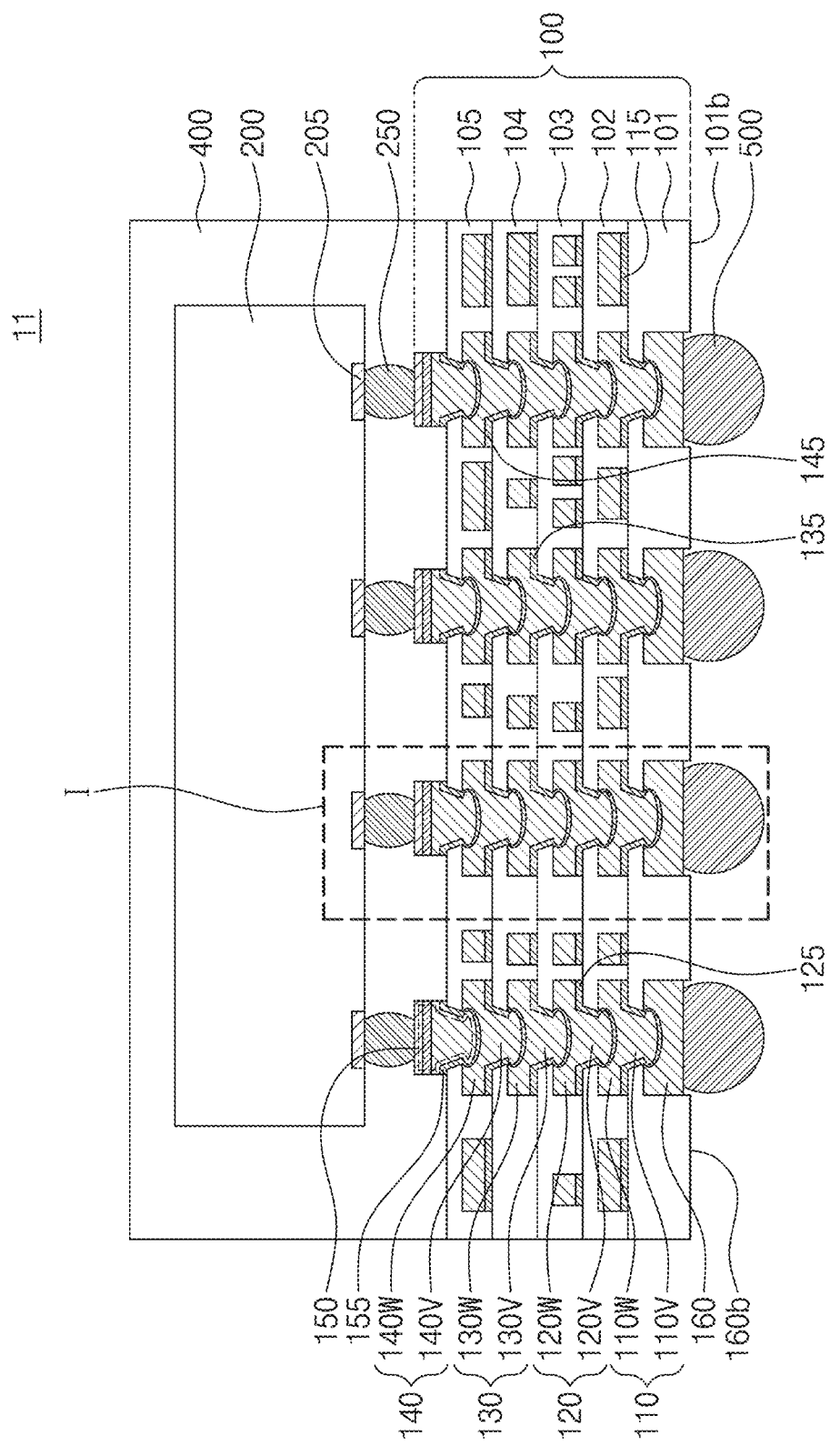
FIG. 5A is a sectional view illustrating a semiconductor package according to example embodiments of the inventive concepts.
Figure 5B:
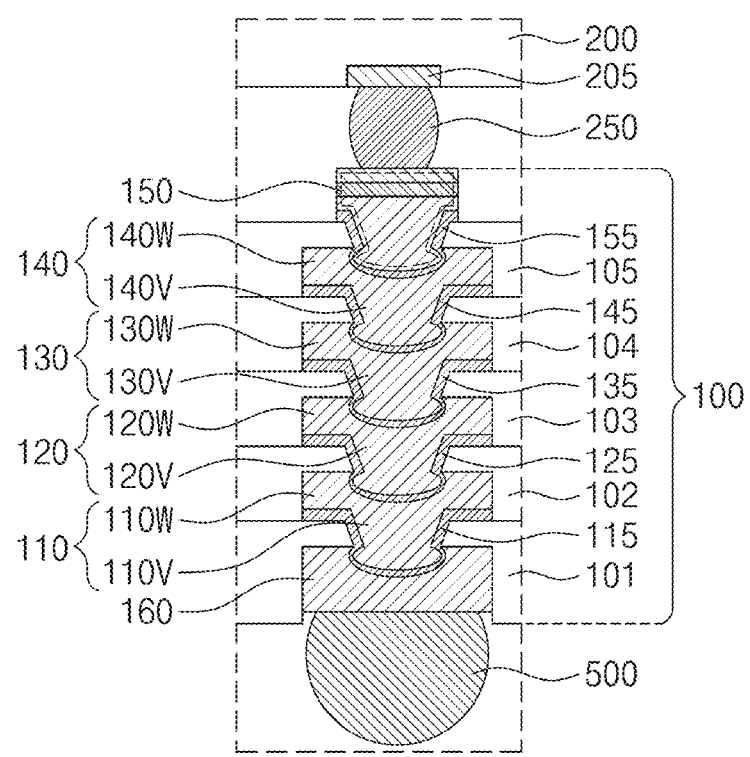
FIG. 5B is an enlarged sectional view illustrating a portion I of FIG. 5A.

FIG. 5A is a sectional view illustrating a semiconductor package according to example embodiments of the inventive concepts. FIG. 5B is an enlarged sectional view illustrating a portion I of FIG. 5A.

Referring to FIGS. 5A and 5B, a semiconductor package 11 may include the redistribution substrate 100, the semiconductor chip 200, and the solder pattern 500. The redistribution substrate 100 may include the under-bump pattern 160, the first to fourth redistribution patterns 110, 120, 130, and 140, the first to fourth seed patterns 115, 125, 135, and 145, the pad seed pattern 155, and the bonding pad 150.

The first to fourth via portions 110V, 120V, 130V, and 140V may be stacked on the under-bump pattern 160. For example, the under-bump pattern 160 may be vertically overlapped with each of the first to fourth via portions 110V, 120V, 130V, and 140V electrically connected thereto. The first to fourth via portions 101V, 102V, 103V, and 104V may have an aligned structure. Thus, the arrangement of the first to fourth wire portions 110W, 120W, 130W, and 140W may be more freely designed.

Figure 6A:
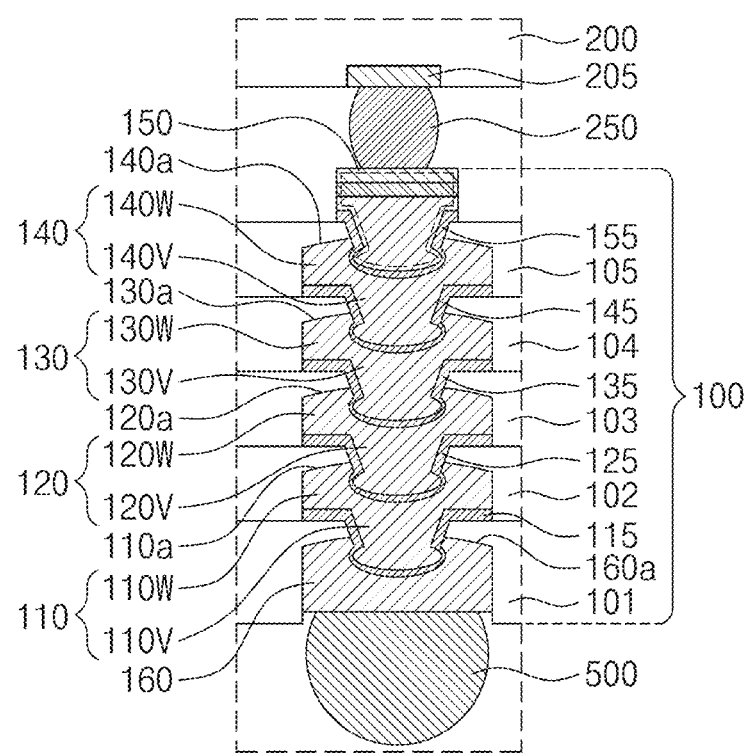
FIG. 6A is a sectional view illustrating a redistribution substrate according to example embodiments of the inventive concepts.

FIG. 6A is an enlarged sectional view illustrating a redistribution substrate according to example embodiments of the inventive concepts and corresponding to the portion I of FIG. 5A.

Referring to FIG. 6A, the top surface 160a of the under-bump pattern 160 may have a dome-shaped section. The top surface 160a of the center region of the under-bump pattern 160 may be located at a level higher than the top surface 160a of the edge region. For example, the top surface 160a of the under-bump pattern 160 may have a concave-down shape. At least a portion of the first redistribution pattern 110 may have a dome-shaped section. For example, the top surface 110a of the center region of the first redistribution pattern 110 may be located at a level higher than the top surface 110a of the edge region. The top surface 110a of the first redistribution pattern 110 may have a concave-down shape. For example, at least a portion of the second redistribution pattern 120 may have a dome-shaped section, and a top surface 120a of the second redistribution pattern 120 may have a concave-down shape. At least a portion of the third redistribution pattern 130 may have a dome-shaped section, and a top surface 130a of the third redistribution pattern 130 may have a concave-down shape. At least a portion of the fourth redistribution pattern 140 may have a dome-shaped section, and a top surface 140a of the fourth redistribution pattern 140 may have a concave-down shape. The top surface of the bonding pad 150 may have a flat shape. As another example, the top surface of the bonding pad 150 may have a concave-down shape.

Figure 6B:
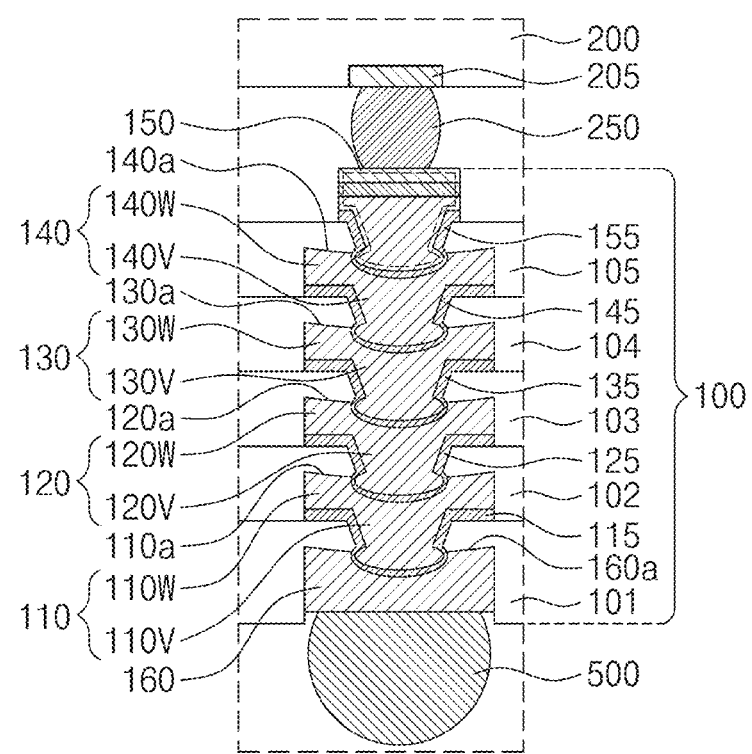
FIG. 6B is a sectional view illustrating a redistribution substrate according to example embodiments of the inventive concepts.

FIG. 6B is an enlarged sectional view illustrating a redistribution substrate according to example embodiments of the inventive concepts and corresponding to the portion I of FIG. 5A.

Referring to FIG. 6B, the top surface 160a of the under-bump pattern 160 may have a dimple-shaped section. The top surface 160a of the center region of the under-bump pattern 160 may be located at a level lower than the top surface 160a of the edge region. For example, the top surface 160a of the under-bump pattern 160 may have a concave-up shape. At least a portion of the first redistribution pattern 110 may have a dimple-shaped section. For example, the top surface 110a of the first redistribution pattern 110 may have a concave-up shape. For example, the top surface 110a of the center region of the first redistribution pattern 110 may be located at a level lower than the top surface 110a of the edge region. At least a portion of the second redistribution pattern 120 may have a dimple-shaped section, and the top surface 120a of the second redistribution pattern 120 may have a concave-up shape. At least a portion of the third redistribution pattern 130 may have a dimple-shaped section, and the top surface 130a of the third redistribution pattern 130 may have a concave-up shape. At least a portion of the fourth redistribution pattern 140 may have a dimple-shaped section, and the top surface 140a of the fourth redistribution pattern 140 may have a concave-up shape. The top surface of the bonding pad 150 may have a flat shape. As another example, the top surface of the bonding pad 150 may have a concave-up shape.

Figure 7:
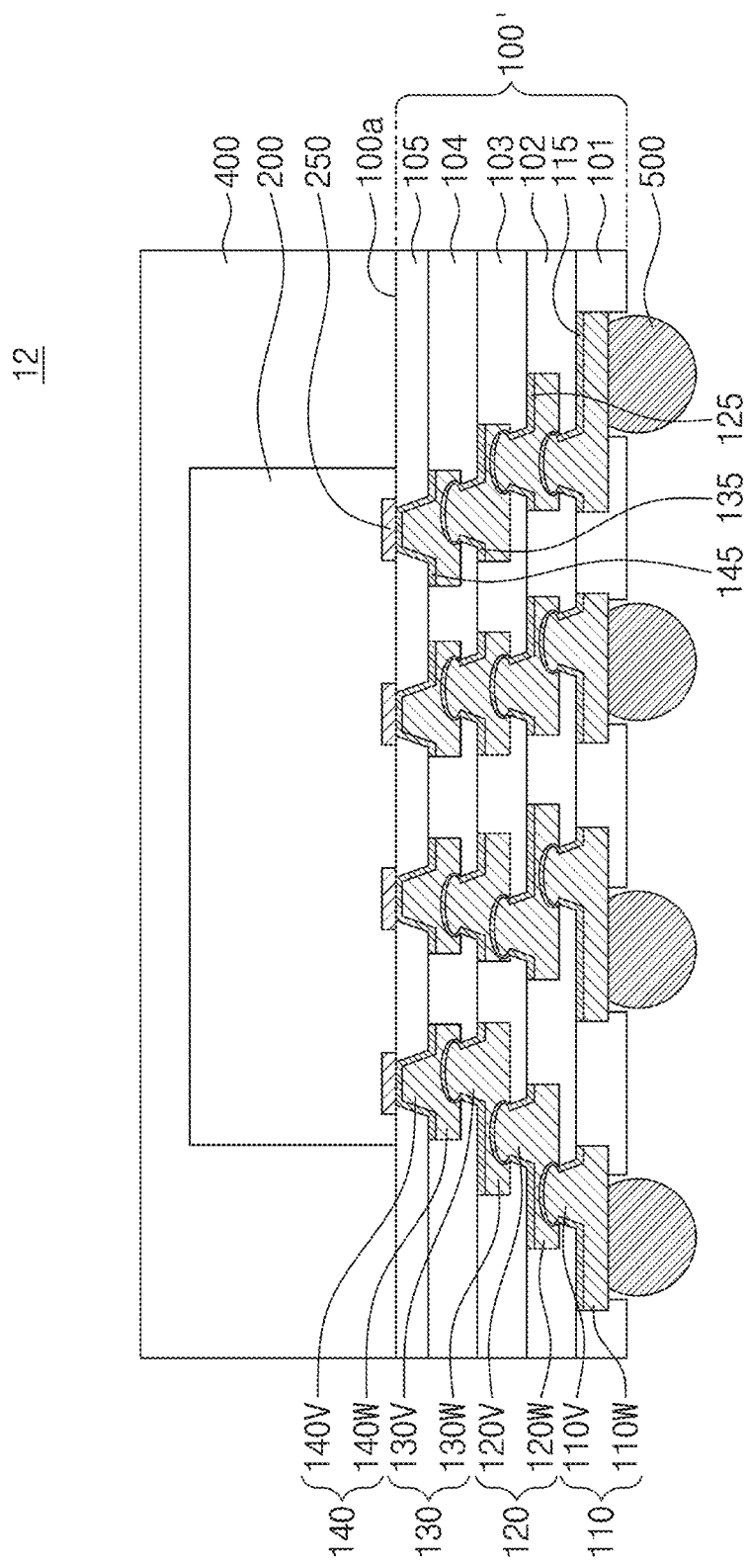
FIG. 7 is a sectional view illustrating a semiconductor package according to example embodiments of the inventive concepts.

FIG. 7 is a sectional view illustrating a semiconductor package according to example embodiments of the inventive concepts.

Referring to FIG. 7, a semiconductor package 12 may include a redistribution substrate 100', the semiconductor chip 200, the mold layer 400 and the solder pattern 500. The solder pattern 500, the semiconductor chip 200, and the mold layer 400 may be the same as or similar to those in the previous example embodiments. However, the semiconductor package 12 may not include the bonding bumps 250.

The redistribution substrate 100' may include the first to fifth insulating layers 101, 102, 103, 104, and 105, the first to fourth redistribution patterns 110, 120, 130, and 140, and the first to fourth seed patterns 115, 125, 135, and 145. However, the redistribution substrate 100' may not include the bonding pad 150 and the pad seed pattern 155 (e.g., see FIG. 1B), and the semiconductor chip 200 may be in direct contact with a first surface 100a of the redistribution substrate 100'. For example, the fifth insulating layer 105 may be in direct physical contact with the bottom surface of the semiconductor chip 200.

The fourth redistribution pattern 140 may be electrically connected to the chip pad 205 of the semiconductor chip 200 without a bonding bump. For example, the fourth seed pattern 145 may be interposed between the fourth redistribution pattern 140 and the chip pad 205 and may be in direct contact with the fourth redistribution pattern 140 and the chip pad 205.

Unlike that described above, the first to fourth via portions 110V, 120V, 130V, and 140V may be respectively provided on corresponding ones of the first to fourth wire portions 110W, 120W, 130W, and 140W. The top surface of the first via portion 110V may be provided in the second redistribution pattern 120. The shape of the upper portion of the first via portion 110V may be a vertically and symmetrically inverted shape of the first convex portion 111 of FIG. 1C. For example, the top surface of the first via portion 110V may have a concave-down shape. The first seed pattern 115 may be provided between the first via portion 110V and the second redistribution pattern 120 and may be extended onto the side surface of the first via portion 110V and the top surface of the first wire portion 110W. A first seed thickness of the first seed pattern 115 on the top surface of the first wire portion 110W may be larger than a second seed thickness of the first seed pattern 115. The second seed thickness may be a thickness of the first seed pattern 115 at the top surface of the edge region of the first via portion 110V in the second redistribution pattern 120. For example, the second seed thickness may be 30% to 80% of the first seed thickness. The solder pattern 500 may be attached to the bottom surface of the first wire portion 110W of the first redistribution pattern 110. The first wire portion 110W may serve as a solder pad.

The top surface of the second via portion 120V may be provided in the third redistribution pattern 130 and may have a concave-down shape. The second seed pattern 125 may be provided between the second via portion 120V and the third redistribution pattern 130 and may be extended onto the side surface of the second via portion 120V and the top surface of the second wire portion 120W. A third seed thickness of the second seed pattern 125 on the top surface of the second wire portion 120W may be larger than a fourth seed thickness of the second seed pattern 125 in the third redistribution pattern 130 and on the top surface of the edge region of the second via portion 120V. The fourth seed thickness may be 30% to 80% of the third seed thickness.

The top surface of the third via portion 130V may be provided in the fourth redistribution pattern 140 and may have a concave-down shape. The third seed pattern 135 may be provided between the third via portion 130V and the fourth redistribution pattern 140 and may be extended on the side surface of the third via portion 130V and the top surface of the third wire portion 130W. A fifth seed thickness of the third seed pattern 135 on the top surface of the third wire portion 130W may be larger than a sixth seed thickness of the third seed pattern 135 in the fourth redistribution pattern 140 and on the top surface of the edge region of the third via portion 130V. The sixth seed thickness may be 30% to 80% of the fifth seed thickness.

Example embodiments of the redistribution substrate 100 or 100' may be realized in a mixed manner. For example, the example embodiments of FIGS. 1A to 1C, 1E, and 1F, the example embodiments of FIG. 2A, the example embodiments of FIG. 2B, the example embodiments of FIG. 3A, the example embodiments of FIG. 3B, the example embodiments of FIG. 4A, the example embodiments of FIG. 4B, the example embodiments of FIGS. 5A and 5B, the example embodiments of FIG. 6A, the example embodiments of FIG. 6B, and the example embodiments of FIG. 7 may be realized in a mixed manner.

Hereinafter, a method of manufacturing a semiconductor package, according to example embodiments of the inventive concepts, may be described.

FIGS. 8A to 8E, 8G, and 8I to 8T are sectional views illustrating a method of manufacturing a semiconductor package, according to example embodiments of the inventive concepts. FIG. 8F is an enlarged sectional view illustrating a portion V of FIG. 8E. FIG. 8H is an enlarged sectional view illustrating the portion V of FIG. 8G. For concise description, a previously described element may be identified by the same reference number without repeating an overlapping description thereof.

Referring to FIG. 8A, an under-bump seed layer 165Z, a first resist pattern 191, and the under-bump pattern 160 may be formed on a carrier substrate 900. First, the carrier substrate 900 and a release layer 990 may be prepared. The release layer 990 may be attached to the carrier substrate 900. The under-bump seed layer 165Z may be formed on the carrier substrate 900 to cover the release layer 990. The under-bump seed layer 165Z may be formed by a deposition process.

The first resist pattern 191 may be formed on a top surface of the under-bump seed layer 165Z. A first guide opening 191X may be formed in the first resist pattern 191 to expose the under-bump seed layer 165Z. In example embodiments, any separate curing process may not be performed during the process of forming the first resist pattern 191 and the first guide opening 191X. Thus, the first guide opening 191X may be formed to have a side surface that is perpendicular to its bottom surface. The first resist pattern 191 may include a photoresist material.

The under-bump pattern 160 may be formed in the first guide opening 191X to cover the under-bump seed layer 165Z. The under-bump pattern 160 may be formed by an electroplating process using the under-bump seed layer 165Z as an electrode. The electroplating process may be performed such that the under-bump pattern 160 is not extended onto the top surface of the first resist pattern 191. Thus, a separate planarization process may not be necessary in the process of forming the under-bump pattern 160. Since the side surface of the first guide opening 191X is substantially perpendicular to the bottom surface, the side surface of the under-bump pattern 160 may be substantially perpendicular to the bottom surface.

Referring to FIG. 8B, the first resist pattern 191 may be removed to expose a top surface of a first portion of the under-bump seed layer 165Z and the side surface of the under-bump pattern 160. The removal of the first resist pattern 191 may be performed by a strip process.

Figure 8C:
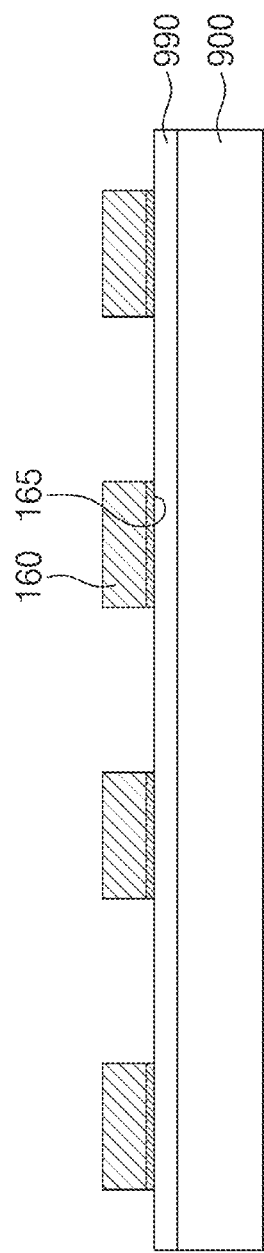

Referring sequentially to FIGS. 8B and 8C, the under-bump seed layer 165Z may be patterned to form an under-bump seed pattern 165. The patterning of the under-bump seed layer 165Z may include etching the exposed first portion of the under-bump seed layer 165Z. Accordingly, the first portion of the under-bump seed layer 165Z may be removed, and the top surface of the release layer 990 may be exposed. In the etching process, the under-bump pattern 160 may have an etch selectivity with respect to the under-bump seed layer 165Z. A second portion of the under-bump seed layer 165Z may be provided on the bottom surface of the under-bump pattern 160. Accordingly, the second portion of the under-bump seed layer 165Z may not be removed by the etching process. After the etching process, the remaining second portion of the under-bump seed layer 165Z may form the under-bump seed pattern 165.

Figure 8D:
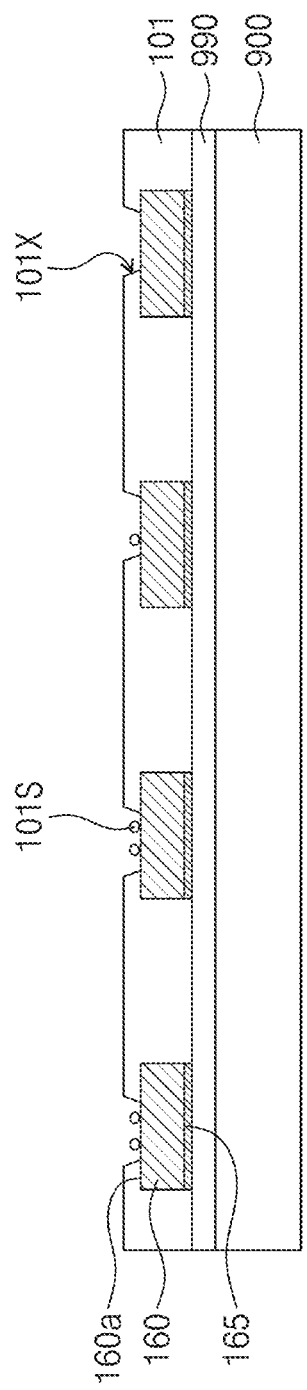

Referring to FIG. 8D, the first insulating layer 101 may be formed on the release layer 990 and the under-bump pattern 160 to cover the top surface 160a and the side surface of the under-bump pattern 160. The formation of the first insulating layer 101 may be performed by a coating process (e.g., a spin coating process or a slit coating process).

A first opening 101X may be formed in the first insulating layer 101 by patterning the first insulating layer 101. The first insulating layer 101 may be patterned by an exposure process and a developing process. The first opening 101X may be formed to expose at least a portion of the top surface 160a of the under-bump pattern 160. A first scum 101S may be left on the exposed top surface 160a of the under-bump pattern 160. The first scum 101S may include a residue of the first insulating layer 101 or a residue of a process. As an example, the first scum 101S may include a photosensitive polymer.

Figure 8E:
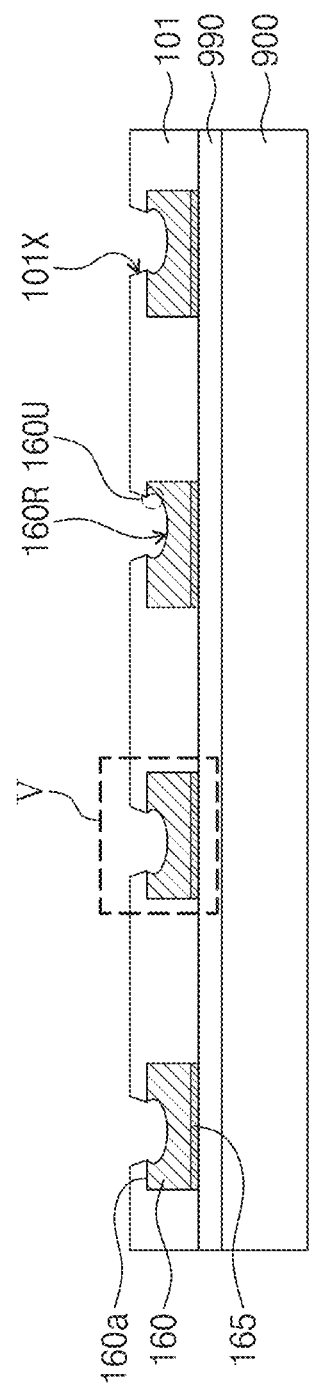
Figure 8F:
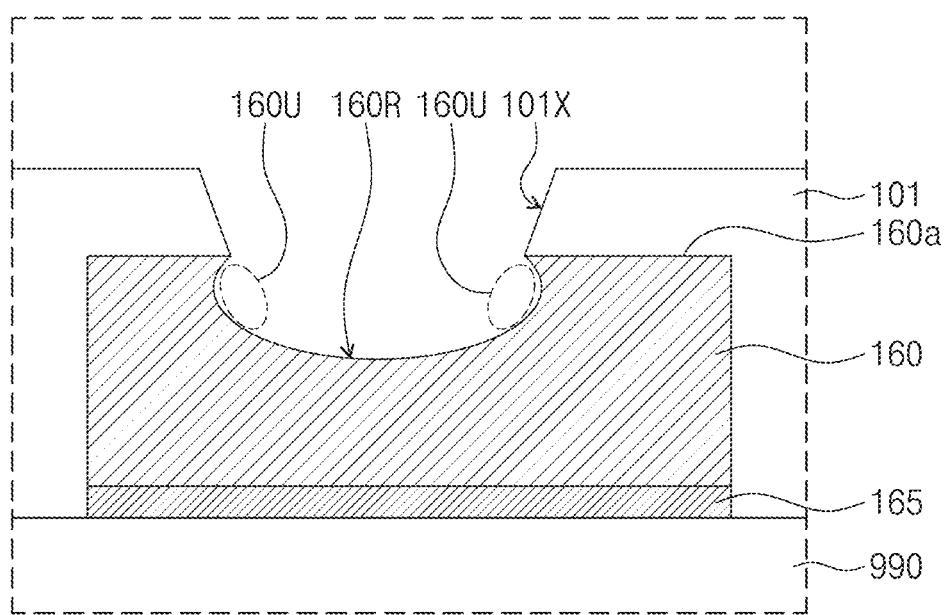
FIG. 8F is an enlarged sectional view illustrating a portion V of FIG. 8E.

Referring to FIGS. 8E and 8F, a recess portion 160R may be formed by performing an etching process on the exposed top surface 160a of the under-bump pattern 160. The etching process may include, for example, a wet etching process. In example embodiments, the first insulating layer 101 may have an etch selectivity with respect to the under-bump pattern 160. During the wet etching process, the first scum 101S may be removed. Accordingly, the first scum 101S may not be left after the etching process.

The recess portion 160R may be formed on the top surface 160a of the under-bump pattern 160. The recess portion 160R may be connected to the first opening 101X. The bottom surface of the center region of the recess portion 160R may be located at a level lower than the bottom surface of the edge region. For example, the bottom surface of the recess portion 160R may have a concave-up shape. As shown in FIG. 8F, the recess portion 160R may have an undercut 160U. For example, the undercut 160U may be a laterally-expanded portion of the recess portion 160R. The shape of the recess portion 160R may not be limited to the illustrated examples and may be variously changed. For example, the undercut 160U may not be formed.

Figure 8G:
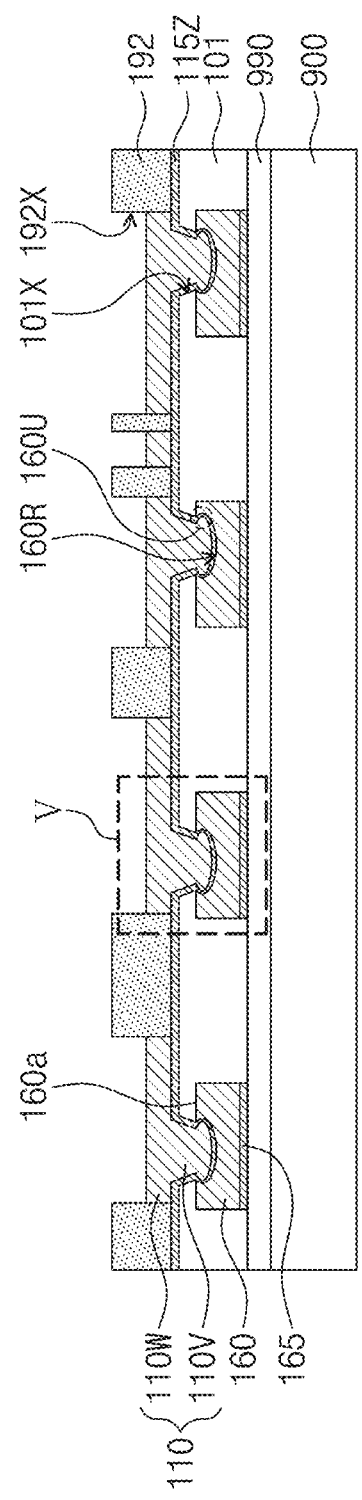
Figure 8H:
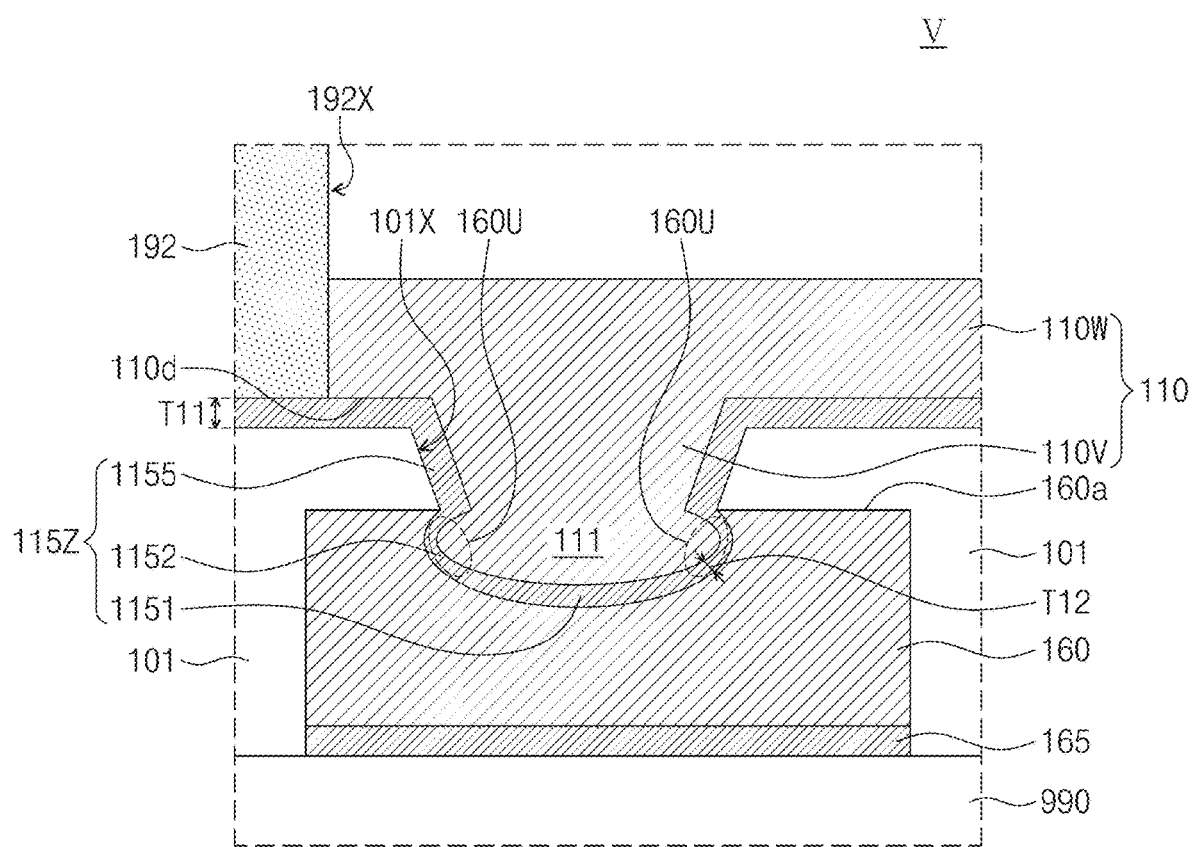
FIG. 8H is an enlarged sectional view illustrating the portion V of FIG. 8G.

Referring to FIGS. 8G and 8H, a first seed layer 115Z, a second resist pattern 192, and the first redistribution pattern 110 may be formed. First, the first seed layer 115Z may be formed on the top surface 160a of the under-bump pattern 160, an inner surface of the recess portion 160R of the under-bump pattern 160, an inner side surface of the first opening 101X, and the top surface of the first insulating layer 101. The first seed layer 115Z may be formed by a deposition process. The first seed layer 115Z may include the first lower portion 1151, the second lower portion 1152, and the upper portion 1155. The first lower portion 1151, the second lower portion 1152, and the upper portion 1155 may be the same as those of the first seed pattern 115 previously described with reference to FIG. 1C. The first seed layer 115Z on an inner side surface of the undercut 160U may correspond to the first lower portion 1151 of the first seed layer 115Z. The first seed layer 115Z on the first insulating layer 101 may correspond to the upper portion 1155 of the first seed layer 115Z.

The second thickness T12 of the first seed layer 115Z on the inner side surface of the undercut 160U may be smaller than the first thickness T11 of the first seed layer 115Z on the first insulating layer 101. For example, the second thickness T12 may be 30% to 80% of the first thickness T11.

In example embodiments where the first scum 101S of FIG. 8D is left on the under-bump pattern 160, resistance between the under-bump pattern 160 and the first seed layer 115Z may be increased. According to example embodiments of the inventive concepts, since the first scum 101S is removed during the forming process of the recess portion 160R described with reference to FIGS. 8E and 8F, the electric characteristics between the under-bump pattern 160 and the first seed layer 115Z may be improved. In addition, the first seed layer 115Z may be robustly coupled to the under-bump pattern 160.

The second resist pattern 192 may be formed on the first seed layer 115Z. The formation of the second resist pattern 192 may include coating the top surface of the first seed layer 115Z with a photoresist material. Thereafter, a second guide opening 192X may be formed by patterning the second resist pattern 192. The patterning of the second resist pattern 192 may be performed by an exposure and developing process. The second guide opening 192X may be vertically overlapped with the first opening 101X and the recess portion 160R. The second guide opening 192X may be formed to have a width that is larger than a width of the first opening 101X corresponding thereto. The second guide opening 192X may be formed to expose the first seed layer 115Z.

The first redistribution pattern 110 may be formed by performing an electroplating process, in which the first seed layer 115Z is used as an electrode. The first redistribution pattern 110 may be formed in the first opening 101X to cover the first seed layer 115Z. For example, the first redistribution pattern 110 may fill the first opening 101X. The first redistribution pattern 110 may be formed to fill a lower region of the second guide opening 192X but may not exposed onto a top surface of the second resist pattern 192. A separate planarization process may not be performed, during the formation of the first redistribution pattern 110. Accordingly, the process of forming the first redistribution pattern 110 may be simplified. The first redistribution pattern 110 may include the first via portion 110V and the first wire portion 110W.

Figure 8I:
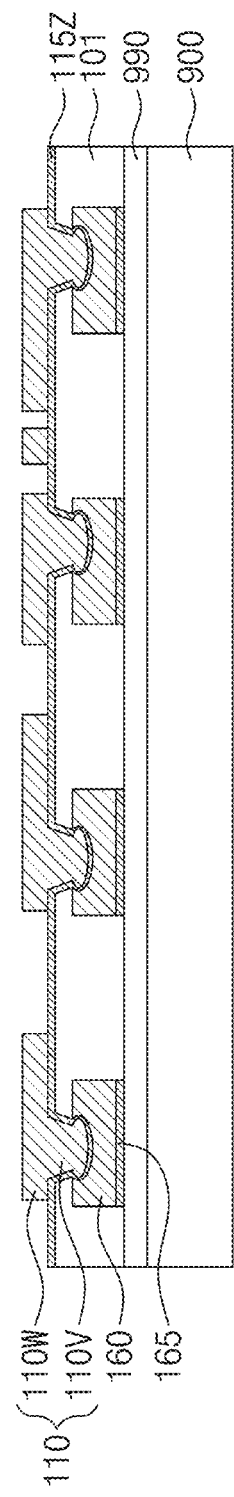

Referring to FIG. 8I, the second resist pattern 192 may be removed to expose a top surface of a first portion of the first seed layer 115Z. The removal of the second resist pattern 192 may be performed by a strip process.

Referring to FIG. 8I, the second resist pattern 192 may be removed to expose the top surface of the first portion of the first seed layer 115Z. The removal of the second resist pattern 192 may be performed by a strip process.

Figure 8J:
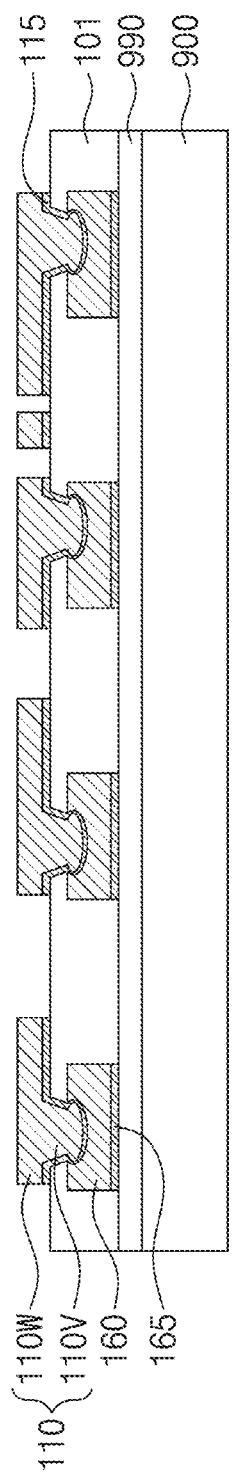

Referring to FIGS. 8I and 8J, the exposed first portion of the first seed layer 115Z may be removed to form the first seed pattern 115. The removal of the first portion of the first seed layer 115Z may be performed by an etching process. The etching process may be a wet etching process. In the etching process, the first redistribution pattern 110 may have an etch selectivity with respect to the first seed layer 115Z. A second portion of the first seed layer 115Z may be disposed on a bottom surface of the first redistribution pattern 110 and may not be exposed to the etching process. After the etching process, the second portion of the first seed layer 115Z may form the first seed pattern 115.

Referring to FIG. 8K, the second insulating layer 102 may be formed on the first insulating layer 101 to cover the first insulating layer 101 and the first redistribution pattern 110. The formation of the second insulating layer 102 may be performed by a coating process.

A second opening 102X may be formed by patterning the second insulating layer 102 by an exposure process and a developing process. The second opening 102X may be provided in the second insulating layer 102 to expose a portion of the top surface 110a of the first redistribution pattern 110. A second scum 102S may be left on the exposed portion of the top surface 110a of the first redistribution pattern 110. The second scum 102S may include a residue of the second insulating layer 102 or a residue of a process. As an example, the second scum 102S may include a photosensitive polymer.

Referring to FIG. 8L, a first recess portion 110R may be formed by performing an etching process on the exposed top surface 110a of the first redistribution pattern 110. The etching process may include, for example, a wet etching process. The second scum 102S may be removed during the etching process.

The first recess portion 110R may be formed on the top surface 110a of the first redistribution pattern 110. The first recess portion 110R may be connected to the second opening 102X. The bottom surface of the center region of the first recess portion 110R may be located at a level lower than the bottom surface of the edge region. For example, the bottom surface of the first recess portion 110R may have a concave-up shape. The first recess portion 110R may have a first undercut 110U. For example, the first undercut 110U may be a laterally-expanded portion of the first recess portion 110R. As another example, the first undercut 110U may not be formed.

Figure 8M:
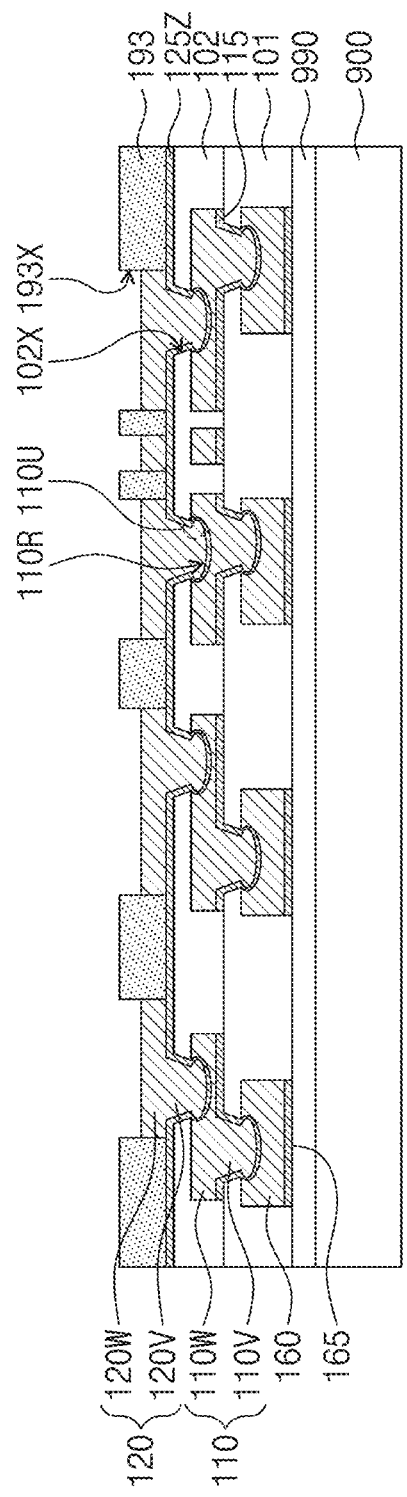

Referring to FIG. 8M, a second seed layer 125Z, a third resist pattern 193, and the second redistribution pattern 120 may be formed. First, the second seed layer 125Z may be formed on the top surface of the first redistribution pattern 110, an inner surface of a second recess portion 120R of the first redistribution pattern 110, an inner side surface of the first opening 101X, and the top surface of the first insulating layer 101. The second seed layer 125Z may be formed by a deposition process.

A fourth thickness of the second seed layer 125Z on the first undercut 110U may be smaller than a third thickness of the second seed layer 125Z on the second insulating layer 102. For example, the fourth thickness may be 30% to 80% of the third thickness. The second seed layer 125Z on the first undercut 110U may correspond to the second lower portion 125₂ of the second seed pattern 125 of FIG. 1E. The second seed layer 125Z on the second insulating layer 102 may correspond to the upper portion 125₅ of the second seed pattern 125 of FIG. 1E. The second seed layer 125Z on the first undercut 110U may mean a portion of the second seed layer 125Z covering the inner side surface of the first undercut 110U.

As a result of the formation of the first recess portion 110R, the second scum 102S of FIG. 8K may not left between the first redistribution pattern 110 and the second seed layer 125Z. Accordingly, it may be possible to improve electric characteristics between the first redistribution pattern 110 and the second seed layer 125Z. The second seed layer 125Z may be robustly bonded to the first redistribution pattern 110.

Figure 8N:
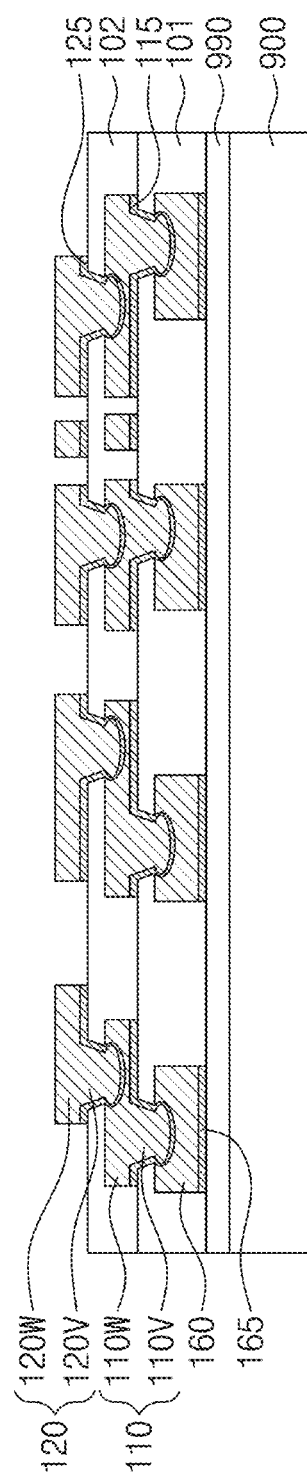

Referring to FIG. 8N, the third resist pattern 193 may be removed to expose a top surface of a first portion of the second seed layer 125Z. The removal of the third resist pattern 193 may be performed by a strip process. The second seed pattern 125 may be formed by removing the exposed first portion of the second seed layer 125Z by an etching process. A second portion of the second seed layer 125Z may be disposed on a bottom surface of the second redistribution pattern 120 and may not be exposed to the etching process. After the etching process, the second portion of the second seed layer 125Z may form the second seed pattern 125.

Figure 8O:
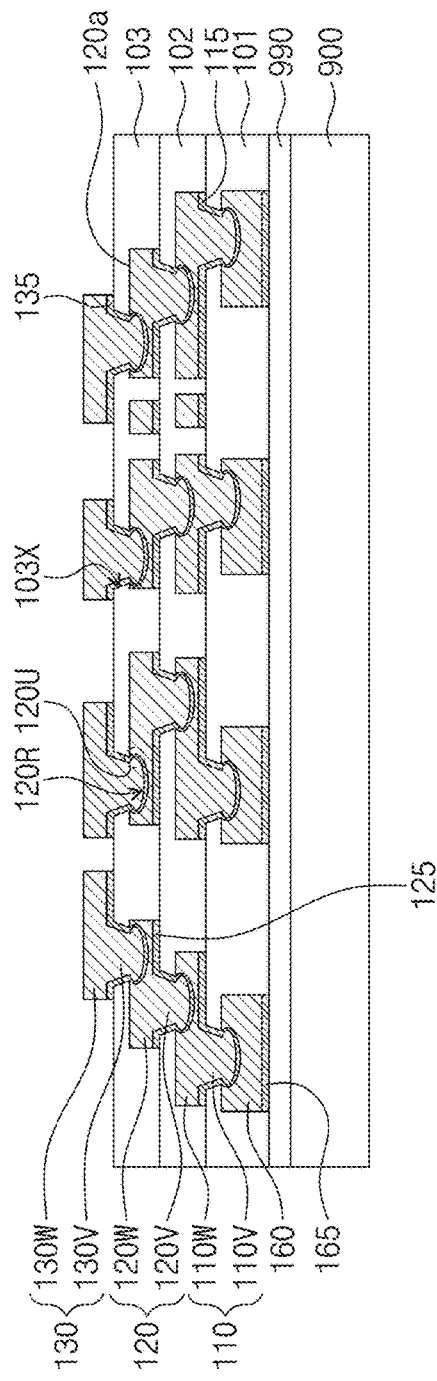

Referring to FIG. 8O, the third insulating layer 103, the third seed pattern 135, and the third redistribution pattern 130 may be formed on the second insulating layer 102. The third insulating layer 103, the third seed pattern 135, and the third redistribution pattern 130 may be respectively formed by the same methods as those for the first insulating layer 101, the first seed pattern 115, and the first redistribution pattern 110 of FIGS. 8D to 8J. For example, the third insulating layer 103 may be formed to have a third opening 103X exposing the top surface 120a of the second redistribution pattern 120. An etching process may be performed on the second redistribution pattern 120, which is exposed through the third opening 103X, to form the second recess portion 120R on the top surface 120a of the second redistribution pattern 120. A bottom surface of the second recess portion 120R may have a concave-up shape. The second recess portion 120R may further have a second undercut 120U. The second undercut 120U may be a laterally-expanded portion of the second recess portion 120R.

The formation of the third seed pattern 135 and the third redistribution pattern 130 may include forming a third seed layer (not shown) in the second recess portion 120R and the third opening 103X and on the top surface of the third insulating layer 103, performing an electroplating process using the third seed layer as an electrode, and etching a portion of the third seed layer.

As a result of the electroplating process, the third redistribution pattern 130 may be formed in the third opening 103X and the second recess portion 120R. The third redistribution pattern 130 may include the third wire portion 130W and the third via portion 130V. By etching the third seed layer, the third seed pattern 135 may be formed between the second and third redistribution patterns 120 and 130 and between the third redistribution pattern 130 and the third insulating layer 103.

Figure 8P:
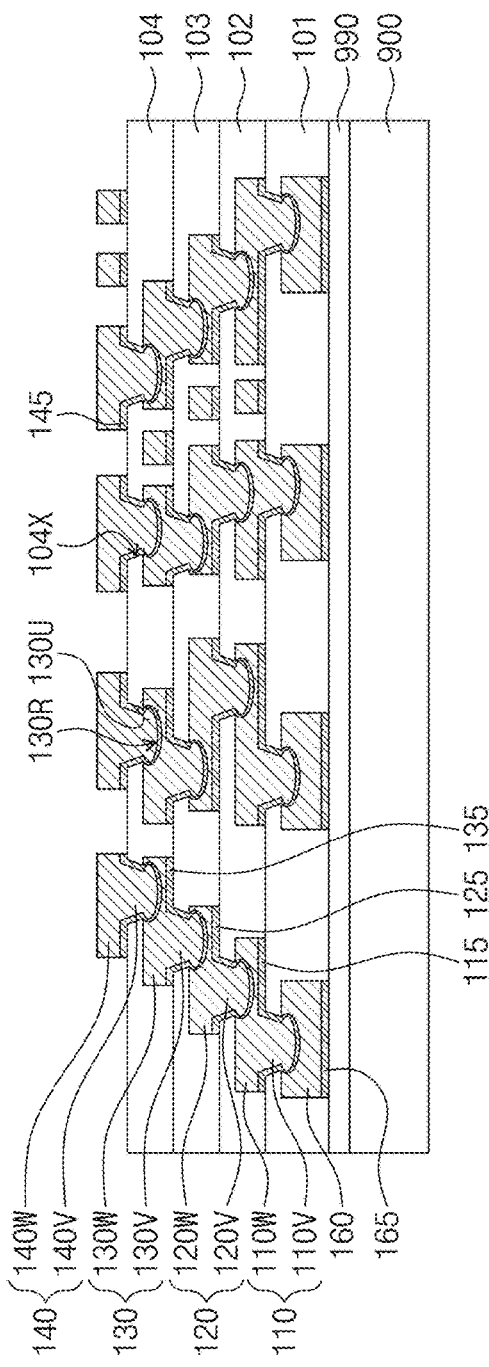

Referring to FIG. 8P, the fourth insulating layer 104, the fourth seed pattern 145, and the fourth redistribution pattern 140 may be formed on the third insulating layer 103. The fourth insulating layer 104, the fourth seed pattern 145, and the fourth redistribution pattern 140 may be respectively formed by the same methods as those for the first insulating layer 101, the first seed pattern 115, and the first redistribution pattern 110 of FIGS. 8D to 8J. For example, the fourth insulating layer 104 may be formed to have a fourth opening 104X exposing the top surface of the third redistribution pattern 130. An etching process may be performed on the third redistribution pattern 130, which is exposed through the fourth opening 104X, to form a third recess portion 130R on the top surface of the third redistribution pattern 130. For example, a bottom surface of the third recess portion 130R may have a concave-up shape. The third recess portion 130R may further have a third undercut 130U. The third undercut 130U may be a laterally-expanded portion of the third recess portion 130R.

The formation of the fourth seed pattern 145 and the fourth redistribution pattern 140 may include forming a fourth seed layer (not shown) in the fourth opening 104X and the third recess portion 130R and on the top surface of the fourth insulating layer 104, performing an electroplating process using the fourth seed layer as an electrode, and etching a portion of the fourth seed layer.

As a result of the electroplating process, the fourth redistribution pattern 140 may be formed in the fourth opening 104X and the third recess portion 130R. The fourth redistribution pattern 140 may include the fourth wire portion 140W and the fourth via portion 140V. The fourth seed pattern 145 may be formed between the third redistribution pattern 130 and the fourth redistribution pattern 140 and between the fourth redistribution pattern 140 and the fourth insulating layer 104 by etching the fourth seed layer.

Figure 8Q:
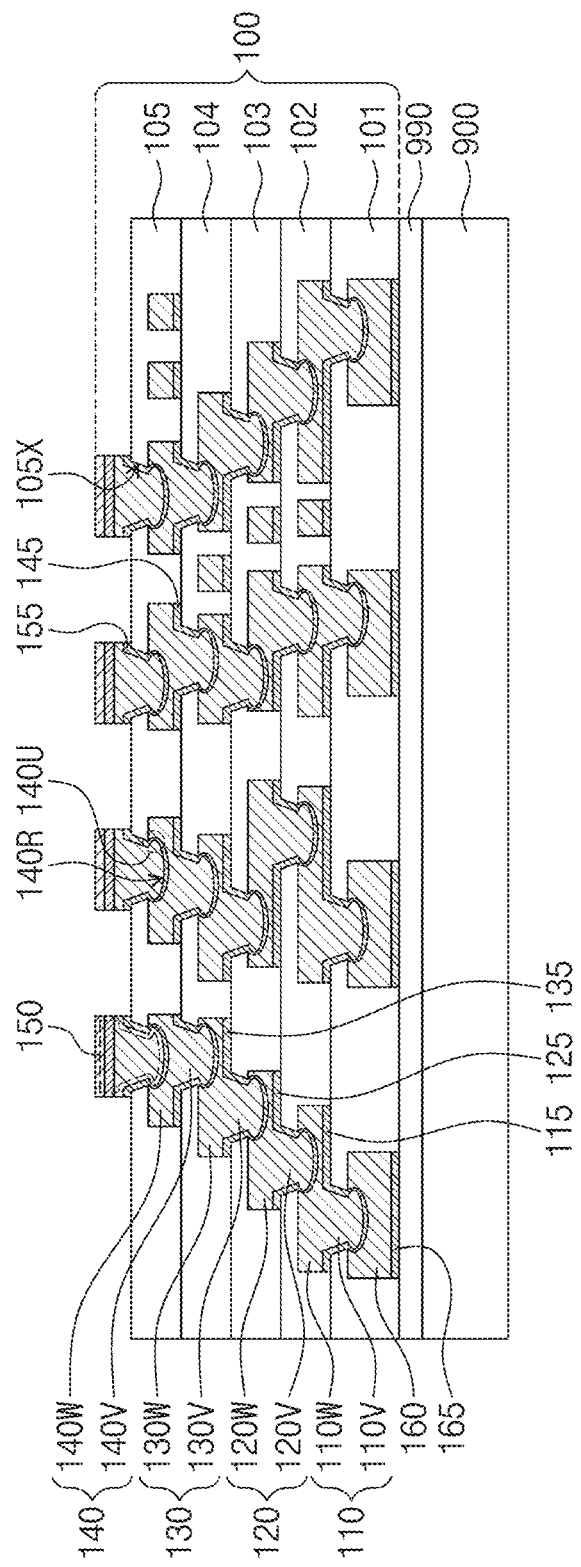

Referring to FIG. 8Q, the fifth insulating layer 105, the pad seed pattern 155, and the bonding pad 150 may be formed on the fourth insulating layer 104. The fifth insulating layer 105, the pad seed pattern 155, and the bonding pad 150 may be respectively formed by the same methods as those for the first insulating layer 101, the first seed pattern 115, and the first redistribution pattern 110 of FIGS. 8D to 8J. For example, the fifth insulating layer 105 may be formed to have a fifth opening 105X exposing the top surface of the fourth redistribution pattern 140. An etching process may be performed on the fourth redistribution pattern 140, which is exposed through the fifth opening 105X, to form a fourth recess portion 140R on the top surface of the fourth redistribution pattern 140. For example, a bottom surface of the fourth recess portion 140R may have a concave-up shape. The fourth recess portion 140R may further have a fourth undercut 140U. The fourth undercut 140U may be a laterally-expanded portion of the fourth recess portion 140R.

The formation of the pad seed pattern 155 and the bonding pad 150 may include forming a third seed layer (not shown) in the fifth opening 105X and the fourth recess portion 140R and on the top surface of the fifth insulating layer 105, performing an electroplating process using a pad seed layer as an electrode, and etching a portion of the pad seed layer.

As a result of the electroplating process, the bonding pad 150 may be formed in the fifth opening 105X and the fourth recess portion 140R. The pad seed pattern 155 may be formed between the fourth redistribution pattern 140 and the bonding pad 150 and between the bonding pad 150 and the fifth insulating layer 105. The redistribution substrate 100 may be manufactured by the afore-described method.

Figure 8R:
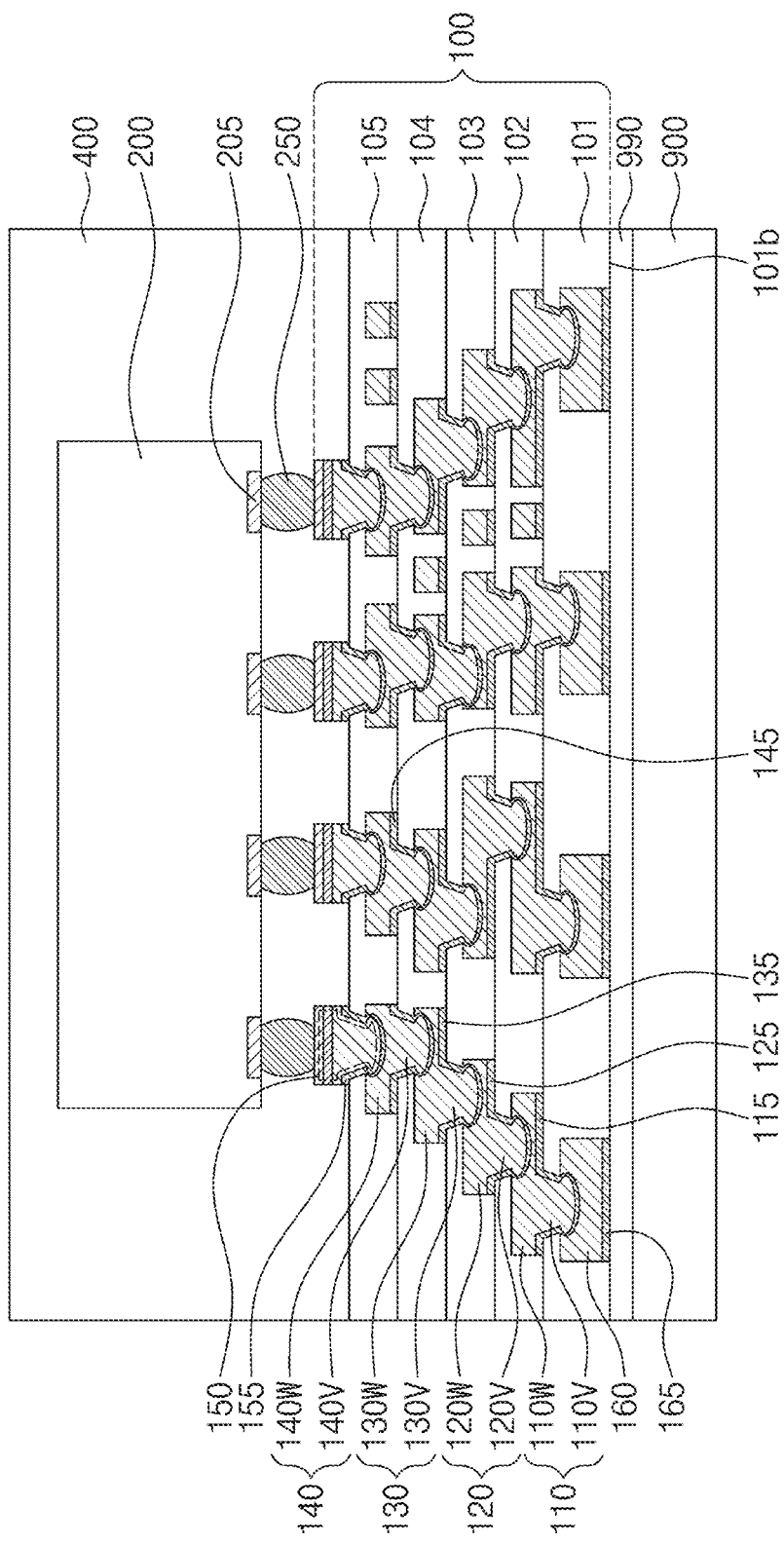

Referring to FIG. 8R, the semiconductor chip 200 with the chip pad 205 may be prepared. The semiconductor chip 200 may be disposed on the fifth insulating layer 105, such that the chip pad 205 is aligned to the bonding pad 150. The bonding bump 250 may be formed between the semiconductor chip 200 and the redistribution substrate 100. The bonding bump 250 may be coupled to the chip pad 205 and the bonding pad 150.

The mold layer 400 may be formed on the fifth insulating layer 105 to seal the semiconductor chip 200. The mold layer 400 may be further extended into a gap region between the fifth insulating layer 105 and the semiconductor chip 200 to seal the bonding bump 250.

Figure 8S:
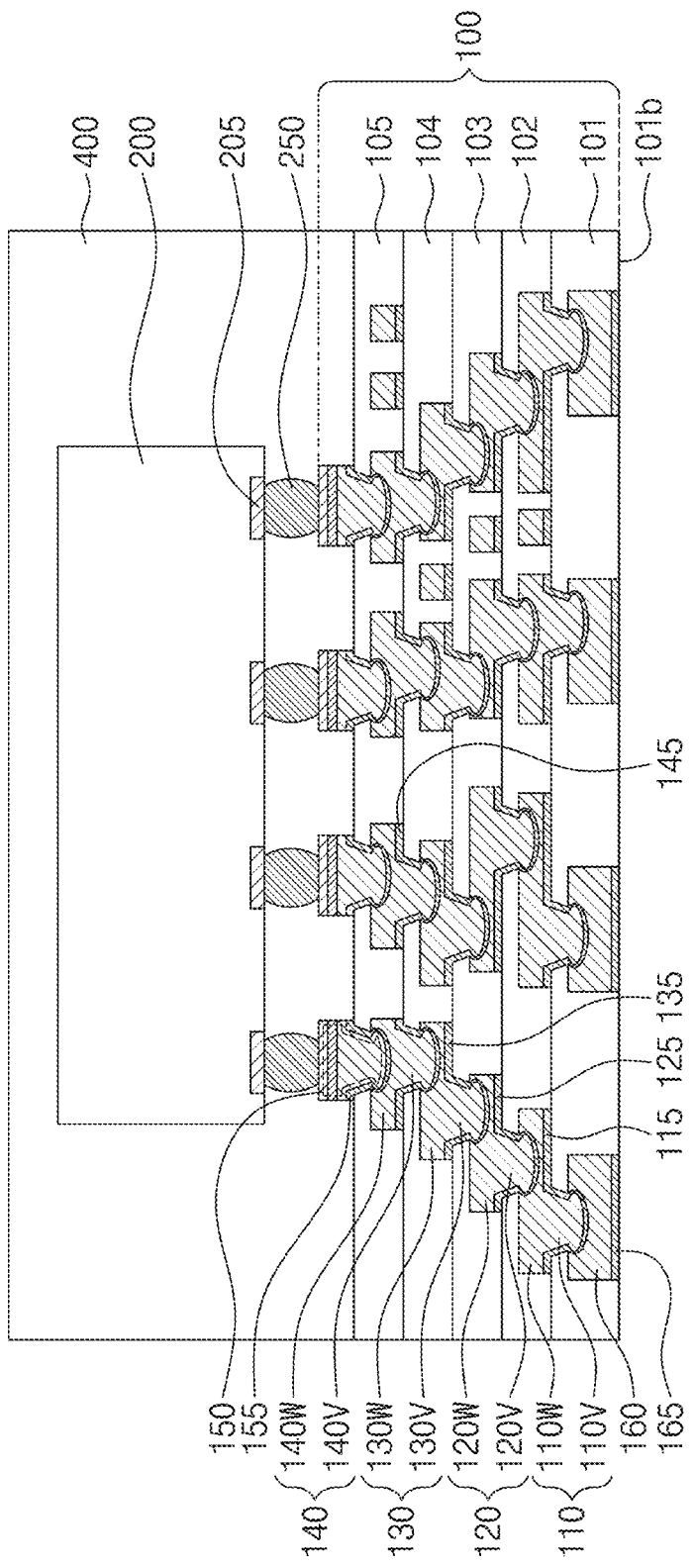

Referring to FIG. 8S, the bottom surface 101b of the first insulating layer 101 and the bottom surface of the under-bump seed pattern 165 may be exposed by removing the release layer 990 and the carrier substrate 900 from the first insulating layer 101. The removal of the release layer 990 and the carrier substrate 900 may be performed by a physical method.

Figure 8T:
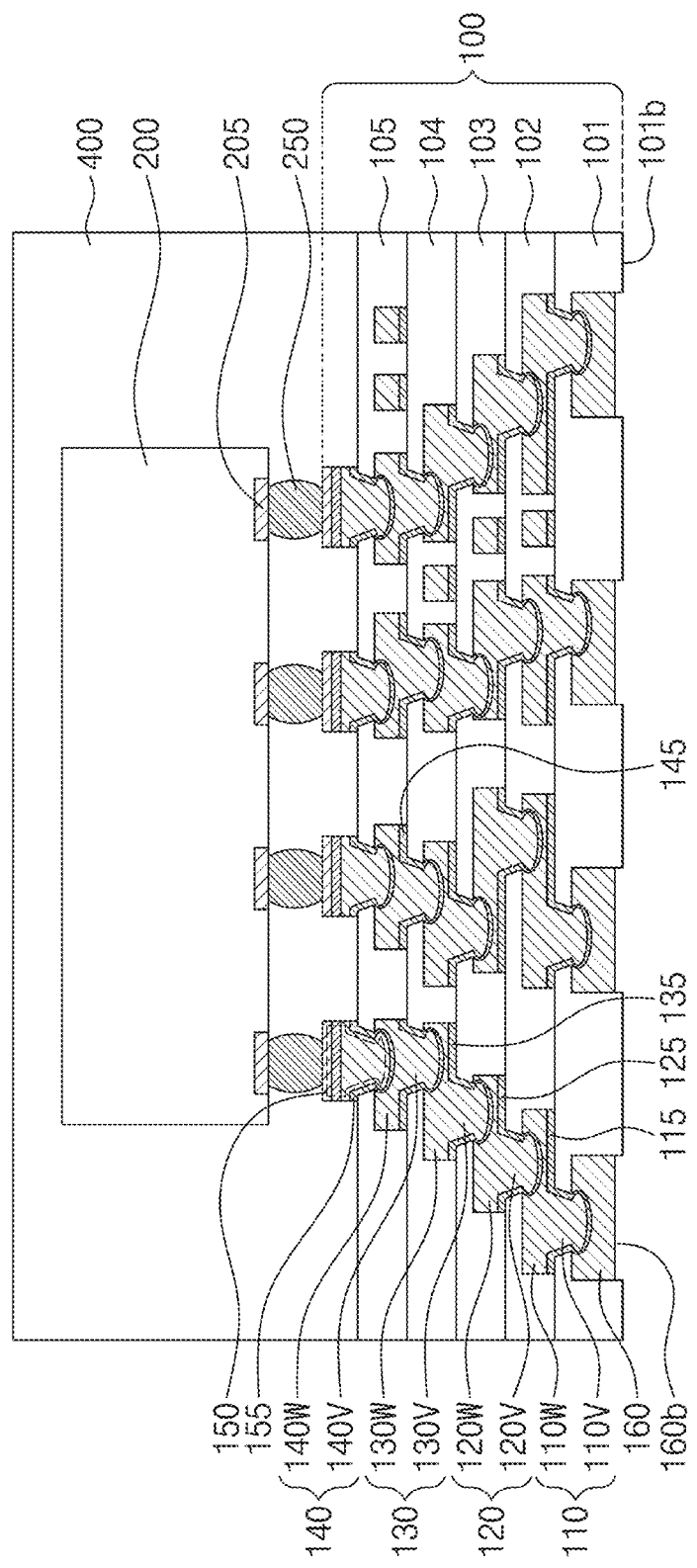

Referring sequentially to FIGS. 8S and 8T, the under-bump seed pattern 165 may be removed to expose the bottom surface 160b of the under-bump pattern 160. The removal of the under-bump seed pattern 165 may be performed by an etching process. The etching process may be a wet etching process. The under-bump pattern 160 and the first insulating layer 101 may be left after the etching process. Since the under-bump seed pattern 165 is removed, the bottom surface 160b of the under-bump pattern 160 may be located at a level higher than the bottom surface 101b of the first insulating layer 101.

Referring back to FIGS. 1A and 1B, the solder pattern 500 may be formed on the exposed bottom surface 160b of the under-bump pattern 160. The formation of the solder pattern 500 may include performing a solder ball attaching process.

A bonding strength between the solder pattern 500 and the under-bump seed pattern 165 (e.g., see FIG. 8S) may be relatively weak. For example, the bonding strength between the solder pattern 500 and the under-bump seed pattern 165 may be weaker than the bonding strength between the solder pattern 500 and the under-bump pattern 160. According to example embodiments of the inventive concepts, since the under-bump seed pattern 165 is removed and the solder pattern 500 is formed on the under-bump pattern 160, the solder pattern 500 may be in direct contact with the under-bump pattern 160. Thus, the solder pattern 500 may be robustly coupled to the under-bump pattern 160. The semiconductor package 10 may be manufactured by the afore-described process.

Although, for brevity's sake, a method of manufacturing just one semiconductor package 10 has been illustrated and described, the method of manufacturing the semiconductor package 10 is not limited to such a chip-level manufacturing. For example, the semiconductor package 10 may be manufactured in a chip level, a panel level, or a wafer level.

Hereinafter, in FIG. 9, FIGS. 10A and 10B, and FIG. 11, the first to third conductive layers 1501, 1502, and 1503 of the bonding pad 150 will not be illustrated as separate elements, for brevity's sake.

Figure 9:
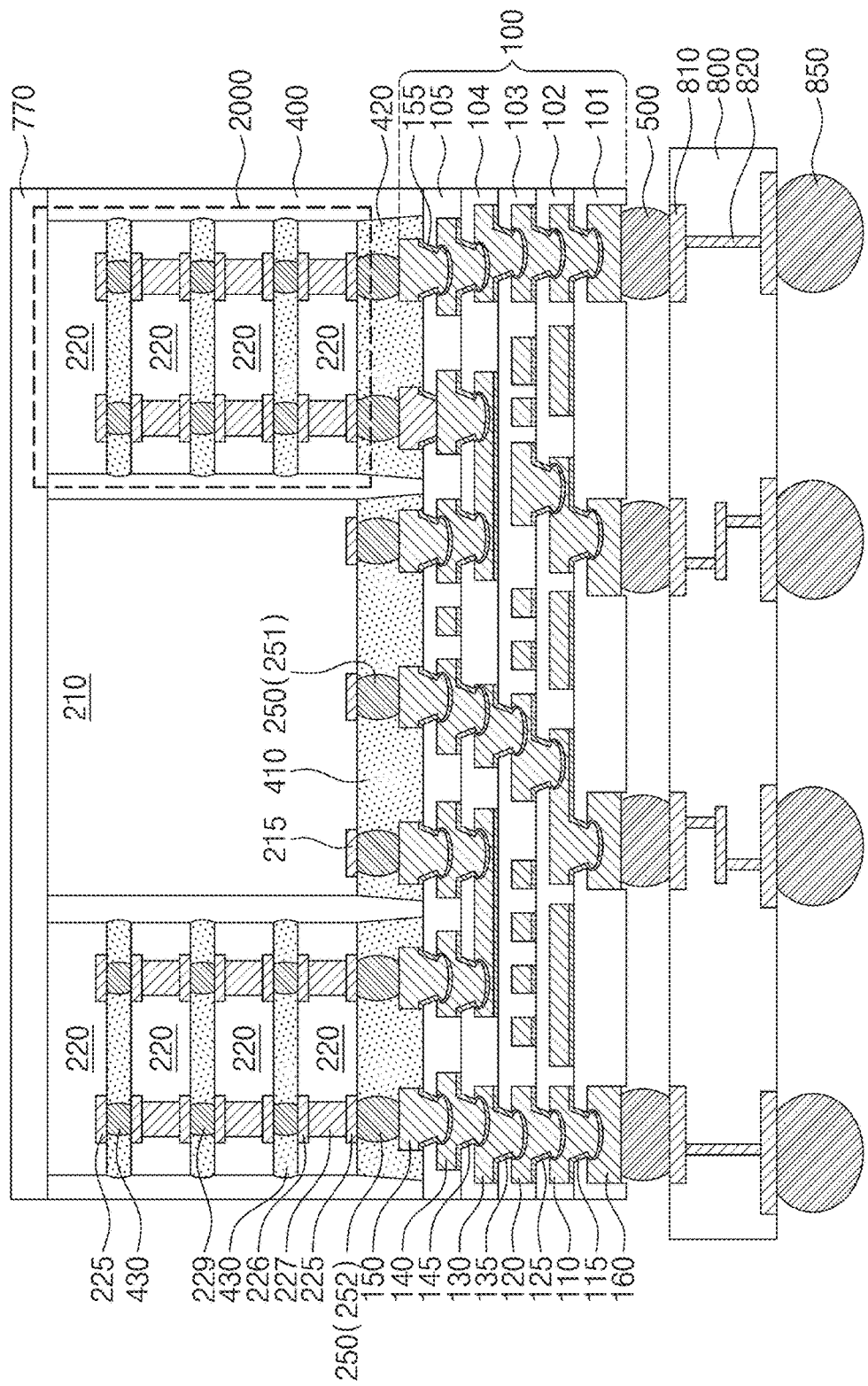
FIG. 9 is a sectional view illustrating a semiconductor package according to example embodiments of the inventive concepts.

FIG. 9 is a sectional view illustrating a semiconductor package according to example embodiments of the inventive concepts.

Referring to FIG. 9, a semiconductor package 13 may include a package substrate 800, the redistribution substrate 100, the solder pattern 500, a first semiconductor chip 210, a chip stack 2000, the bonding bump 250, and/or the mold layer 400. The redistribution substrate 100, the solder pattern 500, and the mold layer 400 may be the same or substantially the same as those in the examples of FIGS. 1A to 1C, 1E, and 1F. The bonding bump 250 may include a first bonding bump 251 and a second bonding bump 252.

The package substrate 800 may include a printed circuit board. The package substrate 800 may include a metal line 820 and a metal pad 810. The metal line 820 may be provided in the package substrate 800. Coupling with the package substrate 800 may mean coupling with the metal line 820. The metal pad 810 may be provided on a top surface of the package substrate 800 and may be electrically connected to the metal line 820. An outer coupling terminal 850 may be provided on a bottom surface of the package substrate 800 and may be coupled to the metal line 820. External electrical signals may be delivered to the metal line 820 through the outer coupling terminal 850. A solder ball may be used as the outer coupling terminal 850. The outer coupling terminal 850 may be formed of or include at least one of metallic materials (e.g., solder materials).

The redistribution substrate 100 may be disposed on the package substrate 800. The redistribution substrate 100 may serve as an interposer substrate. The solder pattern 500 may be aligned to the metal pad 810 of the package substrate 800 and may be coupled to the metal pad 810. The redistribution substrate 100 may be electrically connected to the package substrate 800 through the solder pattern 500.

The first semiconductor chip 210 may be mounted on the top surface of the redistribution substrate 100. The first bonding bump 251 may be disposed between a chip pad 215 of the first semiconductor chip 210 and the bonding pad 150. The first semiconductor chip 210 may be the same or substantially the same as the semiconductor chip 200 of FIGS. 1A and 1B, and the arrangement relationship, function, and material of the first bonding bump 251 may be the same or substantially the same as the bonding bump 250 of FIGS. 1A and 1B. A pitch of the first bonding bumps 251 may be smaller than a pitch of the outer coupling terminals 850.

The chip stack 2000 may be mounted on the top surface of the redistribution substrate 100. The chip stack 2000 may be disposed to be laterally spaced apart from the first semiconductor chip 210. The chip stack 2000 may include a plurality of second semiconductor chips 220, which are sequentially stacked. Each of the second semiconductor chips 220 may be the same as or similar to the semiconductor chip 200 of FIGS. 1A and 1B. However, the second semiconductor chips 220 may be a semiconductor chip that is of a kind different from the first semiconductor chip 210. For example, the first semiconductor chip 210 may be one of a logic chip, a buffer chip, and a system-on-chip (SOC), and each of the second semiconductor chips 220 may be another one of the logic chip, a memory chip, the buffer chip, and the system-on-chip (SOC). The memory chip may include a high bandwidth memory (HBM) chip. For example, the lowermost one of the second semiconductor chips 220 may be a logic chip, and the remaining ones of the second semiconductor chips 220 may be HBM chips. However, the lowermost one of the second semiconductor chips 220 may be a logic chip that is of a kind different from the first semiconductor chip 210. As an example, the lowermost one of the second semiconductor chips 220 may be a controller chip, and the first semiconductor chip 210 may include an ASIC chip or an application processor (AP) chip. The ASIC chip may include an application specific integrated circuit (ASIC).

Each of the second semiconductor chips 220 may include a lower pad 225, a through electrode 227, and an upper pad 226. The lower pad 225 and the upper pad 226 may be respectively provided on a bottom surface and a top surface of the second semiconductor chip 220. At least one of the lower pad 225 and the upper pad 226 may be electrically connected to an integrated circuit of the second semiconductor chip 220. The through electrode 227 may be disposed in the second semiconductor chip 220 and may be coupled to the lower pad 225 and the upper pad 226. The uppermost one of the second semiconductor chips 220 may include the lower pad 225 and may not include the through electrode 227 and the upper pad 226. An interposer bump 229 may be interposed between an adjacent pair of the second semiconductor chips 220 and may be respectively coupled to the lower pad 225 and the upper pad 226. Accordingly, a plurality of the second semiconductor chips 220 may be electrically connected to each other. The interposer bump 229 may include a solder, a pillar, or a bump. The interposer bump 229 may be formed of or include at least one of metallic materials.

As another example, the interposer bump 229 may be omitted. In some example embodiments, the lower pad 225 and the upper pad 226 of adjacent ones of the second semiconductor chips 220, which are opposite to each other, may be directly bonded to each other.

The second bonding bump 252 may be interposed between the lowermost one of the second semiconductor chips 220 and the redistribution substrate 100 and may be coupled to the lower pad 225 of the lowermost one of the second semiconductor chips 220 and the bonding pad 150 corresponding thereto. Accordingly, the second semiconductor chips 220 may be electrically connected to the first semiconductor chip 210 and the solder pattern 500 through the redistribution substrate 100. The arrangement relationship, function, and material of the second bonding bump 252 may be the same or substantially the same as those of the bonding bump 250 of FIGS. 1A and 1B. A pitch of the second bonding bumps 252 may be smaller than a pitch of the outer coupling terminals 850.

In example embodiments, a plurality of the chip stacks 2000 may be provided. The chip stacks 2000 may be laterally spaced apart from each other. The first semiconductor chip 210 may be disposed between the chip stacks 2000. Accordingly, a length of an electric path between the first semiconductor chip 210 and the chip stacks 2000 may be reduced.

A first under-fill layer 410 may be provided in a first gap region between the redistribution substrate 100 and the first semiconductor chip 210 to seal the first bonding bumps 251. The first under-fill layer 410 may be formed of or include at least one of insulating polymers (e.g., epoxy-based polymers). Second under-fill layers 420 may be respectively provided in second gap regions between the redistribution substrate 100 and the chip stacks 2000 to seal corresponding ones of the second bonding bumps 252. The second under-fill layers 420 may be formed of or include at least one of insulating polymers (e.g., epoxy-based polymers). Unlike that illustrated in the drawings, the second under-fill layers 420 may be omitted, and the first under-fill layer 410 may be extended into a region between the second gap regions to seal the first bonding bumps 251 and the second bonding bumps 252. A third under-fill layer 430 may be provided between adjacent ones of the second semiconductor chips 220 to seal the interposer bump 229. The third under-fill layer 430 may be formed of or include at least one of insulating polymers (e.g., epoxy-based polymers).

The mold layer 400 may be disposed on the redistribution substrate 100 to cover the side surface of the first semiconductor chip 210 and the side surfaces of the second semiconductor chips 220. The mold layer 400 may be provided to expose a top surface of the first semiconductor chip 210 and a top surface of the uppermost one of the second semiconductor chips 220. Unlike that illustrated in the drawings, the mold layer 400 may cover the top surface of the first semiconductor chip 210 and the top surface of the uppermost one of the second semiconductor chips 220. As another example, the first under-fill layer 410 and the second under-fill layers 420 may be omitted, and the mold layer 400 may be extended into the first gap region and second gap regions.

A conductive plate 770 may be further disposed on the top surface of the first semiconductor chip 210, the top surface of the chip stack 2000, and the top surface of the mold layer 400. The conductive plate 770 may be further extended onto the side surface of the mold layer 400. The conductive plate 770 may protect the first semiconductor chip 210 and the chip stack 2000 from the external environment. For example, the conductive plate 770 may be configured to absorb a physical impact from the outside. The conductive plate 770 may be formed of or include a material having high thermal conductivity and may be used as a heat sink or a heat slug. For example, the conductive plate 770 may be used to quickly exhaust heat, which is generated by the redistribution substrate 100, the first semiconductor chip 210, or the second semiconductor chips 220 during an operation of the semiconductor package 13. The conductive plate 770 may be formed of or include an electrically conductive material and may be used to as an electromagnetic wave shielding layer. For example, the conductive plate 770 may be used to reduce or prevent an electromagnetic interference (EMI) issue between the first semiconductor chip 210 and the second semiconductor chips 220. The conductive plate 770 may be grounded by the redistribution substrate 100, and in some example embodiments, it may be possible to reduce or prevent the first semiconductor chip 210 or the second semiconductor chips 220 from being damaged by an electrostatic discharge (ESD) phenomenon.

Although not shown, a third semiconductor chip may be additionally mounted on the redistribution substrate 100. Unlike that illustrated in the drawings, the mold layer 400 may be omitted.

The semiconductor package 13 may be manufactured using the redistribution substrate 100' described with reference to FIG. 7. In some example embodiments, the bonding bumps 250, the first under-fill layer 410, and the second under-fill layers 420 may be omitted. The arrangement relationship between the redistribution substrate 100' and the first and second semiconductor chips 210 and 220 may be the same or substantially the same as that between the redistribution substrate 100' and the semiconductor chip 200 of FIG. 7.

Figure 10A:
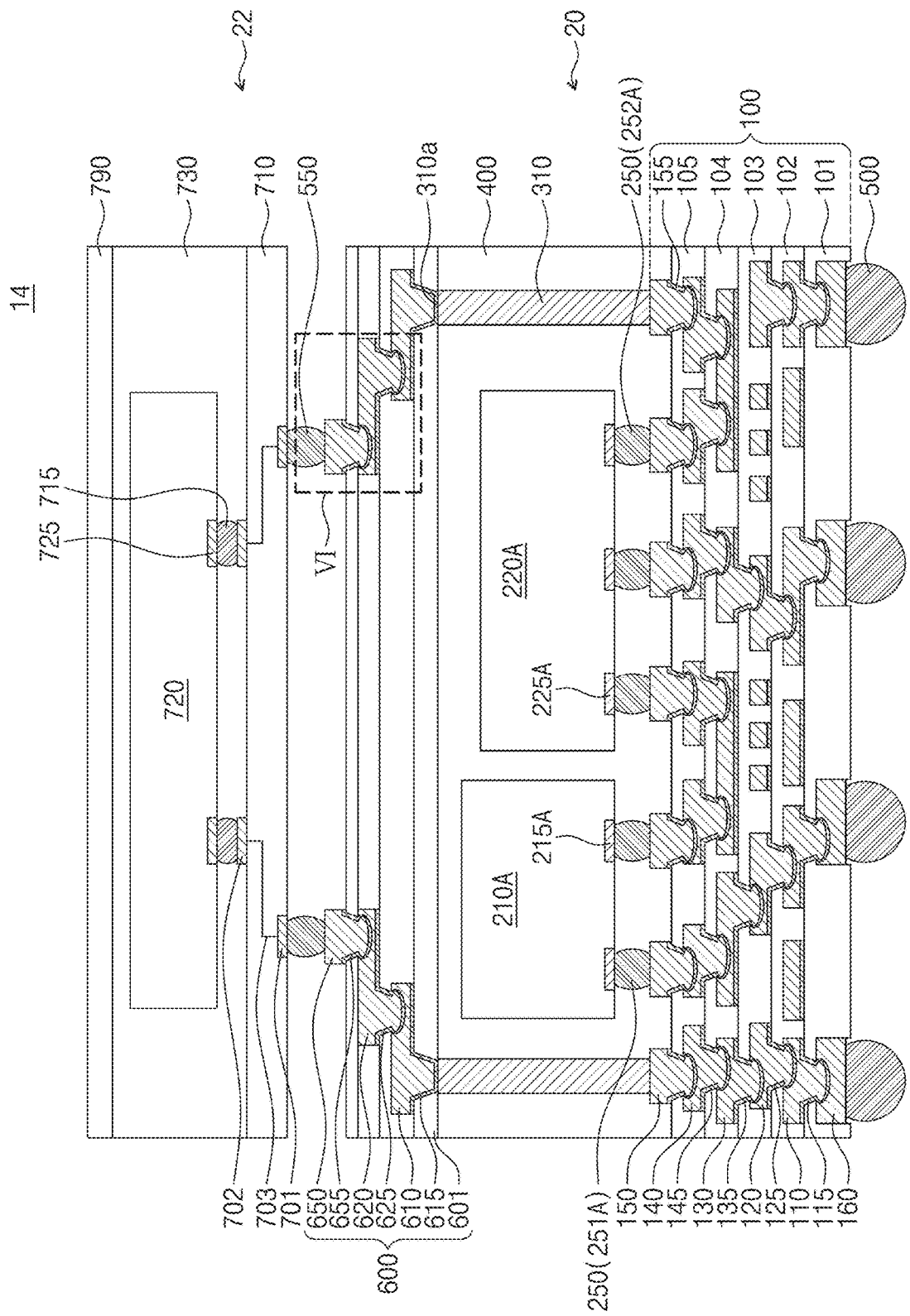
FIG. 10A is a sectional view illustrating a semiconductor package according to example embodiments of the inventive concepts.
Figure 10B:
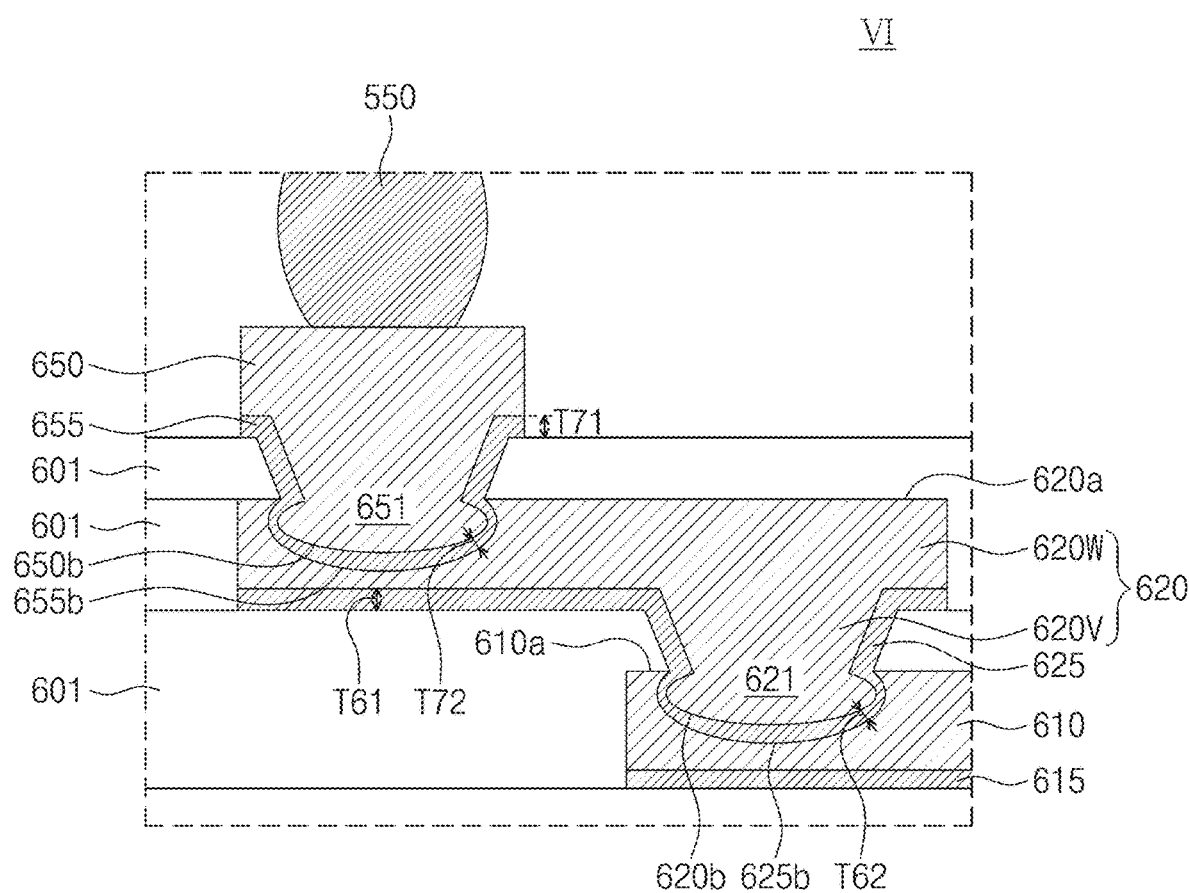
FIG. 10B is an enlarged sectional view illustrating a portion VI of FIG. 10A.

FIG. 10A is a sectional view illustrating a semiconductor package according to example embodiments of the inventive concepts. FIG. 10B is an enlarged sectional view illustrating a portion VI of FIG. 10A.

Referring to FIGS. 10A and 10B, a semiconductor package 14 may include a lower semiconductor package 20 and an upper semiconductor package 22. The lower semiconductor package 20 may include the redistribution substrate 100, the solder pattern 500, the bonding bump 250, a first lower semiconductor chip 210A, a second lower semiconductor chip 220A, the mold layer 400, and a conductive structure 310. The redistribution substrate 100, the solder pattern 500, and the mold layer 400 may be the same or substantially the same as those in the examples of FIGS. 1A to 1C, 1E, and 1F.

The second lower semiconductor chip 220A may be laterally spaced apart from the first lower semiconductor chip 210A. The second lower semiconductor chip 220A may be the semiconductor chip 200 that is of a kind different from the first lower semiconductor chip 210A. For example, the first lower semiconductor chip 210A may include one of a logic chip, a memory chip, and a power management chip, and the second lower semiconductor chip 220A may be another one of the logic chip, the memory chip, and the power management chip. The logic chip may include an ASIC chip or application processor (AP) chip. The power management chip may include a power management integrated circuit (PMIC). As an example, the first lower semiconductor chip 210A may be a power management chip, and the second lower semiconductor chip 220A may be an ACIS chip. Each of the first and second lower semiconductor chips 210A and 220A may be similar to the semiconductor chip 200 described with reference to FIGS. 1A and 1B. Unlike that illustrated in the drawings, at least one of the first and second lower semiconductor chips 210A and 220A may be omitted. As another example, a third semiconductor chip (not shown) may be additionally mounted on the top surface of the redistribution substrate 100.

The bonding bump 250 may include the first bonding bumps 251A and second bonding bumps 252A. The first bonding bumps 251A may be similar to the first bonding bumps 251 described with reference to FIG. 9, and the second bonding bumps 252A may be similar to the second bonding bumps 252 described with reference to FIG. 9. Chip pads 215A of the first lower semiconductor chip 210A may be electrically connected to the redistribution substrate 100 through the first bonding bumps 251A. Chip pads 225A of the second lower semiconductor chip 220A may be electrically connected to the redistribution substrate 100 through the second bonding bumps 252A. Thus, the second lower semiconductor chip 220A may be electrically connected to the first lower semiconductor chip 210A through the redistribution substrate 100.

The conductive structure 310 may be disposed on the top surface of the redistribution substrate 100 and may be coupled to the bonding pad 150 corresponding thereto. The conductive structure 310 may be laterally spaced apart from the first and second lower semiconductor chips 210A and 220A. The conductive structure 310 may be provided on the edge region of the redistribution substrate 100, when viewed in a plan view. In example embodiments, a metal pillar may be provided on the redistribution substrate 100 to form the conductive structure 310. In other words, the conductive structure 310 may be a metal pillar. The conductive structure 310 may be electrically connected to the redistribution substrate 100. For example, the conductive structure 310 may be electrically connected to the first lower semiconductor chip 210A, the second lower semiconductor chip 220A, or the solder pattern 500 through the redistribution substrate 100. The conductive structure 310 may be formed of or include at least one of metallic materials (e.g., copper).

The mold layer 400 may be disposed on the top surface of the redistribution substrate 100 to cover the first and second lower semiconductor chips 210A and 220A. The mold layer 400 may seal the side surfaces of the conductive structure 310. The side surface of the mold layer 400 may be aligned to the side surface of the redistribution substrate 100. The mold layer 400 may be provided to expose a top surface 310a of the conductive structure 310.

The lower semiconductor package 20 may further include an upper redistribution layer 600. The upper redistribution layer 600 may be provided on a top surface of the mold layer 400. The upper redistribution layer 600 may include upper insulating layers 601, a first upper redistribution pattern 610, a second upper redistribution pattern 620, a first upper seed pattern 615, a second upper seed pattern 625, a bonding seed pattern 655, and an upper bonding pad 650. The upper insulating layers 601 may be stacked on the mold layer 400. The upper insulating layers 601 may include a photosensitive polymer.

Each of the first and second upper redistribution patterns 610 and 620 may be formed of or include a metallic material (e.g., copper). The first upper redistribution pattern 610 may be electrically connected to the top surface 310a of the conductive structure 310. The first upper redistribution pattern 610 may include a via portion, which is provided in the lowermost one of the upper insulating layers 601, and a wire portion, which is provided on the lowermost one of the upper insulating layers 601. The first upper seed pattern 615 may be disposed below the first upper redistribution pattern

610. The first upper seed pattern 615 may be interposed between the top surface 310a of the conductive structure 310 and the first upper redistribution pattern 610. The first upper seed pattern 615 may be formed of or include at least one of conductive materials (e.g., copper, titanium, and alloys thereof).

The second upper redistribution pattern 620 may include a via pattern 620V and a wire pattern 620W. The via pattern 620V may be provided in a corresponding one of the upper insulating layers 601. A lower portion of the via pattern 620V may include a sixth convex portion 621, and the sixth convex portion 621 may correspond to the lower portion of the via pattern 620V. The sixth convex portion 621 may be provided in the first upper redistribution pattern 610. The shape of the sixth convex portion 621 may be the same as or similar to that of the first convex portion 111 (e.g., see FIG. 1C) or the second convex portion 121 (e.g., see FIG. 1E). A bottom surface 620b of the center region of the via pattern 620V may be located at a level lower than the bottom surface 620b of the edge region. The bottom surface 620b of the via pattern 620V may have a concave-up shape. The sixth convex portion 621 may further protrude laterally.

The wire pattern 620W may be provided on the via pattern 620V and may be connected to the via pattern 620V, without any interface therebetween. The wire pattern 620W may be extended to cover a portion of the corresponding one of the upper insulating layers 601. The wire pattern 620W may have a width larger than the via pattern 620V.

The second upper seed pattern 625 may be interposed between the first upper redistribution pattern 610 and the second upper redistribution pattern 620. A bottom surface 625b of the second upper seed pattern 625 may be disposed in the first upper redistribution pattern 610. For example, the bottom surface 625b of the second upper seed pattern 625 may be located at a level lower than a top surface 610a of the first upper redistribution pattern 610. The second upper seed pattern 625 may be formed of or include at least one of conductive materials (e.g., copper, titanium, and alloys thereof).

The shape of the second upper seed pattern 625 may be the same as or similar to the second seed pattern 125 (e.g., see FIG. 1E) described above. The second upper seed pattern 625 may include a first lower portion, a second lower portion, and an upper portion. The upper portion of the second upper seed pattern 625 may be located at a level higher than the top surface 610a of the first upper redistribution pattern 610. The upper portion of the second upper seed pattern 625 may be interposed between the side surface of the via pattern 620V and the upper insulating layer 601 corresponding thereto and between the bottom surface of the wire pattern 620W and the upper insulating layer 601. The upper portion of the second upper seed pattern 625 may have an eleventh thickness T61, on the bottom surface of the wire pattern 620W. The eleventh thickness T61 may range from 200 Å to 3000 Å. The first and second lower portions of the second upper seed pattern 625 may be interposed between the first upper redistribution pattern 610 and the second upper redistribution pattern 620. The first lower portion of the second upper seed pattern 625 may be disposed on the bottom surface 620b of the center region of the via pattern 620V. The second lower portion of the second upper seed pattern 625 may be disposed between the first lower portion and the upper portion. The bottom surface 625b of the second lower portion of the second upper seed pattern 625 may be located at a level higher than the bottom surface 625b of the first lower portion. The second lower portion of the second upper seed pattern 625 may have a tenth thickness T62. The tenth thickness T62 may be smaller than the eleventh thickness T61. For example, the tenth thickness T62 may range from 30% to 80% of the eleventh thickness T61. For example, the tenth thickness T62 may range from 60 Å to 2400 Å.

The upper bonding pad 650 may be disposed on the topmost layer of the upper insulating layers 601 and may be coupled to the second upper redistribution patterns 620. The upper bonding pad 650 may be disposed in and on the topmost layer of the upper insulating layers 601. The upper bonding pad 650 may include a seventh convex portion 651, and the seventh convex portion 651 may be provided in the second upper redistribution pattern 620. The shape of the seventh convex portion 651 may be the same as or similar to that of the fifth convex portion 151 previously described with reference to FIG. 1F. A bottom surface 650b of the center region of the seventh convex portion 651 may be located at a level lower than the bottom surface 650b of the edge region. The bottom surface 650b of the seventh convex portion 651 may have a concave-up shape. The bottom surface 650b of the seventh convex portion 651 may correspond to a bottom surface of the upper bonding pad 650. The seventh convex portion 651 may further protrude laterally.

The bonding seed pattern 655 may be interposed between the upper bonding pad 650 and the second upper redistribution pattern 620. A bottom surface 655b of the bonding seed pattern 655 may be disposed in the second upper redistribution pattern 620. For example, the bottom surface 655b of the bonding seed pattern 655 may be located at a level lower than a top surface 620a of the second upper redistribution pattern 620. The bonding seed pattern 655 may be formed of or include at least one of conductive materials (e.g., copper, titanium, and alloys thereof).

The bonding seed pattern 655 may have a thirteenth thickness T71, between a top surface of the topmost layer of the upper insulating layers 601 and the bonding seed pattern 655. The thirteenth thickness T71 may range from 200 Å to 3000 Å. The bonding seed pattern 655 on the edge region of the seventh convex portion 651 may have a twelfth thickness T72. The twelfth thickness T72 may be smaller than the thirteenth thickness T71. For example, the twelfth thickness T72 may be 30% to 80% of the thirteenth thickness T71. For example, the twelfth thickness T72 may range from 60 Å to 2400 Å.

As shown in FIG. 10A, the upper bonding pad 650 may be electrically connected to the solder pattern 500, the first lower semiconductor chip 210A, or the second lower semiconductor chip 220A through the first and second upper redistribution patterns 610 and 620 and the conductive structure 310. Since the upper redistribution patterns 620 are provided, the upper bonding pad 650 may not be vertically aligned to the conductive structure 310.

As another example, the lower semiconductor package 20 may be manufactured using the redistribution substrate 100' described with reference to FIG. 7. In some example embodiments, the bonding bumps 250 may be omitted. In addition, the arrangement relationship between the redistribution substrate 100' and the first and second lower semiconductor chips 210A and 220A may be the same or substantially the same as that between the redistribution substrate 100' and the semiconductor chip 200 of FIG. 7.

The upper semiconductor package 22 may be disposed on the lower semiconductor package 20. For example, the upper semiconductor package 22 may be disposed on the upper redistribution layer 600. The upper semiconductor package 22 may include an upper substrate 710, an upper semiconductor chip 720, and an upper mold layer 730. The upper substrate 710 may be a printed circuit board. As another example, the upper substrate 710 may be a redistribution layer. For example, the upper substrate 710 may be manufactured in the same manner as that for the redistribution substrate 100 described with reference to FIGS. 8A to 8T. A first connection pad 701 and a second connection pad 702 may be respectively disposed on a bottom surface and a top surface of the upper substrate 710. An interconnection line 703 may be provided in the upper substrate 710 and may be coupled to the first connection pad 701 and the second connection pad 702. In FIG. 10A, the interconnection line 703 is schematically illustrated, and the shape and arrangement of the interconnection line 703 may be variously changed. The first connection pad 701, the second connection pad 702, and the interconnection line 703 may be formed of or include a conductive material (e.g., a metallic material).

The upper semiconductor chip 720 may be disposed on the upper substrate 710. The upper semiconductor chip 720 may include an integrated circuit (not shown), and the integrated circuit may include a memory circuit, a logic circuit, or combinations thereof. The upper semiconductor chip 720 may be the semiconductor chip 200 that is of a kind different from the first and second lower semiconductor chips 210A and 220A. For example, the upper semiconductor chip 720 may be a memory chip. A bump terminal 715 may be interposed between the upper substrate 710 and the upper semiconductor chip 720 and may be coupled to the second connection pad 702 and a chip pad 725 of the upper semiconductor chip 720. The upper semiconductor chip 720 may be electrically connected to the first connection pad 701 through the bump terminal 715 and the interconnection line 703. Unlike that illustrated in the drawings, the bump terminal 715 may be omitted, and the chip pad 725 may be directly coupled to the second connection pad 702.

The upper mold layer 730 may be disposed on the upper substrate 710 to cover the upper semiconductor chip 720. The upper mold layer 730 may be formed of or include at least one of insulating polymers (e.g., epoxy-based polymers).

The upper semiconductor package 22 may further include a heat dissipation structure 790. The heat dissipation structure 790 may include a heat sink, a heat slug, or a thermal interface material (TIM) layer. The heat dissipation structure 790 may be formed of or include at least one of, for example, metallic materials. The heat dissipation structure 790 may be disposed on a top surface of the upper mold layer 730. The heat dissipation structure 790 may be further extended to cover at least a portion of a side surface of the upper mold layer 730.

The semiconductor package 14 may further include a connection terminal 550. The connection terminal 550 may be interposed between the upper bonding pad 650 and the first connection pad 701 and may be coupled to the upper bonding pad 650 and the first connection pad 701. Thus, the upper semiconductor package 22 may be electrically connected to the first lower semiconductor chip 210A, the second lower semiconductor chip 220A, and the solder pattern 500 through the connection terminal 550. The electric connection of the upper semiconductor package 22 may mean an electric connection with an integrated circuit in the upper semiconductor chip 720. The connection terminal 550 may include a solder, a bump, or combinations thereof. The connection terminal 550 may be formed of or include at least one of solder materials.

As another example, the upper substrate 710 may be omitted, and the connection terminal 550 may be directly coupled to the chip pad 725 of the upper semiconductor chip 720. In some example embodiments, the upper mold layer 730 may be in direct contact with the top surface of the upper redistribution layer 600. As other example, the upper substrate 710 and the connection terminal 550 may be omitted, and the chip pad 725 of the upper semiconductor chip 720 may be directly coupled to the upper bonding pad 650.

Figure 11:
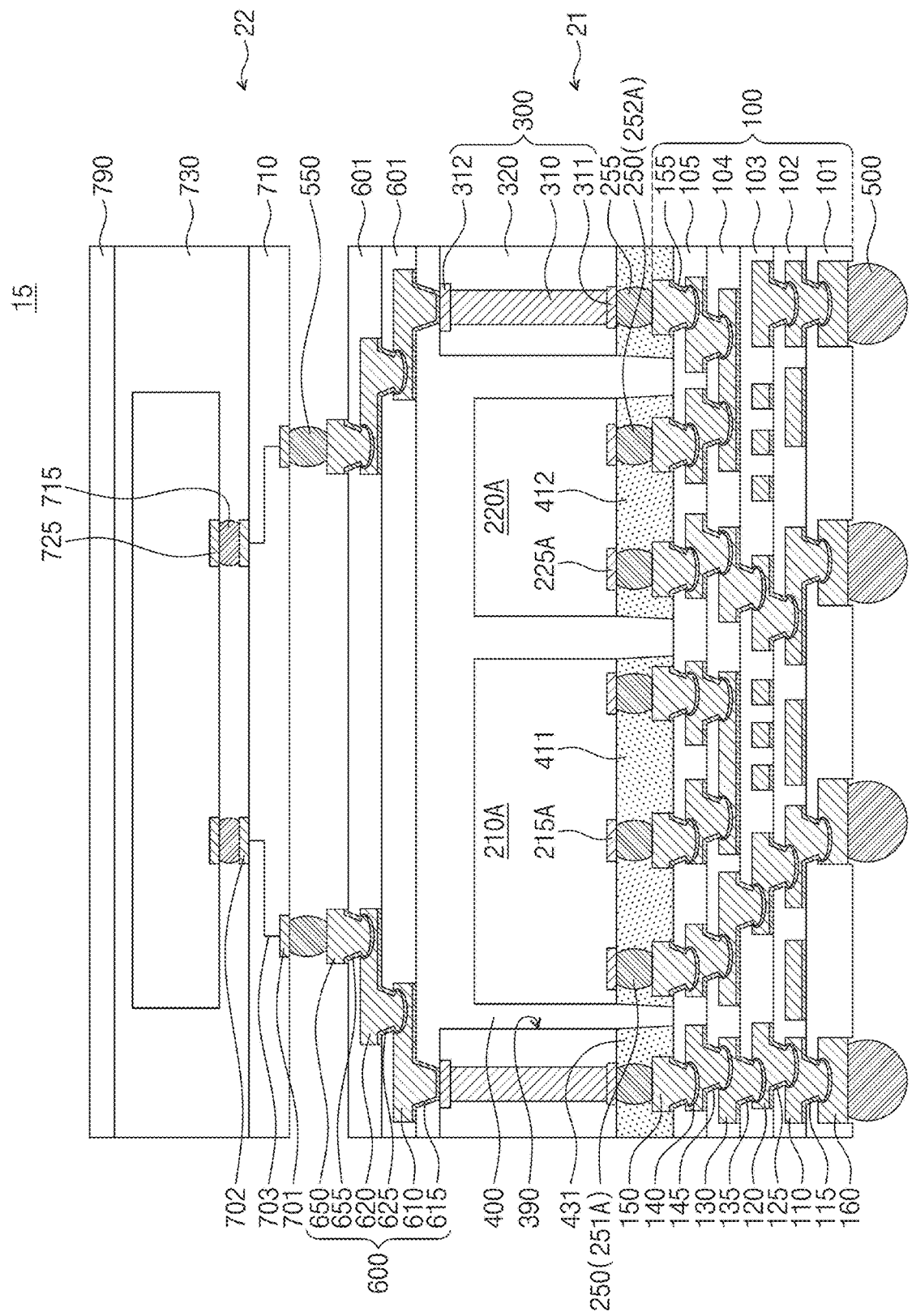
FIG. 11 is a sectional view illustrating a semiconductor package according to example embodiments of the inventive concepts.

FIG. 11 is a sectional view illustrating a semiconductor package according to example embodiments of the inventive concepts.

Referring to FIG. 11, a semiconductor package 15 may include a lower semiconductor package 21 and the upper semiconductor package 22. The lower semiconductor package 21 may include the redistribution substrate 100, the solder pattern 500, the bonding bumps 250, a connection bump 255, the first lower semiconductor chip 210A, the second lower semiconductor chip 220A, the mold layer 400, and a connection substrate 300. The redistribution substrate 100, the solder pattern 500, the bonding bumps 250, and the mold layer 400 may be the same as or similar to those in the previous example embodiments of FIGS. 1A to 1C, 1E, and 1F. The first and second lower semiconductor chips 210A and 220A may be the same or substantially the same as the first and second lower semiconductor chips 210A and 220A described with reference to FIG. 10A. The bonding bumps 250 may include the first bonding bumps 251A and the second bonding bumps 252A. The first bonding bumps 251A and the second bonding bumps 252A may be the same or substantially the same as the first bonding bumps 251A and the second bonding bumps 252A described with reference to FIG. 10A.

The semiconductor package 15 may further include a first under-fill pattern 411 and a second under-fill pattern 412. The first under-fill pattern 411 may be provided in a first gap region between the redistribution substrate 100 and the first lower semiconductor chip 210A. The first under-fill pattern 411 may be provided to seal the first bonding bumps 251A. The second under-fill pattern 412 may be provided in a second gap region between the redistribution substrate 100 and the second lower semiconductor chip 220A to seal the second bonding bumps 252A.

The connection substrate 300 may be disposed on the redistribution substrate 100. The connection substrate 300 may have a substrate hole 390, which is provided penetrate the same. As an example, the connection substrate 300 may be manufactured to have the substrate hole 390, which penetrates a printed circuit board from top surface to bottom surface. When viewed in a plan view, the substrate hole 390 may be overlapped with the center portion of the redistribution substrate 100. The first and second lower semiconductor chips 210A and 220A may be disposed in the substrate hole 390 of the connection substrate 300. The first and second lower semiconductor chips 210A and 220A may be provided to be spaced apart from an inner side surface of the connection substrate 300.

The connection substrate 300 may include a base layer 320 and the conductive structure 310. The base layer 320 may include a single layer or a plurality of layers. The base layer 320 may be formed of or include at least one of insulating materials. For example, the base layer 320 may be formed of or include at least one of carbon-based materials, ceramics, or polymers. The conductive structure 310 may be provided in the base layer 320. The connection substrate 300 may further include a first pad 311 and a second pad 312. The first pad 311 may be disposed on a bottom surface of the conductive structure 310. The second pad 312 may be disposed on a top surface of the conductive structure 310.

The second pad 312 may be electrically connected to the first pad 311 through the conductive structure 310. The conductive structure 310, the first pad 311, and the second pad 312 may be formed of or include at least one of, for example, copper, aluminum, tungsten, titanium, tantalum, iron, or alloys thereof.

The connection bump 255 may be disposed between the redistribution substrate 100 and the connection substrate 300. The connection bump 255 may be interposed between the first pad 311 and the bonding pad 150 corresponding thereto and may be coupled to the first pad 311 and the corresponding bonding pad 150. The conductive structure 310 may be electrically connected to the redistribution substrate 100 through the connection bump 255. The connection bump 255 may include at least one of a solder ball, a solder bump, or a solder pillar. The connection bump 255 may be formed of or include at least one of metallic materials. A third under-fill pattern 431 may be provided between the redistribution substrate 100 and the connection substrate 300 to seal the connection bump 255. The third under-fill pattern 431 may be formed of or include an insulating polymer.

The mold layer 400 may be provided on the first lower semiconductor chip 210A, the second lower semiconductor chip 220A, and the connection substrate 300. The mold layer 400 may be interposed between the first lower semiconductor chip 210A and the second lower semiconductor chip 220A, between the first lower semiconductor chip 210A and the connection substrate 300, and between the second lower semiconductor chip 220A and the connection substrate 300. In example embodiments, the mold layer 400 may be formed by attaching an adhesive insulating film to the top surface of the connection substrate 300, the top surfaces of the first and second lower semiconductor chips 210A and 220A, and the side surfaces of the first and second lower semiconductor chips 210A and 220A. For example, an Ajinomoto build-up film (ABF) may be used as the adhesive insulating film. As another example, the mold layer 400 may be formed of or include at least one of insulating polymers (e.g., epoxy-based polymers). As other example, the first and second under-fill patterns 411 and 412 may be omitted, and the mold layer 400 may be further extended onto the bottom surface of the first lower semiconductor chip 210A and the bottom surface of the second lower semiconductor chip 220A. In example embodiments where the third under-fill pattern 431 is omitted, the mold layer 400 may be extended into a gap between the redistribution substrate 100 and the connection substrate 300.

The lower semiconductor package 21 may further include the upper redistribution layer 600. The upper redistribution layer 600 may be disposed on the mold layer 400 and the connection substrate 300. The upper redistribution layer 600 may include the upper insulating layers 601, the first and second upper redistribution patterns 610 and 620, the first and second upper seed patterns 615 and 625, the bonding seed pattern 655, and the upper bonding pad 650. The upper insulating layers 601, the first upper redistribution pattern 610, the second upper redistribution pattern 620, the first upper seed pattern 615, the second upper seed pattern 625, the bonding seed pattern 655, and the upper bonding pad 650 may be the same or substantially the same as the example embodiments previously described with reference to FIGS. 10A and 10B. However, the first upper redistribution pattern 610 may be extended into the mold layer 400. The first upper seed pattern 615 may be interposed between the first upper redistribution pattern 610 and the second pad 312 and between the first upper redistribution pattern 610 and the mold layer 400.

As another example, the lower semiconductor package 21 may be manufactured using the redistribution substrate 100' described with reference to FIG. 7. In some example embodiments, the bonding bumps 250, the connection bump 255, and the first to third under-fill patterns 411, 412, and 431 may be omitted. The arrangement relationship between the redistribution substrate 100' and the first and second lower semiconductor chips 210A and 220A may be the same or substantially the same as that between the redistribution substrate 100' and the semiconductor chip 200 of FIG. 7.

The upper semiconductor package 22 may be disposed on the lower semiconductor package 21. For example, the upper semiconductor package 22 may be disposed on the upper redistribution layer 600. The upper semiconductor package 22 may include the upper substrate 710, the upper semiconductor chip 720, and the upper mold layer 730. The upper semiconductor package 22 and the connection terminal 550 may be the same or substantially the same as those described with reference to FIGS. 10A and 10B. For example, the connection terminal 550 may be interposed between the lower semiconductor package 20 and the upper semiconductor package 22. The upper semiconductor package 22 may further include the heat dissipation structure 790.

According to example embodiments of the inventive concepts, a via portion of a first redistribution pattern may have a protruding shape extended into an under-bump pattern. Thus, a bonding strength between the first redistribution pattern and the under-bump pattern may be increased. A via portion of a second redistribution pattern may have a protruding shape extended into the first redistribution pattern. Thus, a bonding strength between the first and second redistribution patterns may be increased. Accordingly, it may be possible to improve durability and reliability of a semiconductor package.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:
   a redistribution substrate having a first surface and a second surface, opposite to each other;
   a semiconductor chip on the first surface of the redistribution substrate; and
   a solder pattern on the second surface of the redistribution substrate,
   wherein the redistribution substrate comprises:
   an under-bump pattern coupled to the solder pattern;
   a first redistribution pattern on the under-bump pattern, the first redistribution pattern including a first via portion and a first wire portion; and
   a first seed pattern between the under-bump pattern and the first redistribution pattern and on a side surface of the first via portion and a bottom surface of the first wire portion,
   wherein a bottom surface of the first seed pattern is at a level lower than a top surface of the under-bump pattern.

2. The semiconductor package of claim 1, wherein the first seed pattern comprises:
   an upper portion on the side surface of the first via portion and the bottom surface of the first wire portion;

a first lower portion between the under-bump pattern and a bottom surface of a center region of the first via portion; and a second lower portion in the under-bump pattern and between the first lower portion and the upper portion, wherein the first seed pattern has a first thickness on the bottom surface of the first wire portion, the second lower portion of the first seed pattern has a second thickness, and the second thickness is smaller than the first thickness.

3. The semiconductor package of claim 2, wherein the second thickness is 30% to 80% of the first thickness.

4. The semiconductor package of claim 2, wherein the first thickness ranges from 200 Å to 3000 Å.

5. The semiconductor package of claim 1, wherein a thickness of the under-bump pattern is larger than a thickness of the first wire portion, and a bottom surface of the under-bump pattern is in direct contact with the solder pattern.

6. The semiconductor package of claim 1, wherein the first via portion comprises a convex portion in the under-bump pattern, and at least a portion of the convex portion is in direct contact with the under-bump pattern.

7. The semiconductor package of claim 1, wherein the top surface of the under-bump pattern has a concave-down shape.

8. The semiconductor package of claim 7, wherein the redistribution substrate further comprises an insulating layer, and the insulating layer is in contact with the top surface of the under-bump pattern.

9. The semiconductor package of claim 1, wherein the bottom surface of the first via portion is at a level lower than the top surface of the under-bump pattern and has a concave-up shape.

10. The semiconductor package of claim 1, wherein the redistribution substrate further comprises an insulating layer, which is to cover a side surface and the top surface of the under-bump pattern and to expose a bottom surface of the under-bump pattern, and the bottom surface of the under-bump pattern is at a level higher than a bottom surface of the insulating layer.

11. A semiconductor package, comprising:
a redistribution substrate; and
a semiconductor chip on a first surface of the redistribution substrate,
wherein the redistribution substrate comprises:
a first redistribution pattern including a first via portion and a first wire portion;
a second redistribution pattern on the first redistribution pattern, the second redistribution pattern including a second via portion and a second wire portion; and
a seed pattern between the first and second redistribution patterns,
wherein a bottom surface of the seed pattern is in the first redistribution pattern,
wherein the seed pattern comprises:
an upper portion on a side surface of the second via portion and a bottom surface of the second wire portion;
a first lower portion between the first redistribution pattern and a bottom surface of a center region of the second via portion; and
a second lower portion in the first redistribution pattern and between the first lower portion and the upper portion, wherein a thickness of the second lower portion of the seed pattern is smaller than a thickness of the seed pattern on the bottom surface of the second wire portion.

12. The semiconductor package of claim 11, wherein the thickness of the second lower portion of the seed pattern is 30% to 80% of the thickness of the seed pattern on the bottom surface of the second wire portion.

13. The semiconductor package of claim 11, further comprising a solder pattern on a second surface of the redistribution substrate,
wherein the second surface is opposite to the first surface, the redistribution substrate comprises:
an under-bump pattern coupled to the solder pattern; and
a lower seed pattern between the under-bump pattern and the first redistribution pattern to cover a side surface of the first via portion and a bottom surface of the first wire portion,
wherein a bottom surface of the lower seed pattern is at a level lower than a top surface of the under-bump pattern.

14. The semiconductor package of claim 13, wherein a lower portion of the second via portion is in the under-bump pattern, and
at least a portion of the lower portion of the second via portion is in direct contact with the first redistribution pattern.

15. The semiconductor package of claim 11, wherein the second via portion further comprises a convex portion in the first redistribution pattern, and
a bottom surface of a center region of the convex portion is a level lower than a bottom surface of an edge region of the convex portion.

16. The semiconductor package of claim 11, wherein a bottom surface of the first lower portion of the seed pattern is at a level lower than a bottom surface of the second lower portion of the seed pattern.

17. The semiconductor package of claim 11, wherein a top surface of the first redistribution pattern has a concave-up shape.

18. A semiconductor package, comprising:
a redistribution substrate having a first surface and a second surface, opposite to each other;
a semiconductor chip on the first surface of the redistribution substrate; and
a solder pattern on the second surface of the redistribution substrate,
wherein the redistribution substrate comprises:
an under-bump pattern coupled to the solder pattern;
a first redistribution pattern on the under-bump pattern, the first redistribution pattern including a first via portion and a first wire portion;
a first seed pattern between the under-bump pattern and the first redistribution pattern;
a second redistribution pattern on the first redistribution pattern, the second redistribution pattern including a second via portion and a second wire portion;
a second seed pattern between the first and second redistribution patterns;
a third redistribution pattern on the second redistribution pattern, the third redistribution pattern including a third via portion and a third wire portion;
a third seed pattern between the second and third redistribution patterns; and
a bonding pad electrically connected to the third redistribution pattern, wherein a bottom surface of the first seed pattern is in the under-bump pattern, a bottom surface of the second seed pattern is in the first redistribution pattern, a bottom surface of the third seed pattern is in the second redistribution pattern, the first seed pattern comprises:
- an upper portion on a side surface of the first via portion and a bottom surface of the first wire portion;
- a first lower portion between the under-bump pattern and a bottom surface of a center region of the first via portion; and
- a second lower portion in the under-bump pattern and between the first lower portion and the upper portion, the second seed pattern comprises:
- an upper portion on a side surface of the second via portion and a bottom surface of the second wire portion;
- a first lower portion between the first redistribution pattern and a bottom surface of a center region of the second via portion; and
- a second lower portion in the first redistribution pattern and between the first lower portion and the upper portion of the second seed pattern, the third seed pattern comprises:
- an upper portion on a side surface of the third via portion and a bottom surface of the third wire portion;
- a first lower portion between the second redistribution pattern and a bottom surface of a center region of the third via portion; and
- a second lower portion in the second redistribution pattern and between the first lower portion and the upper portion of the third seed pattern, a first thickness of the first seed pattern on the bottom surface of the first wire portion is larger than a second thickness of the second lower portion of the first seed pattern, a third thickness of the second seed pattern on the bottom surface of the second wire portion is larger than a fourth thickness of the second lower portion of the second seed pattern, and a fifth thickness of the third seed pattern on the bottom surface of the third wire portion is larger than a sixth thickness of the second lower portion of the third seed pattern.

19. The semiconductor package of claim 18, wherein the second thickness is 30% to 80% of the first thickness, the fourth thickness is 30% to 80% of the third thickness, and the sixth thickness is 30% to 80% of the fifth thickness.

20. The semiconductor package of claim 18, wherein the redistribution substrate further comprises an insulating layer, to cover a side surface of the under-bump pattern and to expose a bottom surface of the under-bump pattern, the bottom surface of the under-bump pattern is at a level higher than the bottom surface of the insulating layer, and the solder pattern is in direct contact with the bottom surface of the under-bump pattern.

* * * * *